US012676280B2

(12) United States Patent
Shklovsky et al.

(10) Patent No.: US 12,676,280 B2
(45) Date of Patent: Jul. 7, 2026

(54) CHARGED PARTICLE BEAM DEVICES AND MEMBRANE ASSEMBLIES USEFUL THEREIN

(71) Applicant: AIRSEM TECHNOLOGIES LTD., Rehovot (IL)

(72) Inventors: Jenny Shklovsky, Kfar Saba (IL); Peter Beker, Kiryat Ono (IL); Vladimir Wainstein, Rishon Le Zion (IL)

(73) Assignee: AIRSEM TECHNOLOGIES LTD., Rehovot (IL)

( * ) Notice: Subject to any disclaimer, the term of this patent is extended or adjusted under 35 U.S.C. 154(b) by 285 days.

(21) Appl. No.: 18/332,969

(22) Filed: Jun. 12, 2023

(65) Prior Publication Data

US 2024/0412940 A1    Dec. 12, 2024

(51) Int. Cl.
*H01J 37/18* (2006.01)
*H01J 37/16* (2006.01)
(Continued)

(52) U.S. Cl.
CPC ............ *H01J 37/18* (2013.01); *H01J 37/165* (2013.01); *H01J 37/20* (2013.01); *H01J 37/244* (2013.01);
(Continued)

(58) Field of Classification Search
CPC .......... H01J 37/18; H01J 37/165; H01J 37/20; H01J 37/244; H01J 37/28; H01J 2237/166;
(Continued)

(56) References Cited

U.S. PATENT DOCUMENTS 3,307,066 A    2/1967  Shapiro et al.
3,517,126 A    6/1970  Sano et al.
(Continued)

FOREIGN PATENT DOCUMENTS

CN    1315002    9/2001
CN    1565042    1/2005
(Continued)

OTHER PUBLICATIONS

U.S. Appl. No. 61/100,735, filed Sep. 28, 2008.
(Continued)

*Primary Examiner* — David A Vanore
(74) *Attorney, Agent, or Firm* — Sughrue Mion, PLLC

(57) ABSTRACT

A charged particle beam device, comprising a charged particle beam source situated in a first-pressure environment, a sample support operative to support a sample situated in a second-pressure environment, the second-pressure environment having a higher pressure than the first-pressure environment, and a membrane assembly separating the first-pressure environment from the second-pressure environment, the membrane assembly comprising a pressure-sealing membrane being substantially transparent to a charged particle beam from the charged particle beam source, a supporting membrane layer being formed with a cornerless aperture, the pressure-sealing membrane being bonded to the supporting membrane layer, and a holding frame being formed with a second aperture larger than and overlying the cornerless aperture. The charged particle beam device may further comprise an electron-detecting subassembly, the electron-detecting subassembly comprising at least one metal line defining a shape, for detection of electrons resulting from an interaction of the charged particle beam and the sample.

23 Claims, 26 Drawing Sheets

(51) Int. Cl.
| | |
|---|---|
| *H01J 37/20* | (2006.01) |
| *H01J 37/244* | (2006.01) |
| *H01J 37/28* | (2006.01) |

(52) U.S. Cl.
CPC ......... *H01J 37/28* (2013.01); *H01J 2237/166* (2013.01); *H01J 2237/1825* (2013.01)

(58) Field of Classification Search
CPC ......... H01J 2237/1825; H01J 2237/164; H01J 2237/188; H01J 37/26; H01J 2237/2003
See application file for complete search history.

(56) References Cited

U.S. PATENT DOCUMENTS

| | | | | |
|---|---|---|---|---|
| 3,787,696 | A | 1/1974 | Dao et al. | |
| 4,058,724 | A | 11/1977 | McKinney et al. | |
| 4,591,756 | A | 5/1986 | Avnery | |
| 4,710,278 | A * | 12/1987 | Polak | B01D 71/0221 |
| | | | | 204/278 |
| 4,721,967 | A | 1/1988 | Roche | |
| 4,727,029 | A | 2/1988 | Mori | |
| 4,992,662 | A * | 2/1991 | Danilatos | H01J 37/28 |
| | | | | 850/16 |
| 5,081,353 | A | 1/1992 | Yamada et al. | |
| 5,250,808 | A * | 10/1993 | Danilatos | H01J 37/244 |
| | | | | 250/441.11 |
| 5,391,958 | A | 2/1995 | Kelly | |
| 5,406,087 | A | 4/1995 | Fujiyoshi et al. | |
| 5,811,803 | A * | 9/1998 | Komatsu | H01J 37/28 |
| | | | | 250/441.11 |
| 5,898,269 | A * | 4/1999 | Baum | H01J 3/021 |
| | | | | 313/530 |
| 6,005,540 | A | 12/1999 | Shinjo et al. | |
| 6,156,435 | A | 12/2000 | Gleason et al. | |
| 6,188,074 | B1 | 2/2001 | Satoh et al. | |
| 6,201,240 | B1 | 3/2001 | Dotan et al. | |
| 6,410,923 | B1 | 6/2002 | Crewe | |
| 6,452,177 | B1 | 9/2002 | Feldman et al. | |
| 6,603,120 | B2 * | 8/2003 | Yamashita | B82Y 40/00 |
| | | | | 250/492.23 |
| 6,610,980 | B2 | 8/2003 | Veneklasen et al. | |
| 6,765,205 | B2 | 7/2004 | Ochiai et al. | |
| 6,803,570 | B1 * | 10/2004 | Bryson, III | H01J 33/04 |
| | | | | 850/16 |
| 6,992,300 | B2 | 1/2006 | Moses et al. | |
| 7,220,963 | B2 | 5/2007 | Gross | |
| 7,399,964 | B2 | 7/2008 | Shishido et al. | |
| 7,586,093 | B2 | 9/2009 | Feuerbaum | |
| 7,723,682 | B2 | 5/2010 | Terada et al. | |
| 8,164,057 | B2 | 4/2012 | Shachal | |
| 8,314,386 | B2 * | 11/2012 | Zaluzec | H01J 37/26 |
| | | | | 250/306 |
| 8,334,510 | B2 | 12/2012 | Shachal et al. | |
| 8,368,020 | B2 * | 2/2013 | Mantz | H01J 37/28 |
| | | | | 250/397 |
| 8,492,716 | B2 | 7/2013 | Shachal et al. | |
| 8,530,856 | B2 * | 9/2013 | Spruck | H01J 37/18 |
| | | | | 250/311 |
| 8,779,358 | B2 | 7/2014 | Shachal | |
| 8,981,294 | B2 | 3/2015 | Shachal et al. | |
| 9,076,631 | B2 | 7/2015 | Shachal | |
| 9,159,527 | B2 | 10/2015 | Ward et al. | |
| 9,287,089 | B2 | 3/2016 | Shachal | |
| 9,431,213 | B2 | 8/2016 | Shachal et al. | |
| 9,466,458 | B2 * | 10/2016 | Shachal | H01J 37/244 |
| 2001/0050343 | A1 | 12/2001 | Kobaru et al. | |
| 2002/0047095 | A1 | 4/2002 | Morishige et al. | |
| 2003/0077530 | A1 | 4/2003 | Fujiwara et al. | |
| 2003/0132382 | A1 | 7/2003 | Sogard | |
| 2003/0168595 | A1 | 9/2003 | Danilatos | |
| 2003/0178576 | A1 | 9/2003 | Pan et al. | |
| 2004/0046120 | A1 * | 3/2004 | Moses | H01J 37/20 |
| | | | | 250/311 |

| | | | | |
|---|---|---|---|---|
| 2004/0188611 | A1 | 9/2004 | Takeuchi et al. | |
| 2004/0217297 | A1 | 11/2004 | Moses et al. | |
| 2005/0092935 | A1 | 5/2005 | Demos et al. | |
| 2005/0173632 | A1 * | 8/2005 | Behar | B01L 3/508 |
| | | | | 250/311 |
| 2005/0178966 | A1 | 8/2005 | Gross | |
| 2006/0012785 | A1 | 1/2006 | Funk et al. | |
| 2006/0033038 | A1 | 2/2006 | Moses et al. | |
| 2006/0169910 | A1 | 8/2006 | Frosien et al. | |
| 2006/0184843 | A1 * | 8/2006 | Oakley | H01J 3/021 |
| 2006/0219912 | A1 * | 10/2006 | Ohtaki | H01J 37/265 |
| | | | | 250/311 |
| 2006/0231773 | A1 | 10/2006 | Katagiri et al. | |
| 2006/0284093 | A1 | 12/2006 | Kamiya et al. | |
| 2006/0284108 | A1 | 12/2006 | Buijsse et al. | |
| 2007/0194225 | A1 | 8/2007 | Zorn | |
| 2007/0210253 | A1 | 9/2007 | Behar et al. | |
| 2009/0001289 | A1 * | 1/2009 | Oakley | G11B 7/00454 |
| 2010/0140470 | A1 * | 6/2010 | Shachal | H01J 37/301 |
| | | | | 277/648 |
| 2010/0224780 | A1 * | 9/2010 | Spruck | G02B 21/0004 |
| | | | | 250/441.11 |
| 2011/0168889 | A1 * | 7/2011 | Shachal | H01J 37/28 |
| | | | | 250/307 |
| 2011/0210247 | A1 * | 9/2011 | Shachal | H01J 37/18 |
| | | | | 250/307 |
| 2012/0241608 | A1 | 9/2012 | Shachal | |
| 2014/0021347 | A1 * | 1/2014 | Ominami | H01J 37/28 |
| | | | | 250/307 |
| 2014/0117232 | A1 * | 5/2014 | Shachal | H01J 37/244 |
| | | | | 250/307 |
| 2014/0361166 | A1 | 12/2014 | Shachal | |
| 2015/0206705 | A1 * | 7/2015 | Sakuma | H01J 37/18 |
| | | | | 250/453.11 |
| 2015/0213999 | A1 * | 7/2015 | Ominami | H01J 37/28 |
| | | | | 250/310 |
| 2015/0228447 | A1 * | 8/2015 | Ominami | H01J 37/26 |
| | | | | 250/311 |
| 2015/0235806 | A1 | 8/2015 | Shachal | |
| 2015/0243475 | A1 | 8/2015 | Shachal et al. | |
| 2015/0380207 | A1 * | 12/2015 | Shachal | H01J 37/244 |
| | | | | 250/310 |
| 2016/0155606 | A1 | 6/2016 | Shachal | |
| 2016/0203944 | A1 * | 7/2016 | Ominami | H01J 37/263 |
| | | | | 250/310 |
| 2016/0240345 | A1 * | 8/2016 | Frosien | H01J 37/065 |
| 2016/0299103 | A1 * | 10/2016 | Saleh | H01J 37/32449 |
| 2017/0205363 | A1 * | 7/2017 | De Jonge | H01J 37/20 |
| 2017/0294291 | A1 * | 10/2017 | Saleh | H01J 37/32825 |
| 2024/0412940 | A1 * | 12/2024 | Shklovsky | H01J 37/26 |

FOREIGN PATENT DOCUMENTS

| | | |
|---|---|---|
| CN | 1982499 | 6/2007 |
| CN | 101275895 | 10/2008 |
| CN | 101299024 | 11/2008 |
| CN | 201373852 | 12/2009 |
| CN | 102364659 | 2/2012 |
| EP | 0924743 | 6/1999 |
| EP | 1515358 | 3/2005 |
| EP | 1796132 | 6/2007 |
| EP | 2372743 | 10/2011 |
| JP | 1976-110964 | 9/1976 |
| JP | 1988-81742 | 4/1988 |
| JP | H0541194 | 2/1993 |
| JP | 1993-225937 | 9/1993 |
| JP | 1994-28993 | 2/1994 |
| JP | 2000046767 | 2/2000 |
| JP | 2000/131045 | 5/2000 |
| JP | 2002-093358 | 3/2002 |
| JP | 2003-229083 | 8/2003 |
| JP | 2003-254919 | 9/2003 |
| JP | 2006-147430 | 6/2006 |
| JP | 2006-294481 | 10/2006 |
| JP | 2007-095335 | 4/2007 |
| JP | 2007-157682 | 6/2007 |
| JP | 2007-294328 | 11/2007 |
| JP | 2007-305499 | 11/2007 |

(56) References Cited

FOREIGN PATENT DOCUMENTS

| WO | 89/01698 | | | 2/1989 | | |
|----|----------|--|--|--------|--|--|
| WO | 96/03767 | | | 2/1996 | | |
| WO | WO-0245125 | A1 | * | 6/2002 | ............. | H01J 37/28 |
| WO | 2007/067296 | | | 6/2007 | | |
| WO | 2008/050321 | | | 5/2008 | | |
| WO | 2010/001399 | | | 1/2010 | | |
| WO | 2010/035265 | | | 4/2010 | | |
| WO | WO-2010035265 | A1 | * | 4/2010 | ............. | H01J 37/16 |
| WO | 2012/007941 | | | 1/2012 | | |
| WO | 2013/183057 | | | 12/2013 | | |
| WO | 2014/128699 | | | 8/2014 | | |
| WO | WO-2015025545 | A1 | * | 2/2015 | ............. | G01M 3/02 |
| WO | WO-2025093392 | A1 | * | 5/2025 | ............. | H01J 37/18 |

OTHER PUBLICATIONS

An International Preliminary Report on Patentability dated Mar. 29, 2011, which issued during the prosecution of Applicant's PCT/IL09/000926.
U.S. Provisional U.S. Appl. No. 60/862,631, filed Oct. 24, 2006.
Supplementary European Search Report dated Mar. 6, 2012, which issued during the prosecution of Applicant's European App No. 09815770.
An Office Action dated Feb. 15, 2013, which issued during the prosecution of U.S. Appl. No. 13/449,392.
European Search Report dated Nov. 21, 2011 which issued during the prosecution of Applicant's European App No. 07827239.0.
An International Search Report dated Nov. 18, 2009, which issued during the prosecution of Applicant's PCT/IL09/00660.
An International Preliminary Report on Patentability dated Dec. 9, 2014, which issued during the prosecution of Applicant's PCT/IL2013/050489.
An International Preliminary Report on Patentability dated Aug. 25, 2015, which issued during the prosecution of Applicant's PCT/IL2014/050175.
An International Search Report and a Written Opinion both dated Jun. 2, 2014, which issued during the prosecution of Applicant's PCT/IL2014/050175.
An International Search Report and a Written Opinion both dated Sep. 27, 2013, which issued during the prosecution of Applicant's PCT/IL2013/050489.
U.S. Appl. No. 61/655,567, filed Jun. 5, 2012.
U.S. Appl. No. 61/077,955, filed Jul. 3, 2008.
U.S. Appl. No. 61/077,977, filed Jul. 3, 2008.
U.S. Appl. No. 61/077,981, filed Jul. 3, 2008.
U.S. Appl. No. 61/077,970, filed Jul. 3, 2008.
U.S. Appl. No. 61/766,766, filed Feb. 20, 2013.
An International Search Report dated Jan. 26, 2010, which issued during the prosecution of Applicant's PCT/IL09/00926.
MacLaren S. A.: "Development of an External Beam Ion Milliprobe", United States Naval Academy , 1990.
European Search Report dated Jun. 6, 2016 which issued during the prosecution of Applicant's European App No. 14754707.9.
Notice of Allowance dated Dec. 30, 2011, which issued during the prosecution of U.S. Appl. No. 12/446,757.
Notice of Allowance dated Jul. 30, 2012, which issued during the prosecution of U.S. Appl. No. 13/002,448.
Notice of Allowance dated Mar. 12, 2014, which issued during the prosecution of U.S. Appl. No. 13/449,392.
Notice of Allowance dated Nov. 12, 2014, which issued during the prosecution of U.S. Appl. No. 13/663,684.
Notice of Allowance dated Jan. 22, 2015, which issued during the prosecution of U.S. Appl. No. 14/302,221.
Notice of Allowance dated Nov. 4, 2015, which issued during the prosecution of U.S. Appl. No. 14/687,890.

An Office Action dated Jun. 5, 2015 which issued during the prosecution of Applicant's European App No. 07827239.0.
An Office Action dated Feb. 6, 2014, which issued during the prosecution of Applicant's European App No. 07827239.0.
Notice of Allowance dated May 6, 2013, which issued during the prosecution of U.S. Appl. No. 13/120,344.
Notice of Allowance dated May 3, 2016, which issued during the prosecution of U.S. Appl. No. 14/615,013.
Partial European Search Report dated Jun. 15, 2016 which issued during the prosecution of Applicant's European App No. 14754707.9
An English translation of an Office Action dated Jan. 28, 2015, which issued during the prosecution of Chinese Patent Application No. 200980142967.0.
An English translation of an Office Action dated Nov. 27, 2012, which issued during the prosecution of Chinese Patent Application No. 200980142967.0.
An English translation of an Office Action dated May 30, 2013. which issued during the prosecution of Chinese Patent Application No. 200980142967.0.
An English translation of an Office Action dated Feb. 27, 2014, which issued during the prosecution of Chinese Patent Application No. 200980142967.0.
An English translation of an Office Action dated Aug. 20, 2014, which issued during the prosecution of Chinese Patent Application No. 200980142967.0.
An English translation of an Office Action dated Apr. 1, 2014, which issued during the prosecution of Japanese Patent Application No. 528494-2011.
An English translation of an Office Action dated May 28, 2013, which issued during the prosecution of Japanese Patent Application No. 528494-2011.
An English translation of an Office Action dated Feb. 17, 2015, which issued during the prosecution of Japanese Patent Application No. 528494-2011.
An Office Action dated May 12, 2014, which issued during the prosecution of Applicant's European App No. 09815770.4.
Notice of Allowance dated Jun. 22, 2016, which issued during the prosecution of U.S. Appl. No. 14/768,641.
Notice of Allowance dated Mar. 15, 2016, which issued during the prosecution of U.S. Appl. No. 14/768,641.
An Office Action dated Jun. 7, 2013, which issued during the prosecution of U.S. Appl. No. 13/449,392.
An Office Action dated Jul. 31, 2014, which issued during the prosecution of U.S. Appl. No. 13/663,684.
An Office Action dated Feb. 4, 2014, which issued during the prosecution of U.S. Appl. No. 13/663,684.
An Office Action dated Sep. 19, 2014, which issued during the prosecution of U.S. Appl. No. 14/302,221.
An Office Action dated Oct. 18, 2012, which issued during the prosecution of U.S. Appl. No. 13/120,344.
An Office Action dated Jul. 22, 2013, which issued during the prosecution of U.S. Appl. No. 12/446,757.
An Office Action dated Dec. 4, 2015, which issued during the prosecution of U.S. Appl. No. 14/615,013.
An Office Action dated Jun. 7, 2017, which issued during the prosecution of U.S. Appl. No. 15/014,516.
An Office Action dated Dec. 4, 2017, which issued during the prosecution of U.S. Appl. No. 15/014,516.
An Advisory Action dated Mar. 31, 2017, which issued during the prosecution of U.S. Appl. No. 15/014,516.
An Office Action together with the English translation dated Jul. 26, 2016, which issued during the prosecution of Japanese Patent Application No. 201210299149.5.
An Office Action dated Nov. 17, 2016, which issued during the prosecution of U.S. Appl. No. 15/014,516.
An Office Action dated May 25, 2016, which issued during the prosecution of U.S. Appl. No. 15/014,516.

* cited by examiner

CHARGED PARTICLE BEAM DEVICES AND MEMBRANE ASSEMBLIES USEFUL THEREIN

REFERENCE TO RELATED APPLICATIONS

Reference is made to the Applicant's following patents, which are related to the subject matter of the present application, the disclosures of which are hereby incorporated by reference:

U.S. Pat. No. 8,334,510, entitled SCANNING ELECTRON MICROSCOPE, AN INTERFACE AND A METHOD FOR OBSERVING AN OBJECT WITHIN A NON-VACUUM ENVIRONMENT;

U.S. Pat. No. 8,492,716, entitled VACUUMED DEVICE AND A SCANNING ELECTRON MICROSCOPE;

U.S. Pat. No. 9,287,089, entitled INTERFACE, A METHOD FOR OBSERVING AN OBJECT WITHIN A NON-VACUUM ENVIRONMENT AND A SCANNING ELECTRON MICROSCOPE; and U.S. Pat. No. 9,431,213, entitled SCANNING ELECTRON MICROSCOPE, AN INTERFACE AND A METHOD FOR OBSERVING AN OBJECT WITHIN A NON-VACUUM ENVIRONMENT.

FIELD OF THE INVENTION

The present invention relates to charged particle beam devices, such as scanning electron microscopes.

BACKGROUND OF THE INVENTION

Various types of charged particle beam devices for specimen observation, such as scanning electron microscopes, are known.

SUMMARY OF THE INVENTION

The present invention seeks to provide improved apparatus for the analysis of samples in non-vacuum environments using charged particle beams. The apparatus is particularly suitable for use as a scanning electron microscope (SEM) but is not limited to use therewith. The apparatus is particularly suitable for analyzing samples in atmospheric pressure environments but is not limited to use therewith.

There is thus provided in accordance with a preferred embodiment of the present invention a charged particle beam device, comprising a charged particle beam source situated in a first-pressure environment, a sample support operative to support a sample situated in a second-pressure environment, the second-pressure environment having a higher pressure than the first-pressure environment, and a membrane assembly separating the first-pressure environment from the second-pressure environment, the membrane assembly comprising a pressure-sealing membrane being substantially transparent to a charged particle beam from the charged particle beam source, a supporting membrane layer being formed with a cornerless aperture, the pressure-sealing membrane being bonded to the supporting membrane layer, and a holding frame being formed with a second aperture larger than and overlying the cornerless aperture.

In accordance with a preferred embodiment of the present invention the charged particle beam device may further comprise an electron-detecting subassembly, the electron-detecting subassembly comprising at least one metal line defining a shape, for detection of electrons resulting from an interaction of the charged particle beam and the sample.

Preferably, the charged particle beam device further comprises an electron detecting subassembly comprising at least two metal lines each defining a shape, the shapes being mutually spaced and mutually nested, for detection of electrons resulting from an interaction of the charged particle beam and the sample.

Preferably, the pressure-sealing membrane and the supporting membrane layer are substantially transparent to X-rays.

In accordance with another preferred embodiment of the present invention, the charged particle beam device may further comprise an electron-detecting subassembly, the electron-detecting subassembly comprising at least two metal lines each defining a shape, the shapes being mutually spaced and mutually nested, for detection of electrons resulting from an interaction between the charged particle beam and the sample, at least one of the metal lines partially overlying an area defined by the second aperture.

Preferably, the second-pressure environment is at atmospheric pressure.

Preferably, the pressure-sealing membrane is disposed between and bonded to the supporting membrane layer and the holding frame.

Alternatively, the supporting membrane layer is disposed between and bonded to the pressure-sealing membrane and the holding frame.

Preferably, the supporting membrane layer is less than 10,000 nanometers thick.

Preferably, the cornerless aperture has a longest chord of at least 250,000 nanometers.

There is further provided in accordance with another preferred embodiment of the present invention a membrane assembly comprising a pressure-sealing membrane suitable for separating a first-pressure environment from a second-pressure environment, the second-pressure environment having a different pressure to the first-pressure environment, the pressure-sealing membrane having a thickness of less than 20 nanometers and being substantially transparent to electrons, a supporting membrane layer being formed with a cornerless aperture, the pressure-sealing membrane being bonded to the supporting membrane layer; and a holding frame being formed with a second aperture larger than and overlying the cornerless aperture.

In accordance with a preferred embodiment of the present invention, the membrane assembly may further comprise an electron-detecting subassembly, the electron-detecting subassembly comprising at least one metal line defining a shape, for detection of electrons.

Preferably, the membrane assembly further comprises an electron-detecting subassembly, the electron-detecting subassembly comprising at least two metal lines each defining a shape, the shapes being mutually nested and mutually spaced, for detection of electrons.

Preferably, the pressure-sealing membrane and the supporting membrane layer are substantially transparent to X-rays.

In accordance with another preferred embodiment of the present invention, the charged particle beam device may further comprise an electron-detecting subassembly, the electron-detecting subassembly comprising at least two metal lines each defining a shape, the shapes being mutually nested and mutually spaced, for detection of electrons, at least one of the metal lines partially overlying an area defined by the second aperture.

Preferably, the pressure-sealing membrane is disposed between and bonded to the supporting membrane layer and the holding frame.

Alternatively, the supporting membrane layer is disposed between and bonded to the pressure-sealing membrane and the holding frame.

Preferably, the supporting membrane layer is less than 10,000 nanometers thick.

Preferably, the cornerless aperture has a longest chord of at least 250,000 nanometers.

There is further provided in accordance with another preferred embodiment of the present invention a charged particle beam device comprising a charged particle beam source situated in a first-pressure environment. an aperture transparent to a charged particle beam from the charged particle beam source, a sample support operative to support a sample, the sample support and the sample situated in a second-pressure environment, the second-pressure environment being at a higher pressure than the first-pressure environment and the second-pressure environment being at atmospheric pressure, and an electron-detecting subassembly situated in the second-pressure environment, the electron-detecting subassembly comprising at least two metal lines each defining a shape, the shapes being mutually spaced and mutually nested, for detection of electrons.

In accordance with a preferred embodiment of the present invention the charged particle beam device may further comprise a membrane assembly separating the second-pressure environment from the first-pressure environment, the membrane assembly comprising a pressure-sealing membrane being substantially transparent to a charged particle beam from the charged particle beam source, a supporting membrane layer being formed with a cornerless aperture, the pressure-sealing membrane being bonded to the supporting membrane layer, and a holding frame being formed with a second aperture larger than and overlying the cornerless aperture.

Preferably, the metal lines are each electrically connected to a metal pad, a distance between the sample and each of the metal pads being greater than a distance between the sample and each of the metal lines.

Preferably, at least one of the metal lines partially overlies an area defined by the second aperture.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Use of charged particle beam devices, such as scanning Electron Microscopes (SEMs) often requires placing a sample in a hard vacuum or soft vacuum environment. For some samples, particularly biological samples, it is desirable to avoid placing the sample in a vacuum. Thus, it is desirable to provide a membrane assembly that prevents atmospheric communication between an inside of an SEM, which can be maintained under vacuum conditions, and an external sample environment, which can be maintained at or near atmospheric pressure. Current such membranes are problematic, as the membranes often break easily or have a small field of view. Therefore, it is the object of the present invention to provide an improved membrane assembly for use with SEMs. Namely, the improved membrane assembly of the present invention is preferably characterized by increased mechanical strength and an enlarged field of view when compared to membrane assemblies of the prior art.

Figure 1A:
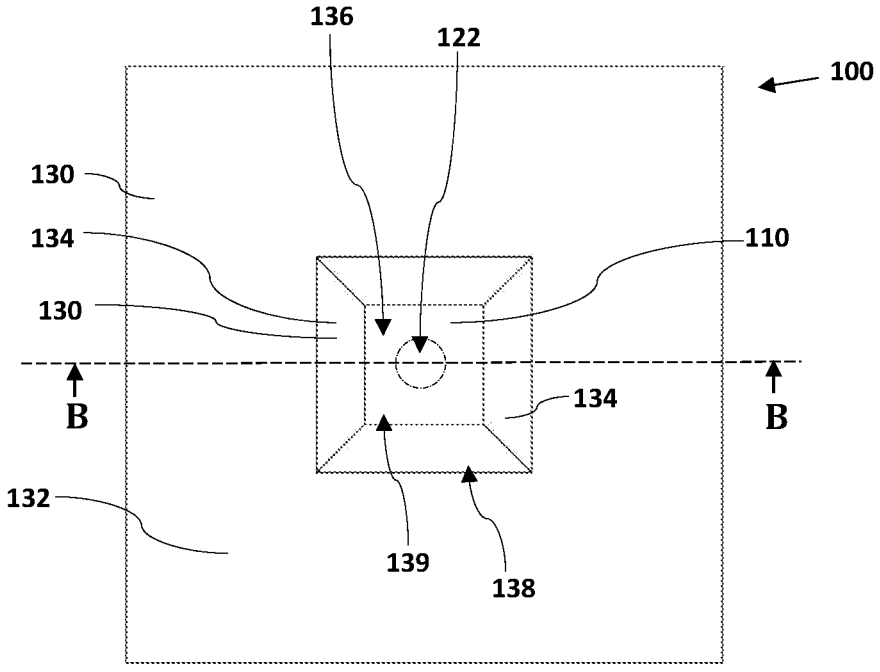
FIG. 1A is a simplified top planar-view illustration of a membrane assembly having a first configuration of a holding frame, a pressure-sealing membrane and a supporting membrane layer.
Figure 1B:
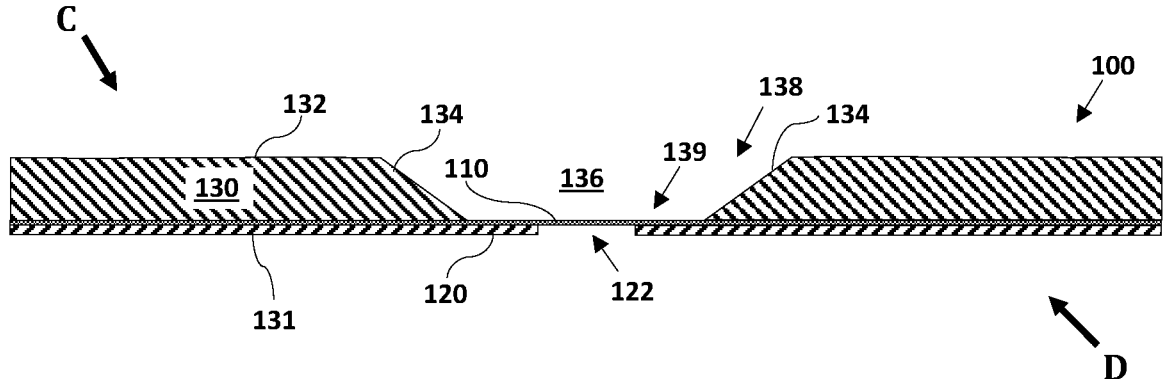
FIG. 1B is a simplified sectional illustration of the membrane assembly of FIG. 1A, taken along line B-B in FIG. 1A.
Figure 1C:
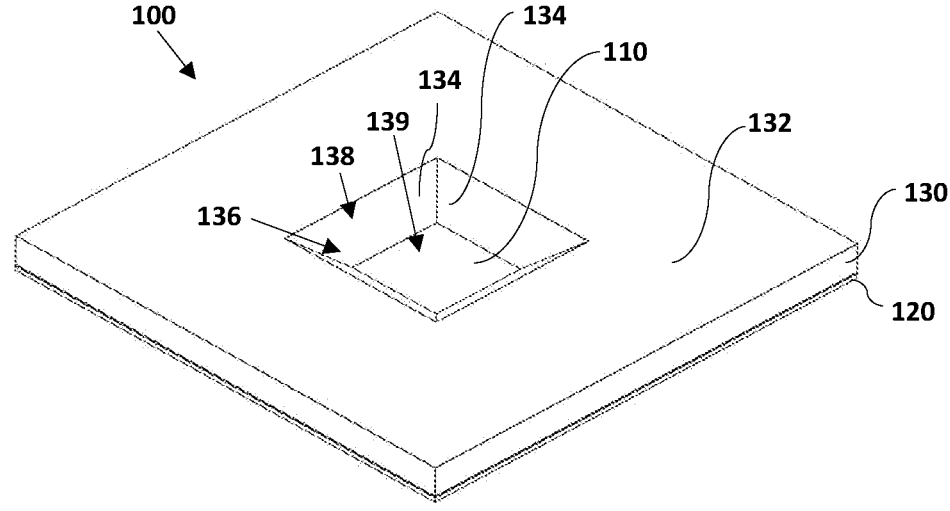
FIG. 1C is a simplified pictorial illustration of the membrane assembly of FIGS. 1A and 1B, from a perspective illustrated by arrow C in FIG. 1B.
Figure 1D:
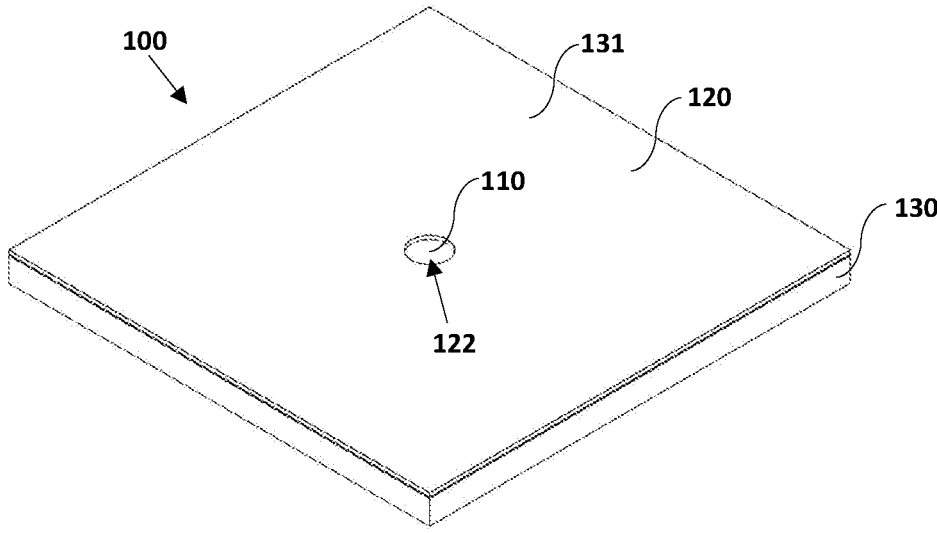
FIG. 1D is a simplified pictorial illustration of the membrane assembly of FIGS. 1A-1C, from a perspective illustrated by arrow D in FIG. 1B.

Reference is now made to FIGS. 1A-1D. FIG. 1A is a simplified top planar-view illustration of a membrane assembly 100 constructed and operative in accordance with a preferred embodiment of the present invention. FIG. 1B is a simplified sectional illustration of membrane assembly 100, taken along line B-B in FIG. 1A. FIG. 1C is a simplified pictorial illustration of membrane assembly 100, from a perspective illustrated by arrow C in FIG. 1B. FIG. 1D is a simplified pictorial illustration of membrane assembly 100, from a perspective illustrated by arrow D in FIG. 1B.

Membrane assembly 100 preferably includes a pressure-scaling membrane 110, a supporting membrane layer 120 formed with a cornerless aperture 122 and a holding frame 130. As seen particularly well in FIG. 1B, membrane assembly 100 is preferably configured such that pressure-scaling membrane 110 is supported between supporting membrane layer 120 and holding frame 130. Thus, cornerless aperture 122 in supporting membrane layer 120 is concealed from view in FIG. 1A and is therefore represented by a dashed line. Pressure-scaling membrane 110 is preferably bonded to supporting membrane layer 120 and to holding frame 130. While membrane assembly 100 is commonly manufactured in an inverse orientation to the orientation shown in FIG. 1B, an operative orientation of membrane assembly 100 is as shown in FIG. 1B. In accordance with the operative orientation thereof, a "bottom" of membrane assembly 100 herein refers to a largest external surface 131 of supporting membrane layer 120 and a "top" of membrane assembly 100 herein refers to a horizontal top-surface 132 of holding frame 130.

Holding frame 130 allows a user to more readily maneuver membrane assembly 100. Holding frame 130 preferably includes horizontal top-surface 132 and a plurality of internal walls 134. Internal walls 134 preferably define a truncated pyramidal recess 136. Together with holding frame 130, truncated pyramidal recess 136 defines an aperture 138 and an aperture 139. In the embodiment of the present invention shown in FIGS. 1A-1D, apertures 138 and 139 are coaxial. In an alternative embodiment of the present invention, apertures 138 and 139 are not coaxial. In the embodiment of the present invention shown in FIGS. 1A-1D, aperture 138 is larger than aperture 139. In an alternative embodiment of the present invention, aperture 138 is not larger than aperture 139. In the embodiment of the present invention shown in FIGS. 1A-1D, apertures 138 and 139 are generally square in shape. In an alternative embodiment of the present invention, apertures 138 and 139 are formed in any suitable shapes, such as, inter alia, circles, rounded squares or rectangles. Preferably, apertures 138 and 139 are symmetrical shapes.

In the embodiment of the present invention shown in FIGS. 1A-1D, recess 136 is a truncated pyramidal recess. In an alternative embodiment of the present invention, recess 136 may be formed in any suitable shape, such as, inter alia, a prismatic, cylindrical or truncated conical shape. In the embodiment of the present invention shown in FIGS. 1A-1D, holding frame 130 is generally square in shape. In an alternative embodiment of the present invention holding frame 130 may be formed in any suitable shape, such as, inter alia, a circle, a rounded square or a rectangle. Preferably, holding frame 130 has a thickness between 50,000 nanometers and 1,000,000 nanometers.

Supporting membrane layer 120 provides mechanical support for pressure-scaling membrane 110. Supporting membrane layer 120 is preferably less than 25,000 nanometers thick. More preferably, supporting membrane layer 120 is less than 10,000 nanometers thick. Most preferably, supporting membrane layer 120 is less than 5,000 nanometers thick. Preferably, supporting membrane layer 120 is substantially transparent to X-rays. The phrase "substantially transparent to X-rays" is herein defined as being at least 10% transparent to X-ray photons with energies of at least 1,300 electron volts. Supporting membrane layer 120 may be formed of any suitable material, such as, inter alia, silicon, glass or sapphire.

Supporting membrane layer 120 is formed with cornerless aperture 122 for electrons to pass through. The term "cornerless" is herein defined as not having a point at which two straight or curved edges meet. Preferably, cornerless aperture 122 in supporting membrane layer 120 is formed in a circular shape. Alternatively, cornerless aperture 122 may be formed in any suitable cornerless shape, such as, inter alia, an ellipse, an oval or a rounded square. Preferably, cornerless aperture 122 has a longest chord of at least 100,000 nanometers. More preferably, cornerless aperture 122 has a longest chord of at least 200,000 nanometers. Most preferably, cornerless aperture 122 has a longest chord of at least 250,000 nanometers. The term "chord" is herein defined as a straight line connecting two points on any curve. The lack of corners in cornerless aperture 122 improves a mechanical strength of membrane assembly 100 and allows for a longer longest chord of cornerless aperture 122 and without membrane assembly 100 fracturing, relative to a membrane assembly formed with a pressure-scaling membrane having an aperture that is not cornerless.

Pressure-scaling membrane 110 is preferably less than 100 nanometers thick. More preferably, pressure-sealing membrane 110 is less than 50 nanometers thick. Most preferably, pressure-sealing membrane 110 is less than 20 nanometers thick. Preferably, pressure-scaling membrane 110 is substantially transparent to electrons. The phrase "substantially transparent to electrons" is herein defined as being at least 50% transparent to an incident electron beam having an energy of at least 10,000 electron volts. Pressure-scaling membrane 110 is supported between and bonded to supporting membrane layer 120 and holding frame 130 such that pressure-sealing membrane 110 overlies and atmospherically seals cornerless aperture 122 and aperture 139.

It is a particular feature of the present invention that if recess 136 is situated in a first-pressure gaseous environment and cornerless aperture 122 is situated in a second-pressure gaseous environment, there exists a pressure differential between the first-pressure and second-pressure environments, across pressure-scaling membrane 110. Preferably, there exists a pressure differential of approximately 100,000 pascals across pressure-scaling membrane 110. More preferably, there exists a pressure differential of approximately 150,000 pascals across pressure-sealing membrane 110. Most preferably, there exists a pressure differential of approximately 200,000 pascals across pressure-sealing membrane 110. Preferably, pressure-scaling membrane 110 is substantially transparent to X-rays and electrons. Pressure-scaling membrane 110 may be formed of any suitable material, such as, inter alia, silicon, carbon or silicon nitride.

Aperture 139 is formed having a larger area than cornerless aperture 122. Preferably, aperture 139 completely overlies cornerless aperture 122. In one embodiment of the present invention, cornerless aperture 122 and aperture 139 share a common center, as shown in FIG. 1A. In an alternative embodiment of the present invention, cornerless aperture 122 and aperture 139 do not share a common center.

In the embodiment of the present invention shown in FIGS. 1A-1D, membrane assembly 100 includes three layers. In an alternative embodiment of the present invention, membrane assembly 100 may include additional layers including but not limited to: one or more etch-stopping layers useful for a manufacturing process, one or more stress-compensation layers, one or more dielectric layers, one or more adhesive layers for an attachment of membrane assembly 100 to other structures and one or more buffer layers to prevent pressure-sealing membrane 110 from becoming contaminated or mechanically damaged through contact with other materials.

Membrane assembly 100 is preferably manufactured using conventional silicon-on-insulator (SOI) and silicon-nitride-on-insulator (SNOI) technology by a suitable semiconductor manufacturer, such as, for example, Norcada Inc., of Edmonton, Canada.

Figure 2A:
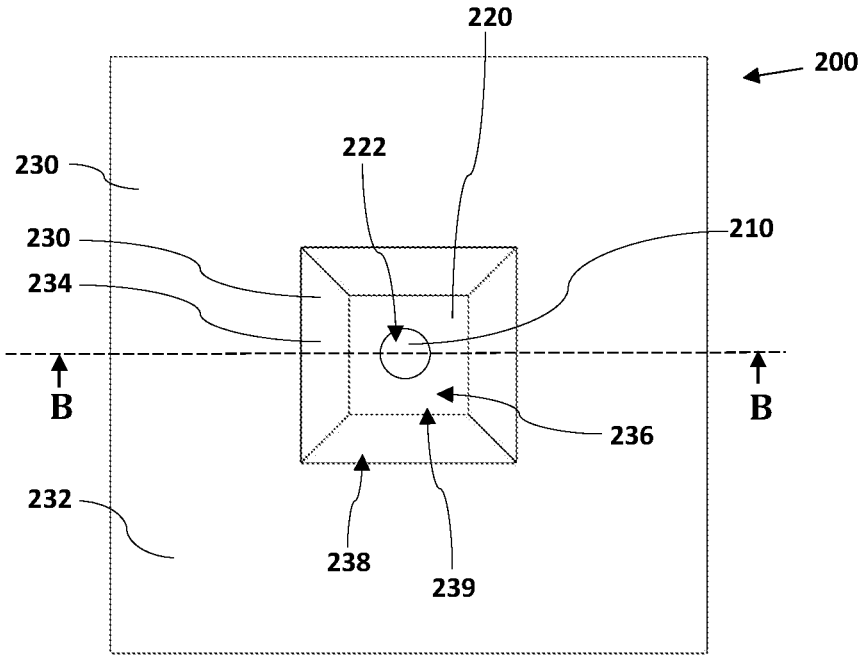
FIG. 2A is a simplified top planar-view illustration of an additional embodiment of a membrane assembly having an alternative configuration of a holding frame, a pressure-sealing membrane and a supporting membrane layer.
Figure 2B:
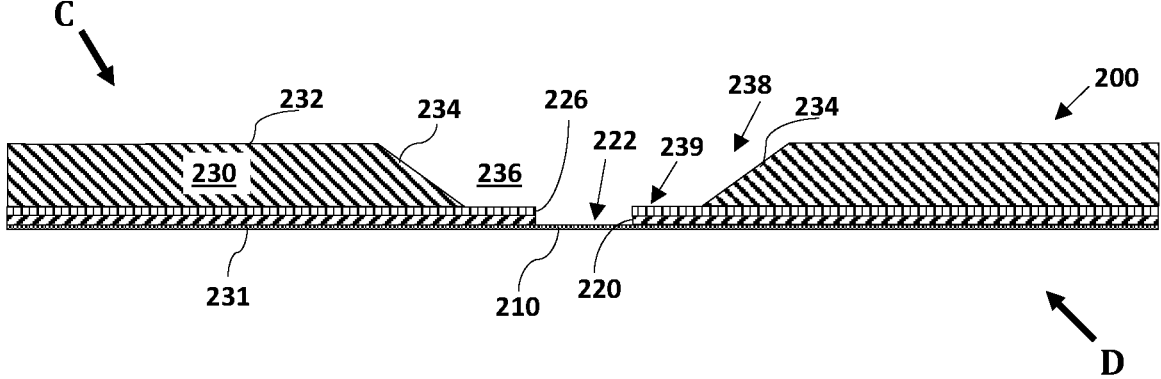
FIG. 2B is a simplified sectional illustration of the membrane assembly of FIG. 2A, taken along line B-B in FIG. 2A.
Figure 2C:
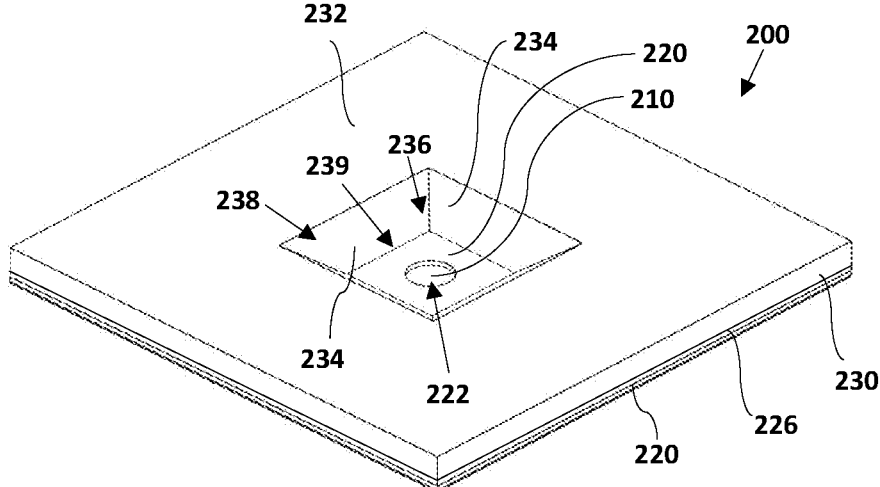
FIG. 2C is a simplified pictorial illustration of the membrane assembly of FIGS. 2A and 2B, from a perspective illustrated by arrow C in FIG. 2B.
Figure 2D:
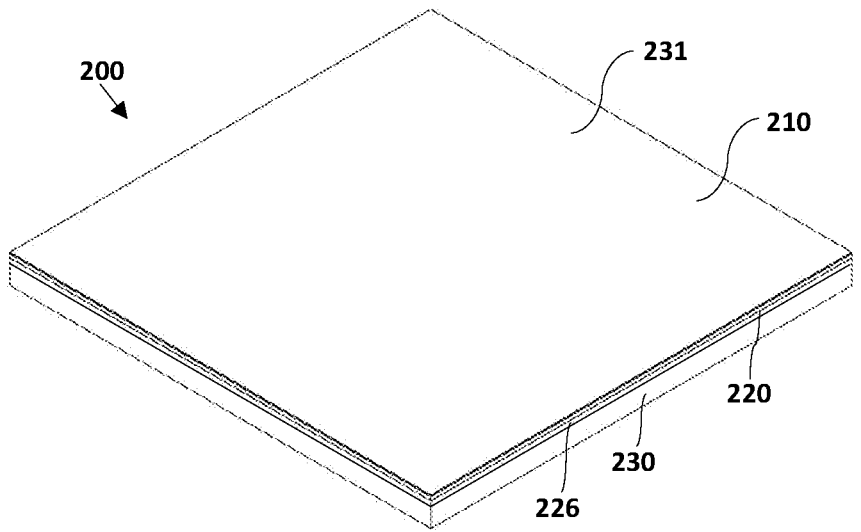
FIG. 2D is a simplified pictorial illustration of the membrane assembly of FIGS. 2A-2C, from a perspective illustrated by arrow D in FIG. 2B.

Reference is now made to FIGS. 2A-2D. FIG. 2A is a simplified top planar-view illustration of a membrane assembly 200. FIG. 2B is a simplified sectional illustration of membrane assembly 200, taken along line B-B in FIG. 2A. FIG. 2C is a simplified pictorial illustration of membrane assembly 200, from a perspective illustrated by arrow C in FIG. 2B. FIG. 2D is a simplified pictorial illustration of membrane assembly 200, from a perspective illustrated by arrow D in FIG. 2B.

Membrane assembly 200 preferably includes a pressure-scaling membrane 210, a supporting membrane layer 220 formed with a cornerless aperture 222, an etch-stopping layer 226 resultant from manufacture and a holding frame 230. As seen particularly well in FIG. 2B, membrane assembly 200 is preferably configured such that supporting membrane layer 220 is supported between and bonded to pressure-sealing membrane 210 and etch-stopping layer 226 and etch-stopping layer 226 is bonded to holding frame 230. While membrane assembly 200 is commonly manufactured in an inverse orientation to the orientation shown in FIG. 2B, an operative orientation of membrane assembly 200 is as shown in FIG. 2B. In accordance with the operative orientation thereof, a "bottom" of membrane assembly 200 herein refers to a largest external surface 231 of pressure-sealing membrane 210 and a "top" of membrane assembly 200 herein refers to a horizontal top-surface 232 of holding frame 230.

Holding frame 230 allows a user to more readily maneuver membrane assembly 200. Holding frame 230 preferably includes horizontal top-surface 232 and a plurality of internal walls 234. Internal walls 234 preferably define a truncated pyramidal recess 236. Together with holding frame 230, truncated pyramidal recess 236 defines an aperture 238 and an aperture 239. In the embodiment of the present invention shown in FIGS. 2A-2D, apertures 238 and 239 are coaxial. In an alternative embodiment of the present invention, apertures 238 and 239 are not coaxial. In the embodiment of the present invention shown in FIGS. 2A-2D, aperture 238 is larger than aperture 239. In an alternative embodiment of the present invention, aperture 238 is not larger than aperture 239. In the embodiment of the present invention shown in FIGS. 2A-2D, apertures 238 and 239 are generally square in shape. In an alternative embodiment of the present invention, apertures 238 and 239 may be formed in any suitable shapes, such as, inter alia, circles, rounded squares or rectangles. Preferably, apertures 238 and 239 are symmetrical shapes.

In the embodiment of the present invention shown in FIGS. 2A-2D, recess 236 is a truncated pyramidal recess. In an alternative embodiment of the present invention, recess 236 may be formed in any suitable shape, such as, inter alia, a prismatic, cylindrical or truncated conical shape. In the embodiment of the present invention shown in FIGS. 2A-2D, holding frame 230 is generally square in shape. In an alternative embodiment of the present invention, holding frame 230 may be formed in any suitable shape, such as, inter alia, a circle, a rounded square or a rectangle. Preferably, holding frame 230 has a thickness between 50,000 nanometers and 1,000,000 nanometers.

Supporting membrane layer 220 provides mechanical support for pressure-scaling membrane 210. Supporting membrane layer 220 is preferably less than 25,000 nanometers thick. More preferably, supporting membrane layer 220 is less than 10,000 nanometers thick. Most preferably, supporting membrane layer 220 is less than 5,000 nanometers thick. Preferably, supporting membrane layer 220 and etch-stopping layer 226 are both substantially transparent to X-rays. Supporting membrane layer 220 may be formed of any suitable material, such as, inter alia, silicon, glass or sapphire.

Supporting membrane layer 220 is formed with cornerless aperture 222 for electrons to pass through. Preferably, cornerless aperture 222 in supporting membrane layer 220 is formed in a circular shape. Alternatively, cornerless aperture 222 may be formed in any suitable cornerless shape, such as, inter alia, an ellipse, an oval or a rounded square. Preferably, cornerless aperture 222 has a longest chord of at least 100,000 nanometers. More preferably, cornerless aperture 222 has a longest chord of at least 200,000 nanometers. Most preferably, cornerless aperture 222 has a longest chord of at least 250,000 nanometers. The lack of corners in cornerless aperture 222 improves a mechanical strength of membrane assembly 200 and allows for a longer longest chord of cornerless aperture 222 and without membrane assembly 200 fracturing, relative to a membrane assembly formed with a pressure-sealing membrane having an aperture that is not cornerless.

Pressure-sealing membrane 210 is preferably less than 100 nanometers thick. More preferably, pressure-scaling membrane 210 is less than 50 nanometers thick. Most preferably, pressure-sealing membrane 210 is less than 20 nanometers thick. Pressure-scaling membrane 210 is bonded to supporting membrane layer 220 such that pressure-sealing membrane 210 overlies and atmospherically seals cornerless aperture 222.

It is a particular feature of the present invention that if recess 236 is situated in a first-pressure gaseous environment and lower surface 231 of pressure-sealing membrane 210 is situated in a second-pressure gaseous environment, there exists a pressure differential between the first-pressure and second-pressure environments, across pressure-sealing membrane 210. Preferably, there exists a pressure differential of approximately 100,000 pascals across pressure-scaling membrane 210. More preferably, there exists a pressure differential of approximately 150,000 pascals across pressure-sealing membrane 210. Most preferably, there exists a pressure differential of approximately 200,000 pascals across pressure-scaling membrane 210. Preferably, pressure-sealing membrane 210 is substantially transparent to X-rays and electrons. Pressure-sealing membrane 210 may be formed of any suitable material, such as, inter alia, silicon, carbon or silicon nitride.

Aperture 239 is formed having a larger area than cornerless aperture 222. Preferably, aperture 239 completely overlies cornerless aperture 222. In one embodiment of the present invention, cornerless aperture 222 and aperture 239 share a common center, as shown in FIG. 2A. In an alternative embodiment of the present invention, cornerless aperture 222 and aperture 239 do not share a common center.

In the embodiment of the present invention shown in FIGS. 2A-2D, membrane assembly 200 includes four layers. In an alternative embodiment of the present invention, membrane assembly 200 may include additional layers including but not limited to: one or more additional etch-stopping layers useful for a manufacturing process, one or more stress-compensation layers, one or more dielectric layers, one or more adhesive layers for an attachment of membrane assembly 200 to other structures and one or more buffer layers to prevent pressure-sealing membrane 210 from becoming contaminated or mechanically damaged through contact with other materials.

Membrane assembly 200 is preferably manufactured using conventional silicon-on-insulator (SOI) and silicon-nitride-on-insulator (SNOI) technology by a suitable semiconductor manufacturer, such as, for example, Norcada Inc., of Edmonton, Canada.

Figure 3A:
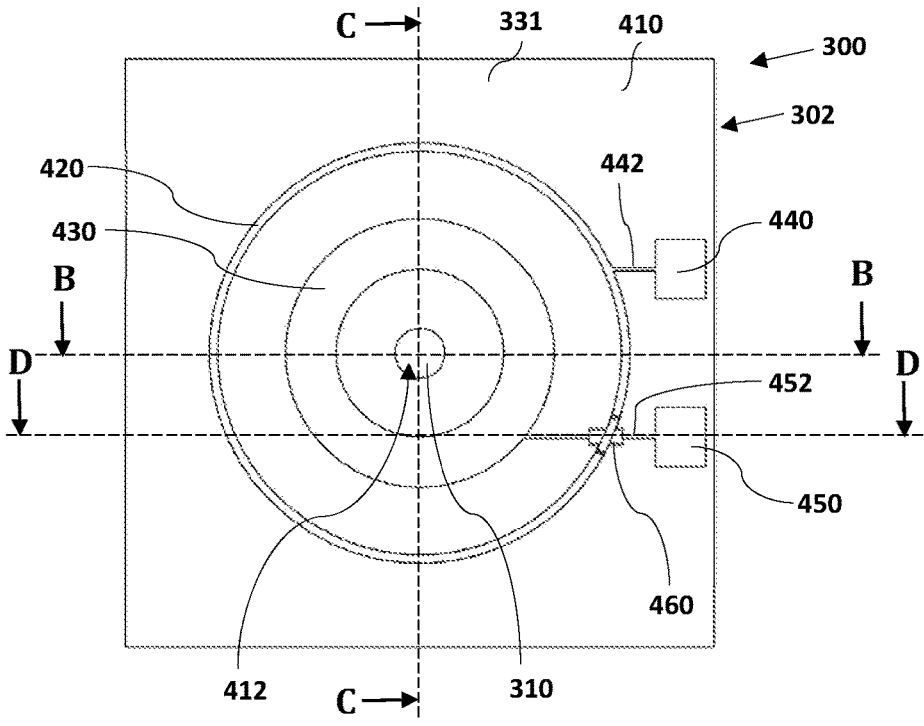
FIG. 3A is a simplified bottom planar-view illustration of a membrane assembly similar to the membrane assembly of FIGS. 1A-1D, and also including an electron-detecting subassembly.
Figure 3B:
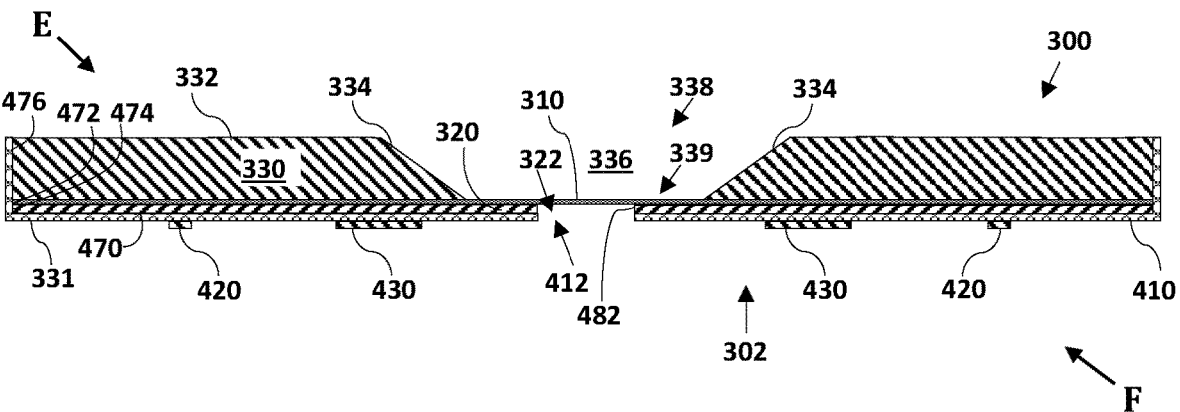
FIG. 3B is a simplified sectional illustration of the membrane assembly of FIG. 3A, taken along line B-B in FIG. 3A.
Figure 3C:
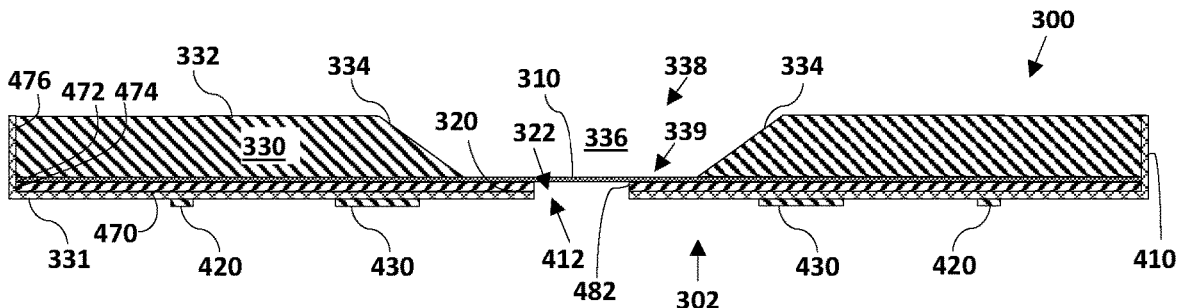
FIG. 3C is a simplified sectional illustration of the membrane assembly of FIGS. 3A and 3B, taken along line C-C in FIG. 3A.
Figure 3D:
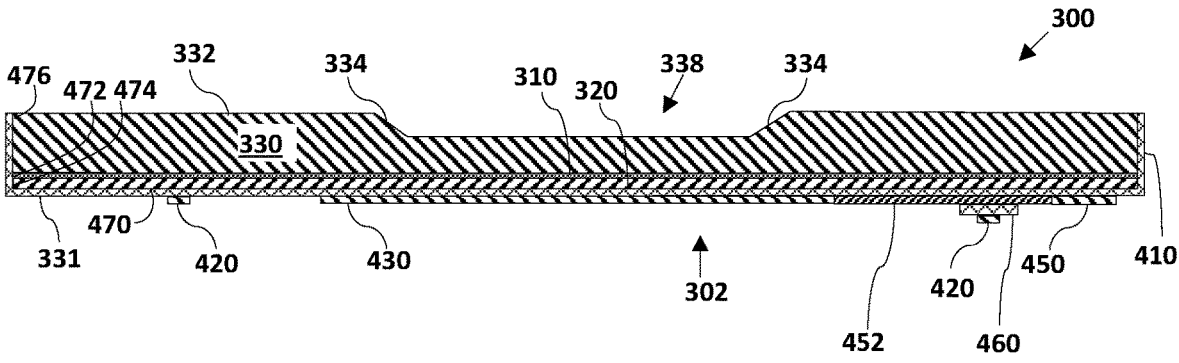
FIG. 3D is a simplified sectional illustration of the membrane assembly of FIGS. 3A-3C, taken along line D-D in FIG. 3A.
Figure 3E:
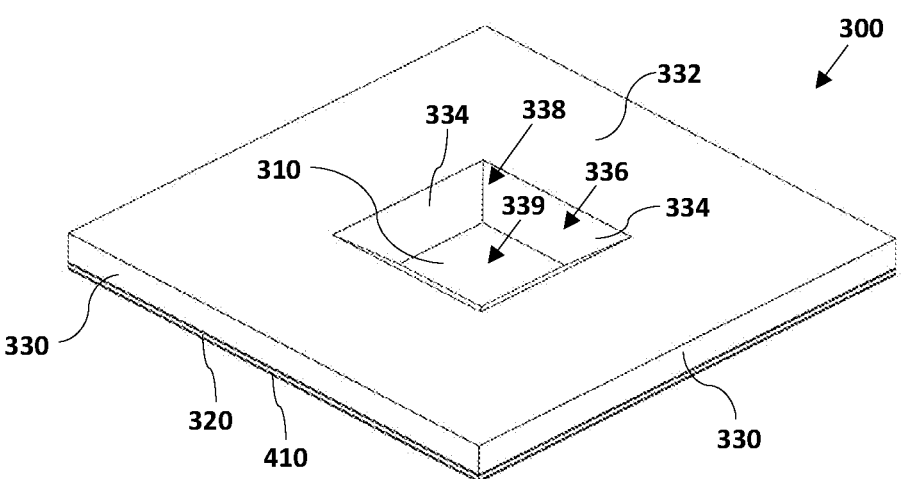
FIG. 3E is a simplified pictorial illustration of the membrane assembly of FIGS. 3A-3D, from a perspective illustrated by arrow E in FIG. 3B.
Figure 3F:
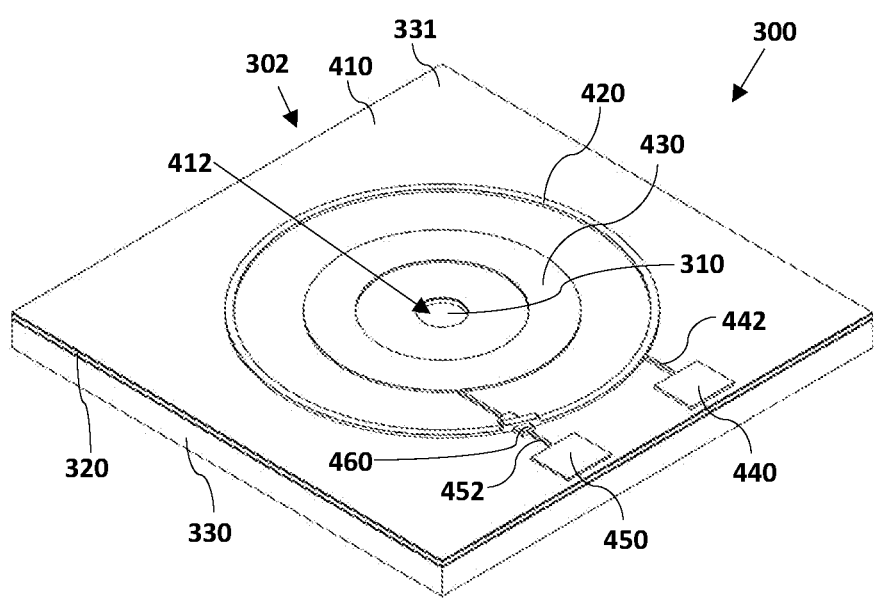
FIG. 3F is a simplified pictorial illustration of the membrane assembly of FIGS. 3A-3E, from a perspective illustrated by arrow F in FIG. 3B.

Reference is now made to FIGS. 3A-3F. FIG. 3A is a simplified bottom planar-view illustration of a membrane assembly 300, which is similar to membrane assembly 100, but also includes an electron-detecting subassembly 302 for detecting electrons. FIG. 3B is a simplified sectional illustration of membrane assembly 300, taken along line B-B in FIG. 3A. FIG. 3C is a simplified sectional illustration of membrane assembly 300, taken along line C-C in FIG. 3A. FIG. 3D is a simplified sectional illustration of membrane assembly 300, taken along line D-D in FIG. 3A. FIG. 3E is a simplified pictorial illustration of membrane assembly 300, from a perspective illustrated by arrow E in FIG. 3B. FIG. 3F is a simplified pictorial illustration of membrane assembly 300, from a perspective illustrated by arrow F in FIG. 3B. In addition to electron-detecting subassembly 302, membrane assembly 300 includes a pressure-scaling membrane 310, a supporting membrane layer 320 formed with a cornerless aperture 322 and a holding frame 330.

As seen particularly well in FIG. 3B, membrane assembly 300 is preferably configured such that pressure-sealing membrane 310 is supported between and bonded to supporting membrane layer 320 and holding frame 330. While membrane assembly 300 is commonly manufactured in an inverse orientation to the orientation shown in FIGS. 3B-3E, an operative orientation of membrane assembly 300 is as shown in FIGS. 3B-3E. In accordance with the operative orientation thereof, a "bottom" of membrane assembly 300 herein refers to a largest external surface 331 of electron-detecting subassembly 302 and a "top" of membrane assembly 300 herein refers to a horizontal top-surface 332 of holding frame 330.

Holding frame 330 allows a user to more readily maneuver membrane assembly 300. Holding frame 330 preferably includes horizontal top-surface 332 and a plurality of internal walls 334. Internal walls 334 preferably define a truncated pyramidal recess 336. Together with holding frame 330, truncated pyramidal recess 336 defines an aperture 338 and an aperture 339. In the embodiment of the present invention shown in FIGS. 3A-3F, apertures 338 and 339 are coaxial. In an alternative embodiment of the present invention, apertures 338 and 339 are not coaxial. In the embodiment of the present invention shown in FIGS. 3A-3F, aperture 338 is larger than aperture 339. In an alternative embodiment of the present invention, aperture 338 is not larger than aperture 339. In the embodiment of the present invention shown in FIGS. 3A-3F, apertures 338 and 339 are generally square in shape. In an alternative embodiment of the present invention, apertures 338 and 339 may be formed in any suitable shapes, such as, inter alia, circles, rounded squares or rectangles. Preferably, apertures 338 and 339 are symmetrical shapes.

In the embodiment of the present invention shown in FIGS. 3A-3F, recess 336 is a truncated pyramidal recess. In an alternative embodiment of the present invention, recess 336 may be formed in any suitable shape, such as, inter alia, a prismatic, cylindrical or truncated conical shape. In the embodiment of the present invention shown in FIGS. 3A-3F, holding frame 330 is generally square in shape. In an alternative embodiment of the present invention, holding frame 330 may be formed in any suitable shape, such as, inter alia, a circle, a rounded square or a rectangle. Preferably, holding frame 330 has a thickness between 50,000 nanometers and 1,000,000 nanometers.

Supporting membrane layer 320 provides mechanical support for pressure-scaling membrane 310. Supporting membrane layer 320 is preferably less than 25,000 nanometers thick. More preferably, supporting membrane layer 320 is less than 10,000 nanometers thick. Most preferably, supporting membrane layer 320 is less than 5000 nanometers thick. Preferably, supporting membrane layer 320 is substantially transparent to X-rays. Supporting membrane layer 320 may be formed of any suitable material, such as, inter alia, silicon, glass or sapphire.

Supporting membrane layer 320 is formed with cornerless aperture 322 for electrons to pass through. Preferably, cornerless aperture 322 in supporting membrane layer 320 is formed in a circular shape. Alternatively, cornerless aperture 322 may be formed in any suitable cornerless shape, such as, inter alia, an ellipse, an oval or a rounded square. Preferably, cornerless aperture 322 has a longest chord of at least 100,000 nanometers. More preferably, cornerless aperture 322 has a longest chord of at least 200,000 nanometers. Most preferably, cornerless aperture 322 has a longest chord of at least 250,000 nanometers. The lack of corners in cornerless aperture 322 improves a mechanical strength of membrane assembly 300 and allows for a longer longest chord of cornerless aperture 322 and without membrane assembly 300 fracturing, relative to a membrane assembly formed with a pressure-sealing membrane having an aperture that is not cornerless.

Pressure-sealing membrane 310 is preferably less than 100 nanometers thick. More preferably, pressure-sealing membrane 310 is less than 50 nanometers thick. Most preferably, pressure-sealing membrane 310 is less than 20 nanometers thick. Pressure-sealing membrane 310 is supported between and bonded to supporting membrane layer 320 and holding frame 330 such that pressure-sealing membrane 310 overlies and atmospherically seals cornerless aperture 322 and aperture 339.

It is a particular feature of the present invention that if recess 336 is situated in a first-pressure gaseous environment and electron-detecting subassembly 302 is situated in a second-pressure gaseous environment, there exists a pressure differential between the first-pressure and second-pressure environments, across pressure-sealing membrane 310. Preferably, there exists a pressure differential of approximately 100,000 pascals across pressure-scaling membrane 310. More preferably, there exists a pressure differential of approximately 150,000 pascals across pressure-sealing membrane 310. Most preferably, there exists a pressure differential of approximately 200,000 pascals across pressure-sealing membrane 310. Preferably, pressure-scaling membrane 310 is substantially transparent to X-rays and electrons. Pressure-sealing membrane 310 may be formed of any suitable material, such as, inter alia, silicon, carbon or silicon nitride.

Aperture 339 is formed having a larger area than cornerless aperture 322. Preferably, aperture 339 completely overlies cornerless aperture 322. In one embodiment of the present invention, cornerless aperture 322 and aperture 339 share a common center, as shown in FIGS. 3A-3F. In an alternative embodiment of the present invention, cornerless aperture 322 and aperture 339 do not share a common center.

Preferably, electron-detecting subassembly 302 is electrically insulated from other portions of membrane assembly 300 by a dielectric layer 410, which is formed with a cornerless aperture 412. Electron-detecting subassembly 302 includes an outer metal line 420, an inner metal line 430, an outer metal line pad 440, a connecting metal line 442, an inner metal line pad 450, a connecting metal line 452 and a separator 460, as described in more detail hereinbelow.

Dielectric layer 410 is bonded to a largest-area exposed surface 470 of supporting membrane layer 320. Preferably, dielectric layer 410 is also bonded to a smallest-area exposed surface 472 of pressure-sealing membrane 310, a smallest-area exposed surface 474 of supporting membrane layer 320 and a smallest-area exposed surface 476 of holding frame 330, such that dielectric layer 410 overlies at least part of smallest-area external exposed surface 476 of holding frame 330. In the embodiment of the present invention shown in FIGS. 3A-3F, dielectric layer 410 overlies all of smallest-area external exposed surface 476 of holding frame 330. In an alternative embodiment of the present invention, dielectric layer 410 may overlie any suitable portion of smallest-area external exposed surface 476 of holding frame 330. In the embodiment of the present invention shown in FIGS. 3A-3F, dielectric layer 410 does not overlie an internal surface 482 of cornerless aperture 322. In an alternative embodiment of the present invention, dielectric layer 410 does overlie internal surface 482 of cornerless aperture 322.

Preferably, cornerless aperture 412 of dielectric layer 410 has a similar shape and similar longest chord to cornerless aperture 322. Preferably, cornerless aperture 412 directly overlies cornerless aperture 322. Preferably, dielectric layer 410 has any suitable thickness such that dielectric layer 410 is substantially transparent to X-rays while providing suitable electrical insulation between electron-detecting subassembly 302 and other portions of membrane assembly 300. More preferably, dielectric layer 410 has a thickness of less than 2,000 nanometers. Preferably, dielectric layer 410 is formed of silicon dioxide or silicon nitride.

Preferably, outer metal line 420, inner metal line 430, outer metal line pad 440, inner metal line pad 450, connecting metal line 442 and connecting metal line 452 are formed of gold. Outer metal line 420 and inner metal line 430 are formed in nested closed shapes. Preferably, the nested closed shapes are concentric and centered about a center of cornerless aperture 322. Preferably, the nested closed shapes are rings. In the embodiment of the present invention shown in FIGS. 3A-3F, metal lines 420 and 430 are concentric rings centered about the center of cornerless aperture 322. In an alternative embodiment of the present invention, metal lines 420 and 430 may define any suitable nested closed shapes, such as, inter alia, squares, rounded squares or ovals, and need not be centered about the center of cornerless aperture 322. Inner metal line 430 does not overlie holding frame aperture 339. Inner metal line 430 and outer metal line 420 may have any suitable line widths and spacing, such as, inter alia, the line widths and spacing shown in FIGS. 3A-3F. The term "line width" herein refers to respective measurements characterizing each of inter metal line 430 and outer metal line 420, the measurement being measured in a dimension generally parallel to a plane in which a majority of dielectric layer 410 lies.

In the embodiment of the present invention shown in FIGS. 3A-3F, membrane assembly 300 includes two metal lines forming nested closed shapes, namely outer metal line 420 and inner metal line 430. In an alternative embodiment of the present invention, membrane assembly 300 includes any number of metal lines forming nested closed shapes. In a further alternative embodiment of the present invention, membrane assembly 300 includes one metal line forming a nested closed shape.

Outer metal line 420 is electrically connected to outer metal line pad 440. In the embodiment of the present invention shown in FIGS. 3A-3F, connecting metal line 442 electrically connects outer metal line 420 to outer metal line pad 440. In an alternative embodiment of the present invention, connecting metal line 442 is obviated, and an alternative electrical connector (not shown) electrically connects outer metal line 420 to outer metal line pad 440.

Inner metal line 430 is electrically connected to inner metal line pad 450. In the embodiment of the present invention shown in FIGS. 3A-3F, connecting metal line 452 electrically connects inner metal line 430 to inner metal line pad 450. In an alternative embodiment of the present invention, connecting metal line 452 is obviated, and an alternative electrical connector (not shown) electrically connected inner metal line 430 to inner metal line pad 450.

Preferably, outer metal line pad 440 and inner metal line pad 450 are in electrical communication with a printed circuit board (not shown). In the embodiment of the present invention shown in FIGS. 3A-3F, outer metal line pad 440 and inner metal line pad 450 are both rectangular in shape. In an alternative embodiment of the present invention, each of outer metal line pad 440 and inner metal line pad 450 may be formed in any suitable shapes, such as, inter alia, rounded squares, rounded rectangles or trapeziums.

In the embodiment of the present invention shown in FIGS. 3A-3F, both of outer metal line pad 440 and inner metal line pad 450 are closest to a single edge of membrane assembly 300. In an alternative embodiment of the present invention, each of outer metal line pad 440 and inner metal line pad 450 are closest to a different edge of membrane assembly 300 from one another. In yet an alternative embodiment of the present invention, each of outer metal line pad 440 and inner metal line pad 450 are situated at positions on dielectric layer 410, different from those shown in FIGS. 3A-3F.

Preferably, outer metal line 420, inner metal line 430, connecting metal line 442 and connecting metal line 452 all have respective thicknesses of less than 2,000 nanometers. More preferably, outer metal line 420, inner metal line 430, connecting metal line 442 and connecting metal line 452 all have respective thicknesses of less than 500 nanometers. Most preferably, outer metal line 420, inner metal line 430, connecting metal line 442 and connecting metal line 452 all have respective thicknesses of less than 100 nanometers. Preferably, outer metal line pad 440 and inner metal line pad 450 each have a thickness of less than 1,000 nanometers and more than 200 nanometers. More preferably, outer metal line pad 440 and inner metal line pad 450 each have a thickness of less than 1,000 nanometers and more than 300 nanometers. Most preferably, outer metal line pad 440 and inner metal line pad 450 each have a thickness of less than 500 nanometers and more than 300 nanometers. The term "thickness" herein refers to a dimension perpendicular to a plane in which a majority of dielectric layer 410 lies.

In one embodiment of the present invention, outer metal line 420, inner metal line 430, outer metal line pad 440, inner metal line pad 450, connecting metal line 442 and connecting metal line 452 are bonded to dielectric layer 410 using thin film metal deposition. In an alternative embodiment of the present invention, outer metal line 420, inner metal line 430, outer metal line pad 440, inner metal line pad 450, connecting metal line 442 and connecting metal line 452 are affixed to dielectric layer 410 using an alternative bonding process.

During an operation of membrane assembly 300, either a positive or negative potential may be applied to outer metal line 420 and inner metal line 430. If an overall positive potential is applied to a metal line, then the metal line absorbs lower-energy electrons. If an overall negative potential is applied to a metal line, then the metal line absorbs more positively charged particles. In a preferred mode of operation of membrane assembly 300, a positive potential is applied to both outer metal line 420 and inner metal line 430, thereby maximizing an absorption of low-energy electrons primarily by inner metal line 430.

In a preferred use of membrane assembly 300, inner metal line 430 preferably absorbs low-energy electrons for detection, and outer metal line 420 improves a signal to noise ratio of electron-detecting subassembly 302. Preferably, those components of membrane assembly 300 designated for detecting electrons are not in electrical contact with those components of membrane assembly 300 designated for absorbing electromagnetic noise. Thus, in the embodiment shown in FIGS. 3A-3F, none of inner metal line 430, inner metal line pad 450 or connecting metal line 452 are in electrical contact with any of outer metal line 420, outer metal line pad 440 or connecting metal line 442.

If any of inner metal line 430, inner metal line pad 450 or connecting metal line 452 overlies any of outer metal line 420, outer metal line pad 440 or connecting metal line 442, the overlying components are preferably separated with a separator formed of a suitable electrically insulating material. For example, in FIGS. 3A-3F, and as seen particularly well in FIGS. 3D and 3F, where outer metal line 420 overlies connecting metal line 452, separator 460 is situated between outer metal line 420 and connecting metal line 452 and prevents electrical contact between outer metal line 420 and connecting metal line 452.

Membrane assembly 300 may have additional layers including but not limited to: one or more etch-stopping layers useful for a manufacturing process, one or more stress-compensation layers, one or more additional layers of electrical insulation, one or more adhesive layers for an attachment of membrane assembly 300 to other structures and one or more buffer layers to prevent pressure-sealing membrane 310 from becoming contaminated or mechanically damaged through contact with other materials.

Membrane assembly 300 is preferably manufactured using conventional silicon-on-insulator (SOI) and silicon-nitride-on-insulator (SNOI) technology by a suitable semiconductor manufacturer, such as, for example, Norcada Inc., of Edmonton, Canada.

Figure 4A:
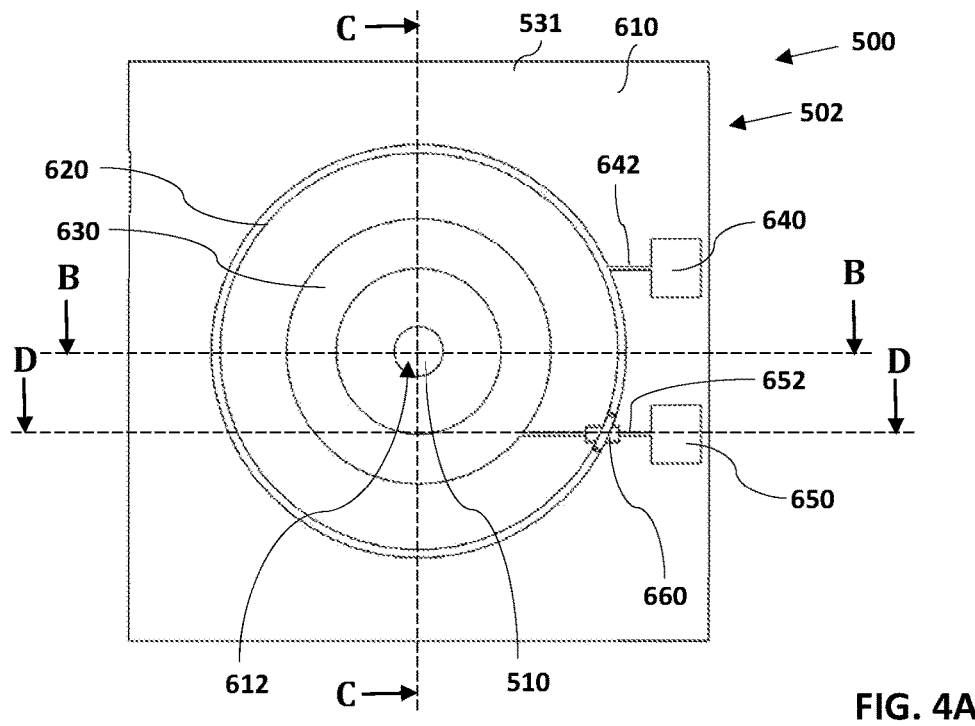
FIG. 4A is a simplified bottom planar-view illustration of an additional embodiment of a membrane assembly including an electron-detecting subassembly, having an alternative configuration of a holding frame, a pressure-sealing membrane and a supporting membrane layer.
Figure 4B:
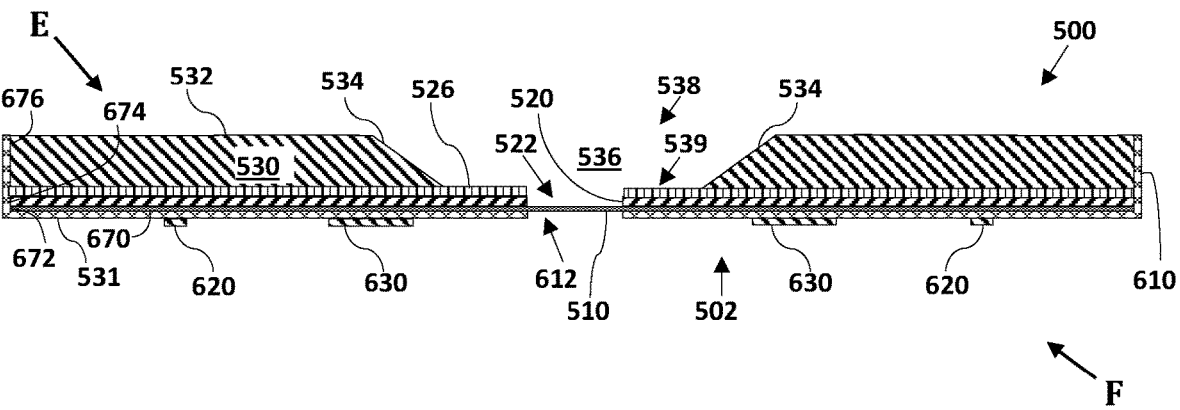
FIG. 4B is a simplified sectional illustration of the membrane assembly of FIG. 4A, taken along line B-B in FIG. 4A.
Figure 4C:
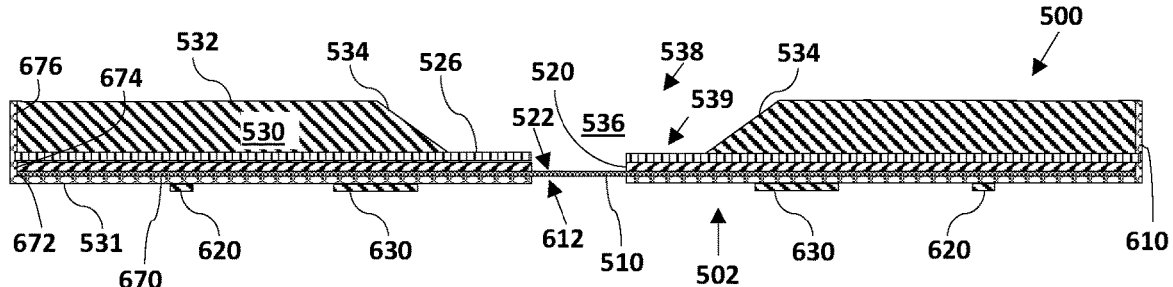
FIG. 4C is a simplified sectional illustration of the membrane assembly of FIG. 4A and FIG. 4B, taken along line C-C in FIG. 4A.
Figure 4D:
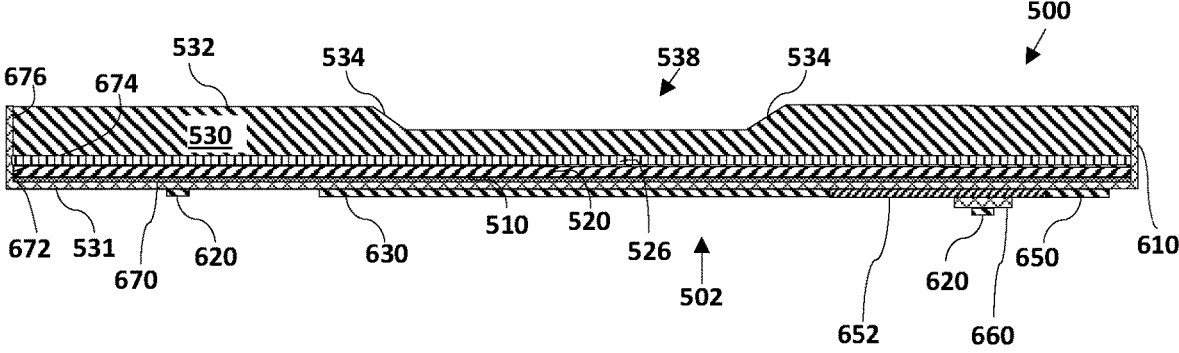
FIG. 4D is a simplified sectional illustration of the membrane assembly of FIGS. 4A-4C, taken along line D-D in FIG. 4A.
Figure 4E:
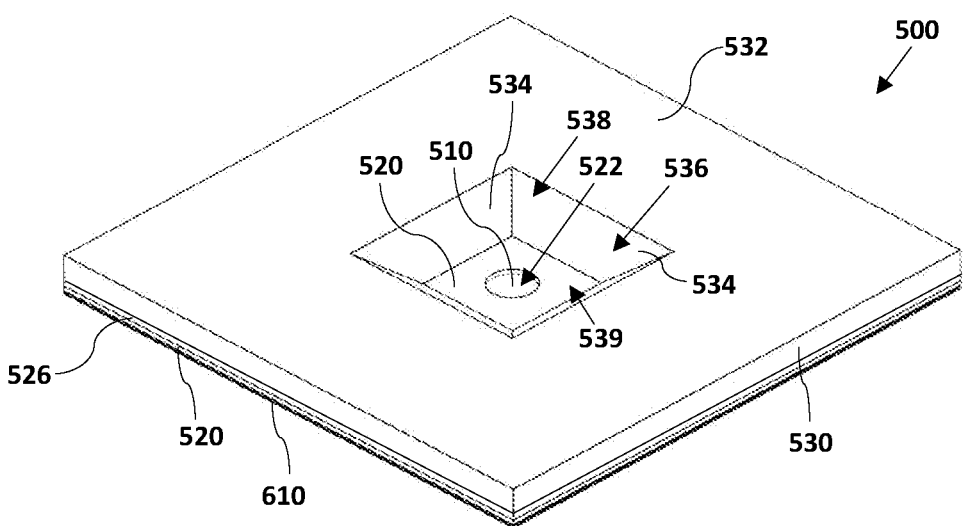
FIG. 4E is a simplified pictorial illustration of the membrane assembly of FIGS. 4A-4D, from a perspective illustrated by arrow E in FIG. 4B.
Figure 4F:
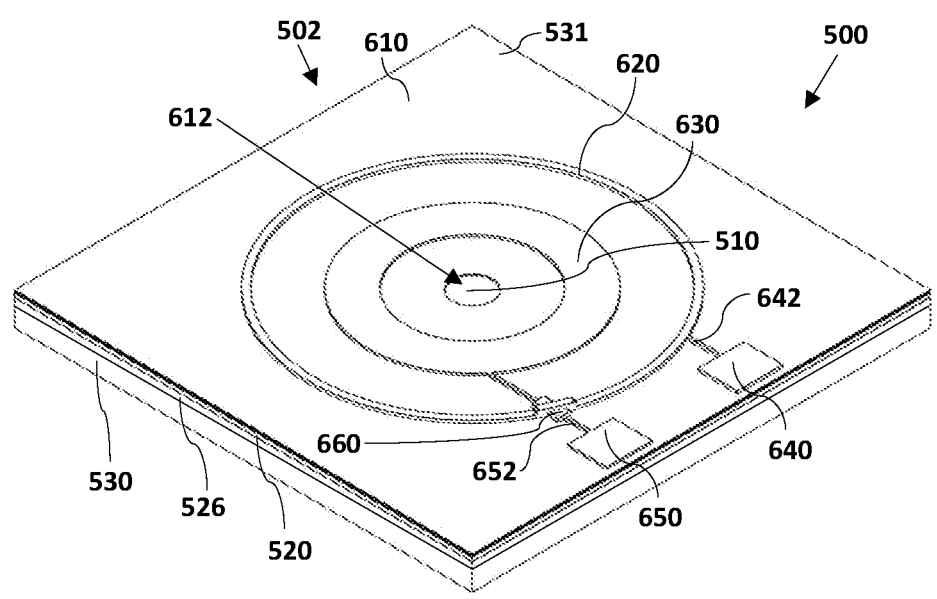
FIG. 4F is a simplified pictorial illustration of the membrane assembly of FIGS. 4A-4E, from a perspective illustrated by arrow F in FIG. 4B.

Reference is now made to FIGS. 4A-4F. FIG. 4A is a simplified bottom planar-view illustration of a membrane assembly 500, which is an additional embodiment of a membrane assembly including an electron-detecting subassembly 502 for detecting electrons, having an alternative configuration of a holding frame, a pressure-scaling membrane and a supporting membrane layer. FIG. 4B is a simplified sectional illustration of membrane assembly 500, taken along line B-B in FIG. 4A. FIG. 4C is a simplified sectional illustration of membrane assembly 500, taken along line C-C in FIG. 4A. FIG. 4D is a simplified sectional illustration of membrane assembly 500, taken along line D-D in FIG. 4A. FIG. 4E is a simplified pictorial illustration of membrane assembly 500, from a perspective illustrated by arrow E in FIG. 4B. FIG. 4F is a simplified pictorial illustration of membrane assembly 500, from a perspective illustrated by arrow F in FIG. 4B. In addition to electron-detecting subassembly 502, membrane assembly 500 includes a pressure-sealing membrane 510, a supporting membrane layer 520 formed with a cornerless aperture 522, an etch-stopping layer 526 resultant from manufacture and a holding frame 530.

As seen particularly well in FIG. 4B, membrane assembly 500 is preferably configured such that supporting membrane layer 520 is supported between and bonded to pressure-sealing membrane 510 and etch-stopping layer 526, and etch-stopping layer 526 is bonded to holding frame 520. While membrane assembly 500 is commonly manufactured in an inverse orientation to the orientation shown in FIGS. 4B-4E, an operative orientation of membrane assembly 500 is as shown in FIGS. 4B-4E. In accordance with the operative orientation thereof, a "bottom" of membrane assembly 500 herein refers to a largest external surface 531 of electron-detecting subassembly 502 and a "top" of membrane assembly 500 herein refers to a horizontal top-surface 532 of holding frame 530.

Holding frame 530 allows a user to more readily maneuver membrane assembly 500. Holding frame 530 preferably includes horizontal top-surface 532 and a plurality of internal walls 534. Internal walls 534 preferably define a truncated pyramidal recess 536. Together with holding frame 530, truncated pyramidal recess 536 defines an aperture 538 and an aperture 539. In the embodiment of the present invention shown in FIGS. 4A-4F, apertures 538 and 539 are coaxial. In an alternative embodiment of the present invention, apertures 538 and 539 are not coaxial. In the embodiment of the present invention shown in FIGS. 4A-4F, aperture 538 is larger than aperture 539. In an alternative embodiment of the present invention, aperture 538 is not larger than aperture 539. In the embodiment of the present invention shown in FIGS. 4A-4F, apertures 538 and 539 are generally square in shape. In an alternative embodiment of the present invention, apertures 538 and 539 may be formed in any suitable shapes, such as, inter alia, circles, rounded squares or rectangles. Preferably, apertures 538 and 539 are symmetrical shapes.

In the embodiment of the present invention shown in FIGS. 4A-4F, recess 536 is a truncated pyramidal recess. In an alternative embodiment of the present invention, recess 536 may be formed in any suitable shape, such as, inter alia, a prismatic, cylindrical or truncated conical shape. In the embodiment of the present invention shown in FIGS. 4A-4F, holding frame 530 is generally square in shape. In an alternative embodiment of the present invention, holding frame 530 may be formed in any suitable shape, such as, inter alia, a circle, a rounded square or a rectangle. Preferably, holding frame 530 has a thickness between 50,000 nanometers and 1,000,000 nanometers.

Supporting membrane layer 520 provides mechanical support for pressure-sealing membrane 510. Supporting membrane layer 520 is preferably less than 25,000 nanometers thick. More preferably, supporting membrane layer 520 is less than 10,000 nanometers thick. Most preferably, supporting membrane layer 520 is less than 5,000 nanoters thick. Preferably, supporting membrane layer 520 and etch-stopping layer 526 are substantially transparent to X-rays. Supporting membrane layer 520 may be formed of any suitable material, such as, inter alia, silicon, glass or sapphire.

Supporting membrane layer 520 is formed with cornerless aperture 522 for electrons to pass through. Preferably, cornerless aperture 522 in supporting membrane layer 520 is formed in a circular shape. Alternatively, cornerless aperture 522 may be formed in any suitable cornerless shape, such as, inter alia, an ellipse, an oval or a rounded square. Preferably, cornerless aperture 522 has a longest chord of at least 100,000 nanometers. More preferably, cornerless aperture 522 has a longest chord of at least 200,000 nanometers. Most preferably, cornerless aperture 522 has a longest chord of at least 250,000 nanometers. The lack of corners in cornerless aperture 522 improves a mechanical strength of membrane assembly 500 and allows for a longer longest chord of cornerless aperture 522 and without membrane assembly 500 fracturing, relative to a membrane assembly formed with a pressure-sealing membrane having an aperture that is not cornerless.

Pressure-sealing membrane 510 is preferably less than 100 nanometers thick. More preferably, pressure-sealing membrane 510 is less than 50 nanometers thick. Most preferably, pressure-sealing membrane 510 is less than 20 nanometers thick. Pressure-sealing membrane 510 is bonded to supporting membrane layer 520 such that pressure-sealing membrane 510 overlies and atmospherically seals cornerless aperture 522.

It is a particular feature of the present invention that if recess 536 is situated in a first-pressure gaseous environment and electron-detecting subassembly 502 is situated in a second-pressure gaseous environment, there exists a pressure differential between the first-pressure and second-pressure environments, across pressure-sealing membrane 510. Preferably, there exists a pressure differential of approximately 100,000 pascals across pressure-sealing membrane 510. More preferably, there exists a pressure differential of approximately 150,000 pascals across pressure-sealing membrane 510. Most preferably, there exists a pressure differential of approximately 200,000 pascals across pressure-sealing membrane 510. Preferably, pressure-sealing membrane 510 is substantially transparent to X-rays and electrons. Pressure-sealing membrane 510 may be formed of any suitable material, such as, inter alia, silicon, carbon or silicon nitride.

Aperture 539 is formed having a larger area than cornerless aperture 522. Preferably aperture 539 completely overlies cornerless aperture 522. In one embodiment of the present invention, cornerless aperture 522 and aperture 539 share a common center, as shown in in FIGS. 4A-4F. In an alternative embodiment of the present invention, cornerless aperture 522 and aperture 539 do not share a common center.

Preferably, electron-detecting subassembly 502 is electrically insulated from other portions of membrane assembly 500 by a dielectric layer 610, which is formed with a cornerless aperture 612. Electron-detecting subassembly 502 includes an outer metal line 620, an inner metal line 630, an outer metal line pad 640, a connecting metal line 642, an inner metal line pad 650, a connecting metal line 652 and a separator 660, as described in more detail hereinbelow.

Dielectric layer 610 is bonded to a largest-area exposed surface 670 of pressure-scaling membrane 510. Preferably, dielectric layer 610 is also bonded to a smallest-area exposed surface 672 of pressure-sealing membrane 510, a smallest-area exposed surface 674 of supporting membrane layer 520 and a smallest-area exposed surface 676 of holding frame 530, such that dielectric layer 610 overlies at least part of smallest-area external exposed surface 676 of holding frame 530. In the embodiment of the present invention shown in FIGS. 4A-4F, dielectric layer 610 overlies all of smallest-area external exposed surface 676 of holding frame 530. In an alternative embodiment of the present invention, dielectric layer 610 may overlie any suitable portion of smallest-area external exposed surface 676 of holding frame 530.

Preferably, cornerless aperture 612 of dielectric layer 610 has a similar shape and similar longest chord to cornerless aperture 522. Preferably, cornerless aperture 612 directly overlies cornerless aperture 522. Preferably, dielectric layer 610 has any suitable thickness such that dielectric layer 610 is substantially transparent to X-rays while providing suitable electrical insulation between electron-detecting subassembly 502 and other portions of membrane assembly 500. More preferably, dielectric layer 610 has a thickness of less than 2,000 nanometers. Preferably, dielectric layer 610 is formed of silicon dioxide or silicon nitride.

Preferably, outer metal line 620, inner metal line 630, outer metal line pad 640, inner metal line pad 650, connecting metal line 642 and connecting metal line 652 are formed of gold. Outer metal line 620 and inner metal line 630 are formed in nested closed shapes. Preferably, the nested closed shapes are concentric and centered about a center of cornerless aperture 522. Preferably, the nested closed shapes are rings. In the embodiment of the present invention shown in FIGS. 4A-4F, metal lines 620 and 630 are concentric rings centered about the center of cornerless aperture 522. In an alternative embodiment of the present invention, metal lines 620 and 630 may define any suitable nested closed shapes, such as, inter alia, squares, rounded squares or ovals, and need not be centered about the center of cornerless aperture 522. Inner metal line 630 does not overlie holding frame aperture 539. Inner metal line 630 and outer metal line 620 may have any suitable line widths and spacing, such as, inter alia, the line widths and spacing shown in FIGS. 4A-4F. The term "line width" herein refers to respective measurements characterizing each of inter metal line 630 and outer metal line 620, the measurement being measured in a dimension generally parallel to a plane in which a majority of dielectric layer 610 lies.

In the embodiment of the present invention shown in FIGS. 4A-4F, membrane assembly 500 includes two metal lines forming nested closed shapes, namely outer metal line 620 and inner metal line 630. In an alternative embodiment of the present invention, membrane assembly 500 includes any number of metal lines forming nested closed shapes. In a further alternative embodiment of the present invention, membrane assembly 500 includes one metal line forming a nested closed shape.

Outer metal line 620 is electrically connected to outer metal line pad 640. In the embodiment of the present invention shown in FIGS. 4A-4F, connecting metal line 642 electrically connects outer metal line 620 to outer metal line pad 640. In an alternative embodiment of the present invention, connecting metal line 642 is obviated, and an alternative electrical connector (not shown) electrically connects outer metal line 620 to outer metal line pad 640.

Inner metal line 630 is electrically connected to inner metal line pad 650. In the embodiment of the present invention shown in FIGS. 4A-4F, connecting metal line 652 electrically connects inner metal line 630 to inner metal line pad 650. In an alternative embodiment of the present invention, connecting metal line 652 is obviated, and an alternative electrical connector (not shown) electrically connected inner metal line 630 to inner metal line pad 650.

Preferably, outer metal line pad 640 and inner metal line pad 650 are in electrical communication with a printed circuit board (not shown). In the embodiment of the present invention shown in FIGS. 4A-4F, outer metal line pad 640 and inner metal line pad 650 are both generally rectangular in shape. In an alternative embodiment of the present invention, outer metal line pad 640 and inner metal line pad 650 may individually be formed in any suitable shapes, such as, inter alia, rounded squares, rounded rectangles or trapeziums.

In the embodiment of the present invention shown in FIGS. 4A-4F, both of outer metal line pad 640 and inner metal line pad 650 are closest to a single edge of membrane assembly 500. In an alternative embodiment of the present invention, each of outer metal line pad 640 and inner metal line pad 650 are closest to a different edge of membrane assembly 500 from one another. In yet an alternative embodiment of the present invention, each of outer metal line pad 640 and inner metal line pad 650 are situated at positions on dielectric layer 610, different from those shown in FIGS. 4A-4F.

Preferably, outer metal line 620, inner metal line 630, connecting metal line 642 and connecting metal line 652 all have respective thicknesses of less than 2,000 nanometers. More preferably, outer metal line 620, inner metal line 630, connecting metal line 642 and connecting metal line 652 all have respective thicknesses of less than 500 nanometers. Most preferably, outer metal line 620, inner metal line 630, connecting metal line 642 and connecting metal line 652 all have respective thicknesses of less than 100 nanometers. Preferably, outer metal line pad 640 and inner metal line pad 650 each have thicknesses of less than 1,000 nanometers and more than 200 nanometers. More preferably, outer metal line pad 640 and inner metal line pad 650 each have thicknesses of less than 1,000 nanometers and more than 300 nanometers. Most preferably, outer metal line pad 640 and inner metal line pad 650 each have thicknesses of less than 500 nanometers and more than 300 nanometers. The term "thickness" herein refers to a dimension perpendicular to a plane in which a majority of dielectric layer 610 lies.

In one embodiment of the present invention, outer metal line 620, inner metal line 630, outer metal line pad 640, inner metal line pad 650, connecting metal line 642 and connecting metal line 652 are bonded to dielectric layer 610 using thin film metal deposition. In an alternative embodiment of the present invention, outer metal line 620, inner metal line 630, outer metal line pad 640, inner metal line pad 650, connecting metal line 642 and connecting metal line 652 are affixed to dielectric layer 610 using an alternative bonding process.

During an operation of membrane assembly 500, either a positive or negative potential may be individually applied to outer metal line 620 and inner metal line 630. If an overall positive potential is applied to a metal line, then the metal line absorbs lower-energy electrons. If an overall negative potential is applied to a metal line, then the metal line absorbs more positively charged particles. In a preferred mode of operation of membrane assembly 500, a positive potential is applied to both outer metal line 620 and inner metal line 630, thereby maximizing an absorption of low-energy electrons primarily by inner metal line 630.

In a preferred use of membrane assembly 500, inner metal line 630 preferably absorbs low-energy electrons for detection, and outer metal line 620 improves a signal to noise ratio of electron-detecting subassembly 502. Preferably, those components of membrane assembly 500 designated for detecting electrons are not in electrical contact with those components of membrane assembly 500 designated for absorbing electromagnetic noise. Thus, in the embodiment shown in FIGS. 4A-4F, none of inner metal line 630, inner metal line pad 650 or connecting metal line 652 are in electrical contact with any of outer metal line 620, outer metal line pad 640 or connecting metal line 642.

If any of inner metal line 630, inner metal line pad 650 or connecting metal line 652 overlies any of outer metal line 620, outer metal line pad 640 or connecting metal line 642, the overlying components are preferably separated with a separator formed of a suitable electrically insulating material. For example, in FIGS. 4A-4F, and as seen particularly well in FIGS. 4D and 4F, where outer metal line 620 overlies connecting metal line 652, separator 660 is situated between outer metal line 620 and connecting metal line 652 and prevents electrical contact between outer metal line 620 and connecting metal line 652.

Membrane assembly 500 may have additional layers including but not limited to: one or more additional etch-stopping layers useful for a manufacturing process, one or more stress-compensation layers, one or more additional layers of electrical insulation, one or more adhesive layers for an attachment of membrane assembly 500 to other structures and one or more buffer layers to prevent pressure-sealing membrane 510 from becoming contaminated or mechanically damaged through contact with other materials.

Membrane assembly 500 is preferably manufactured using conventional silicon-on-insulator (SOI) and silicon-nitride-on-insulator (SNOI) technology by a suitable semiconductor manufacturer, such as, for example, Norcada Inc., of Edmonton, Canada.

Figure 5A:
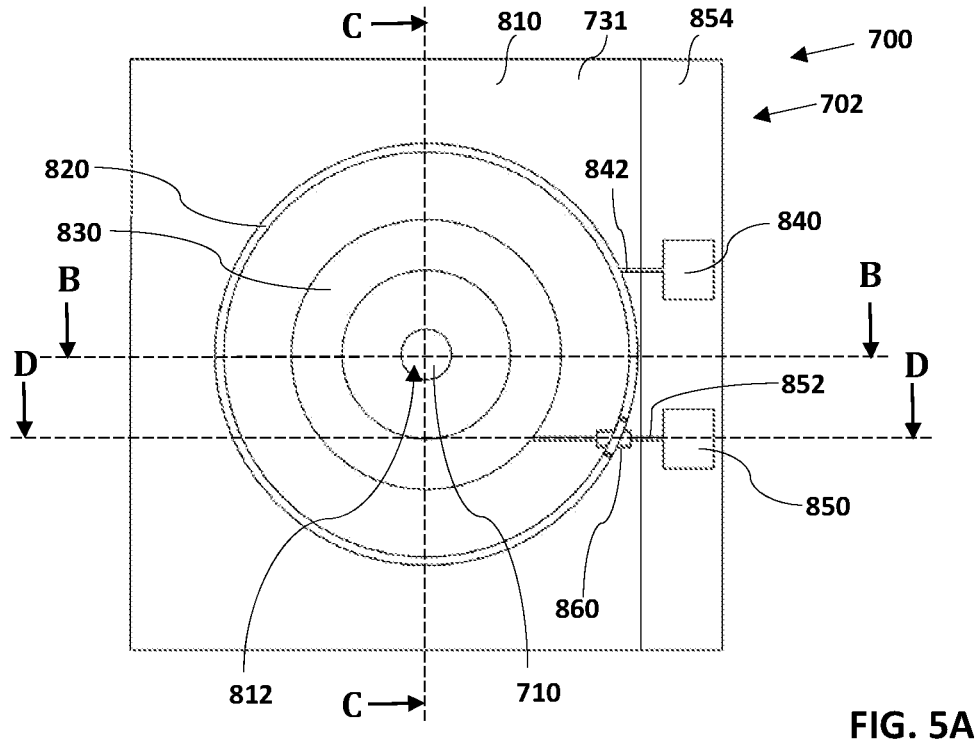
FIG. 5A is a simplified bottom planar-view illustration of a membrane assembly similar to the membrane assembly of FIGS. 3A-3F.
Figure 5B:
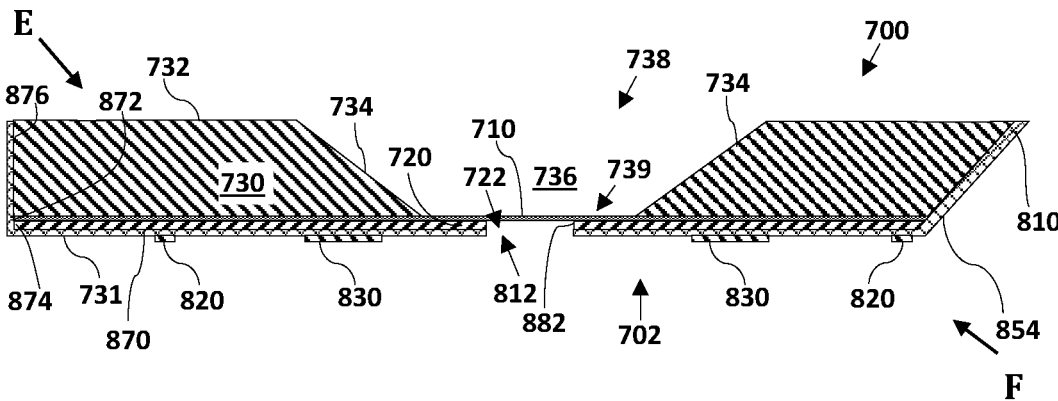
FIG. 5B is a simplified sectional illustration of the membrane assembly of FIG. 5A, taken along line B-B in FIG. 5A.
Figure 5C:
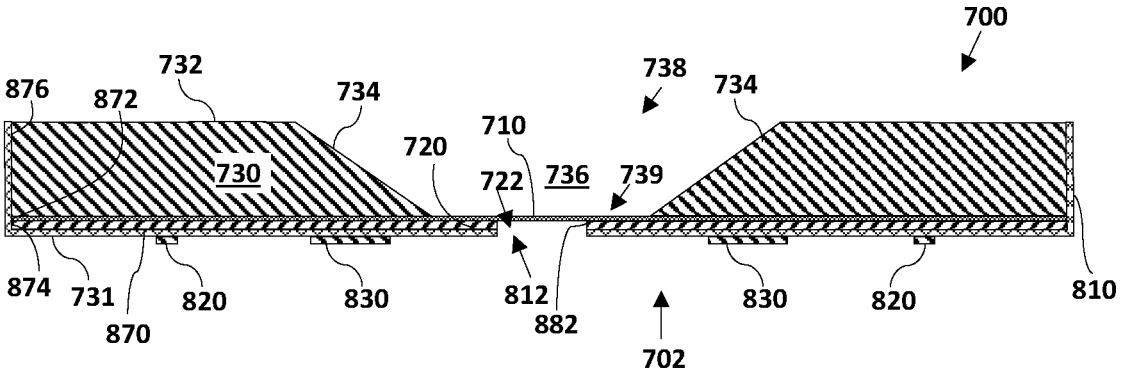
FIG. 5C is a simplified sectional illustration of the membrane assembly of FIGS. 5A and 5B, taken along line C-C in FIG. 5A.
Figure 5D:
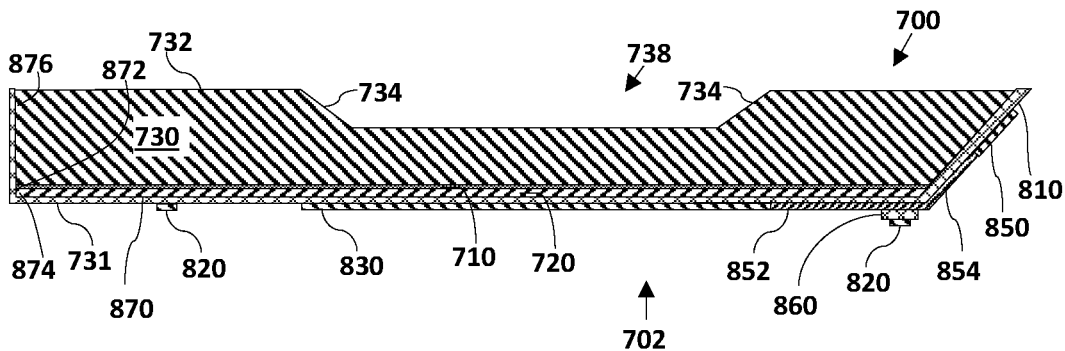
FIG. 5D is a simplified sectional illustration of the membrane assembly of FIGS. 5A-5C, taken along line D-D in FIG. 5A.
Figure 5E:
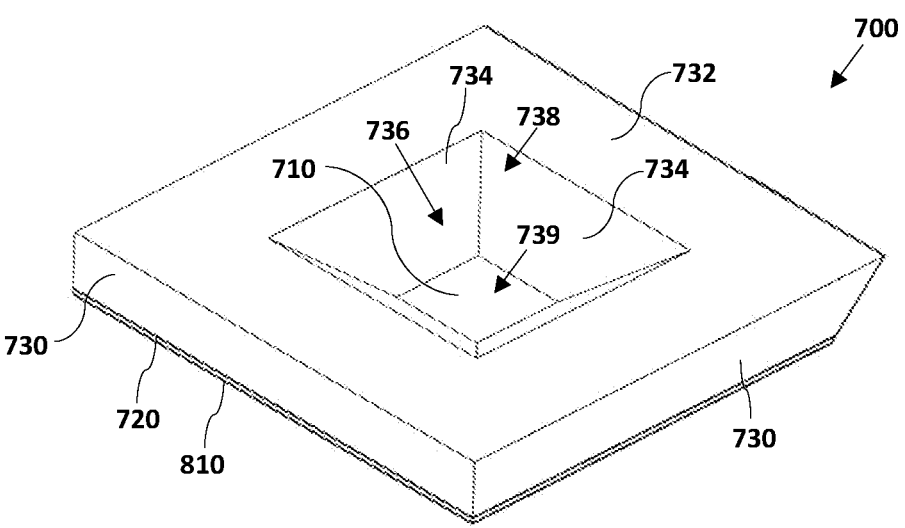
FIG. 5E is a simplified pictorial illustration of the membrane assembly of FIGS. 5A-5D, from a perspective illustrated by arrow E in FIG. 5B.
Figure 5F:
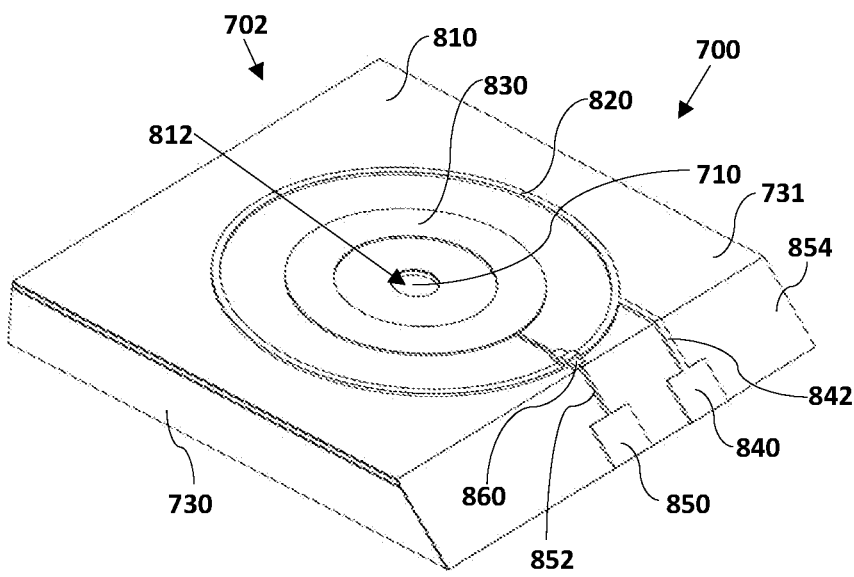
FIG. 5F is a simplified pictorial illustration of the membrane assembly of FIGS. 5A-5E, from a perspective illustrated by arrow F in FIG. 5B.

Reference is now made to FIGS. 5A-5F. FIG. 5A is a simplified bottom planar-view illustration of a membrane assembly 700, which is an alternative embodiment of a membrane assembly similar to the membrane assembly of FIGS. 3A-3F. FIG. 5B is a simplified sectional illustration of membrane assembly 700, taken along line B-B in FIG. 5A. FIG. 5C is a simplified sectional illustration of membrane assembly 700, taken along line C-C in FIG. 5A. FIG. 5D is a simplified sectional illustration of membrane assembly 700, taken along line D-D in FIG. 5A. FIG. 5E is a simplified pictorial illustration of membrane assembly 700, from a perspective illustrated by arrow E in FIG. 5B. FIG. 5F is a simplified pictorial illustration of membrane assembly 700, from a perspective illustrated by arrow F in FIG. 5B. Membrane assembly 700 includes an electron-detecting subassembly 702, a pressure-scaling membrane 710, a supporting membrane layer 720 formed with a cornerless aperture 722 and a holding frame 730.

As seen particularly well in FIG. 5B, membrane assembly 700 is preferably configured such that pressure-scaling membrane 710 is supported between and bonded to supporting membrane layer 720 and holding frame 730. While membrane assembly 700 is commonly manufactured in an inverse orientation to the orientation shown in FIGS. 5B-5E, an operative orientation of membrane assembly 700 is as shown in FIGS. 5B-5E. In accordance with the operative orientation thereof, a "bottom" of membrane assembly 700 herein refers to a largest external surface 731 of electron-detecting subassembly 702 and a "top" of membrane assembly 700 herein refers to a horizontal top-surface 732 of holding frame 730.

Holding frame 730 allows a user to more readily maneuver membrane assembly 700. Holding frame 730 preferably includes horizontal top-surface 732 and a plurality of internal walls 734. Internal walls 734 preferably define a truncated pyramidal recess 736. Together with holding frame 730, truncated pyramidal recess 736 defines an aperture 738 and an aperture 739. In the embodiment of the present invention shown in FIGS. 5A-5F, apertures 738 and 739 are coaxial. In an alternative embodiment of the present invention, apertures 738 and 739 are not coaxial. In the embodiment of the present invention shown in FIGS. 5A-5F, aperture 738 is larger than aperture 739. In an alternative embodiment of the present invention, aperture 738 is not larger than aperture 739. In the embodiment of the present invention shown in FIGS. 5A-5F, apertures 738 and 739 are generally square in shape. In an alternative embodiment of the present invention, apertures 738 and 739 may be formed in any suitable shapes, such as, inter alia, circles, rounded squares or rectangles. Preferably, apertures 738 and 739 are symmetrical shapes.

In the embodiment of the present invention shown in FIGS. 5A-5F, recess 736 is a truncated pyramidal recess. In an alternative embodiment of the present invention, recess 736 may be formed in any suitable shape, such as, inter alia, a prismatic, cylindrical or truncated conical shape. In the embodiment of the present invention shown in FIGS. 5A-5F, holding frame 730 is generally square in shape. In an alternative embodiment of the present invention, holding frame 730 may be formed in any suitable shape, such as, inter alia, a circle, a rounded square or a rectangle. Preferably, holding frame 730 has a thickness between 50,000 nanometers and 1,000,000 nanometers.

Supporting membrane layer 720 provides mechanical support for pressure-scaling membrane 710. Supporting membrane layer 720 is preferably less than 25,000 nanometers thick. More preferably, supporting membrane layer 720 is less than 10,000 nanometers thick. Most preferably, supporting membrane layer 720 is less than 5,000 nanometers thick. Preferably, supporting membrane layer 720 is substantially transparent to X-rays. Supporting membrane layer 720 may be formed of any suitable material, such as, inter alia, silicon, glass or sapphire.

Supporting membrane layer 720 is formed with cornerless aperture 722 for electrons to pass through. Preferably, cornerless aperture 722 in supporting membrane layer 720 is formed in a circular shape. Alternatively, cornerless aperture 722 may be formed in any suitable cornerless shape, such as, inter alia, an ellipse, an oval or a rounded square. Preferably, cornerless aperture 722 has a longest chord of at least 100,000 nanometers. More preferably, cornerless aperture 722 has a longest chord of at least 200,000 nanometers. Most preferably, cornerless aperture 722 has a longest chord of at least 250,000 nanometers. The lack of corners in cornerless aperture 722 improves a mechanical strength of membrane assembly 700 and allows for a longer longest chord of cornerless aperture 722 and without membrane assembly 700 fracturing, relative to a membrane assembly formed with a pressure-sealing membrane having an aperture that is not cornerless.

Pressure-sealing membrane 710 is preferably less than 100 nanometers thick. More preferably, pressure-scaling membrane 710 is less than 50 nanometers thick. Most preferably, pressure-scaling membrane 710 is less than 20 nanometers thick.

It is a particular feature of the present invention that if recess 736 is situated in a first-pressure gaseous environment and electron-detecting subassembly 702 is situated in a second-pressure gaseous environment, there exists a pressure differential between the first-pressure and second-pressure environments, across pressure-sealing membrane 710.

Preferably, there exists a pressure differential of approximately 100,000 pascals across pressure-scaling membrane 710. More preferably, there exists a pressure differential of approximately 150,000 pascals across pressure-scaling membrane 710. Most preferably, there exists a pressure differential of approximately 200,000 pascals across pressure-scaling membrane 710. Preferably, pressure-sealing membrane 710 is substantially transparent to X-rays and electrons. Pressure-sealing membrane 710 may be formed of any suitable material, such as, inter alia, silicon, carbon or silicon nitride.

Aperture 739 is formed having a larger area than cornerless aperture 722. Preferably, aperture 739 completely overlies cornerless aperture 722. In one embodiment of the present invention, cornerless aperture 722 and aperture 739 share a common center, as shown in FIGS. 5A-5F. In an alternative embodiment of the present invention, cornerless aperture 722 and aperture 739 do not share a common center.

Preferably, electron-detecting subassembly 702 is electrically insulated from other portions of membrane assembly 700 by a dielectric layer 810, which is formed with a cornerless aperture 812. Electron-detecting subassembly 702 includes an outer metal line 820, an inner metal line 830, an outer metal line pad 840, a connecting metal line 842, an inner metal line pad 850, a connecting metal line 852 and a separator 860, as described in more detail hereinbelow.

Dielectric layer 810 is bonded to a largest-area exposed surface 870 of supporting membrane layer 720. Preferably, dielectric layer 810 is also bonded to a smallest-area exposed surface 872 of pressure-sealing membrane 710, a smallest-area exposed surface 874 of supporting membrane layer 720 and a smallest-area exposed surface 876 of holding frame 730, such that dielectric layer 810 overlies at least part of smallest-area external exposed surface 876 of holding frame 730. In the embodiment of the present invention shown in FIGS. 5A-5F, dielectric layer 810 overlies all of smallest-area external exposed surface 876 of holding frame 730. In an alternative embodiment of the present invention, dielectric layer 810 may overlie any suitable portion of smallest-area external exposed surface 876 of holding frame 730. In the embodiment of the present invention shown in FIGS. 5A-5F, dielectric layer 810 does not overlie an internal surface 882 of cornerless aperture 722. In an alternative embodiment of the present invention, dielectric layer 810 does overlie internal surface 882 of cornerless aperture 722.

Preferably, cornerless aperture 812 of dielectric layer 710 has a similar shape and similar longest chord to cornerless aperture 722. Preferably, cornerless aperture 812 directly overlies cornerless aperture 722. Preferably, dielectric layer 810 has any suitable thickness such that dielectric layer 810 is substantially transparent to X-rays while providing suitable electrical insulation between electron-detecting subassembly 702 and other portions of membrane assembly 700. More preferably, dielectric layer 810 has a thickness of less than 2,000 nanometers. Preferably, dielectric layer 810 is formed of silicon dioxide or silicon nitride.

Preferably, outer metal line 820, inner metal line 830, outer metal line pad 840, inner metal line pad 850, connecting metal line 842 and connecting metal line 852 are formed of gold. Outer metal line 820 and inner metal line 830 are formed in nested closed shapes. Preferably, the nested closed shapes are concentric and centered about a center of cornerless aperture 722. Preferably, the nested closed shapes are rings. In the embodiment of the present invention shown in FIGS. 5A-5F, metal lines 820 and 830 are concentric rings centered about the center of cornerless aperture 722. In an alternative embodiment of the present invention, metal lines 820 and 830 may define any nested closed shapes and need not be centered about the center of cornerless aperture 722. Inner metal line 830 does not overlie holding frame aperture 739. Inner metal line 830 and outer metal line 820 may have any suitable line widths and spacing, such as, inter alia, the line widths and spacing shown in FIGS. 5A-5F. The term "line width" herein refers to respective measurements characterizing each of inter metal line 830 and outer metal line 820, the measurement being measured in a dimension generally parallel to a plane in which a majority of dielectric layer 810 lies.

In the embodiment of the present invention shown in FIGS. 5A-5F, membrane assembly 700 includes two metal lines forming nested closed shapes, namely outer metal line 820 and inner metal line 830. In an alternative embodiment of the present invention, membrane assembly 700 includes any number of metal lines forming nested closed shapes. In a further alternative embodiment of the present invention, membrane assembly 700 includes one metal line forming a nested closed shape.

Outer metal line 820 is electrically connected to outer metal line pad 840. In the embodiment of the present invention shown in FIGS. 5A-5F, connecting metal line 842 electrically connects outer metal line 820 to outer metal line pad 840. In an alternative embodiment of the present invention, connecting metal line 842 is obviated, and an alternative electrical connector (not shown) electrically connects outer metal line 820 to outer metal line pad 840.

Inner metal line 830 is electrically connected to inner metal line pad 850. In the embodiment of the present invention shown in FIGS. 5A-5F, connecting metal line 852 electrically connects inner metal line 830 to inner metal line pad 850. In an alternative embodiment of the present invention, connecting metal line 852 is obviated, and an alternative electrical connector (not shown), electrically connects inner metal line 830 to inner metal line pad 850.

It is a particular feature of the embodiment of the present invention shown in FIGS. 5A-5F that outer metal line pad 840 and inner metal line pad 850 are located on a beveled surface 854 of membrane assembly 700, in order to reduce a distance between electron-detecting subassembly 702 and a source of electrons being detected. The distance between electron-detecting subassembly 702 and the source of electrons being detected is particularly reduced by at least 150,000 nanometers in the case that either inner metal line pad 850 or outer metal line pad 840 are electrically connected to a printed circuit board using wire bonding.

Preferably, outer metal line pad 840 and inner metal line pad 850 are in electrical communication with a printed circuit board (not shown). In the embodiment of the present invention shown in FIGS. 5A-5F, outer metal line pad 840 and inner metal line pad 850 are generally rectangular in shape. In an alternative embodiment of the present invention, outer metal line pad 840 and inner metal line pad 850 may individually be formed in any suitable shape.

In the embodiment of the invention shown in FIGS. 5A-5F, each of outer metal line pad 840 and inner metal line pad 850 are situated at positions on beveled surface 854, shown in FIGS. 5A-5F. In an alternative embodiment of the present invention, each of outer metal line pad 840 and inner metal line pad 850 are situated at positions on beveled surface 854, different from those shown in FIGS. 5A-5F. In the embodiment of the invention shown in FIGS. 5A-5F, membrane assembly 700 includes one beveled surface 854. In an alternative embodiment of the present invention, membrane assembly 700 may include a plurality of beveled surfaces. In the embodiment of the invention shown in FIGS. 5A-5F, each of outer metal line pad 840 and inner metal line pad 850 are situated on the same beveled surface 854. In an alternative embodiment of the present invention, outer metal line pad 840 and inner metal line pad 850 are situated on different beveled surfaces.

Preferably, outer metal line 820, inner metal line 830, connecting metal line 842 and connecting metal line 852 all have respective thicknesses of less than 2,000 nanometers. More preferably, outer metal line 820, inner metal line 830, connecting metal line 842 and connecting metal line 852 all have respective thicknesses of less than 500 nanometers. Most preferably, outer metal line 820, inner metal line 830, connecting metal line 842 and connecting metal line 852 all have respective thicknesses of less than 100 nanometers. Preferably, outer metal line pad 840 and inner metal line pad 850 each have thicknesses of less than 1,000 nanometers and more than 200 nanometers. More preferably, outer metal line pad 840 and inner metal line pad 850 each have thicknesses of less than 1,000 nanometers and more than 300 nanometers. Most preferably, outer metal line pad 840 and inner metal line pad 850 each have thicknesses of less than 500 nanometers and more than 300 nanometers. The term "thickness" herein refers to a dimension perpendicular to a plane in which a majority of dielectric layer 810 lies.

In one embodiment of the present invention, outer metal line 820, inner metal line 830, outer metal line pad 840, inner metal line pad 850, connecting metal line 842 and connecting metal line 852 are bonded to dielectric layer 810 using thin film metal deposition. In an alternative embodiment of the present invention, outer metal line 820, inner metal line 830, outer metal line pad 840, inner metal line pad 850, connecting metal line 842 and connecting metal line 852 are affixed to dielectric layer 810 using an alternative bonding process.

During an operation of membrane assembly 700, either a positive or negative potential may be individually applied to outer metal line 820 and inner metal line 830. If an overall positive potential is applied to a metal line, then the metal line absorbs lower-energy electrons. If an overall negative potential is applied to a metal line, then the metal line absorbs more positively charged particles. In a preferred mode of operation of membrane assembly 700, a positive potential is applied to both outer metal line 820 and inner metal line 830, thereby maximizing an absorption of low-energy electrons primarily by inner metal line 830.

In a preferred use of membrane assembly 700, inner metal line 830 preferably absorbs low-energy electrons for detection, and outer metal line 820 improves a signal to noise ratio of electron-detecting subassembly 702. Preferably, those components of membrane assembly 700 designated for detecting electrons are not in electrical contact with those components of membrane assembly 700 designated for absorbing electromagnetic noise. Thus, in the embodiment shown in FIGS. 5A-5F, none of inner metal line 830, inner metal line pad 850 or connecting metal line 852 are in electrical contact with any of outer metal line 820, outer metal line pad 840 or connecting metal line 842.

If any of inner metal line 830, inner metal line pad 850 or connecting metal line 852 overlies any of outer metal line 820, outer metal line pad 840 or connecting metal line 842, the overlying components are preferably separated with a separator formed of a suitable electrically insulating material. For example, in FIGS. 5A-5F, and as seen particularly well in FIGS. 5D and 5F, where outer metal line 820 overlies connecting metal line 852, separator 860 is situated between outer metal line 820 and connecting metal line 852 and prevents electrical contact between outer metal line 820 and connecting metal line 852.

Membrane assembly 700 may have additional layers including but not limited to: one or more etch-stopping layers useful for a manufacturing process, one or more stress-compensation layers, one or more additional layers of electrical insulation, one or more adhesive layers for an attachment of membrane assembly 700 to other structures and one or more buffer layers to prevent pressure-scaling membrane 710 from becoming contaminated or mechanically damaged through contact with other materials.

Membrane assembly 700 is preferably manufactured using conventional silicon-on-insulator (SOI) and silicon-nitride-on-insulator (SNOI) technology by a suitable semiconductor manufacturer, such as, for example, Norcada Inc., of Edmonton, Canada.

Figure 6A:
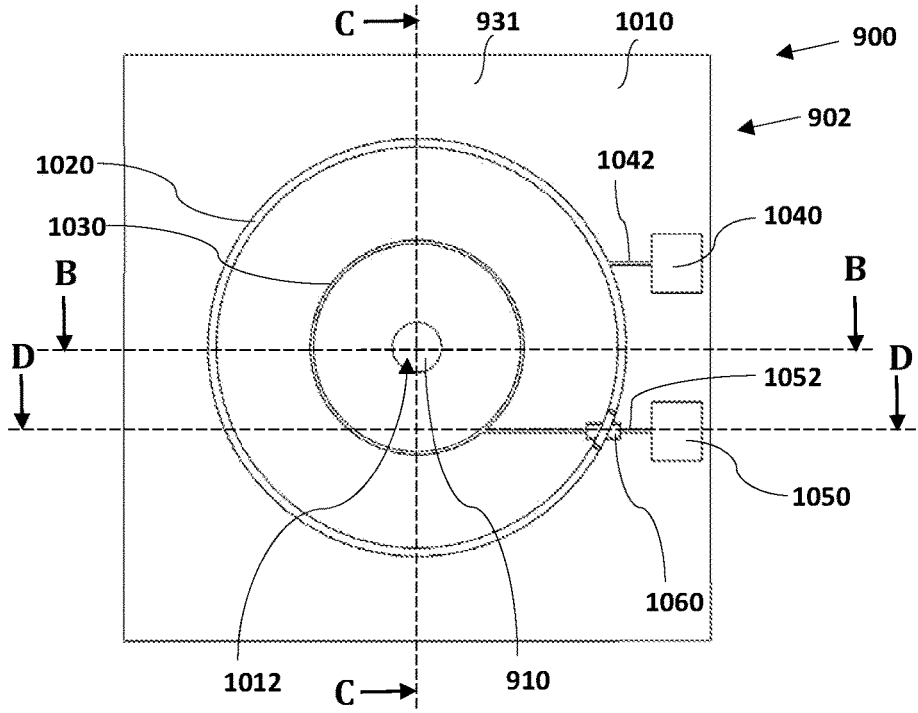
FIG. 6A is a simplified bottom planar-view illustration of another membrane assembly similar to the membrane assembly of FIGS. 3A-3F.
Figure 6B:
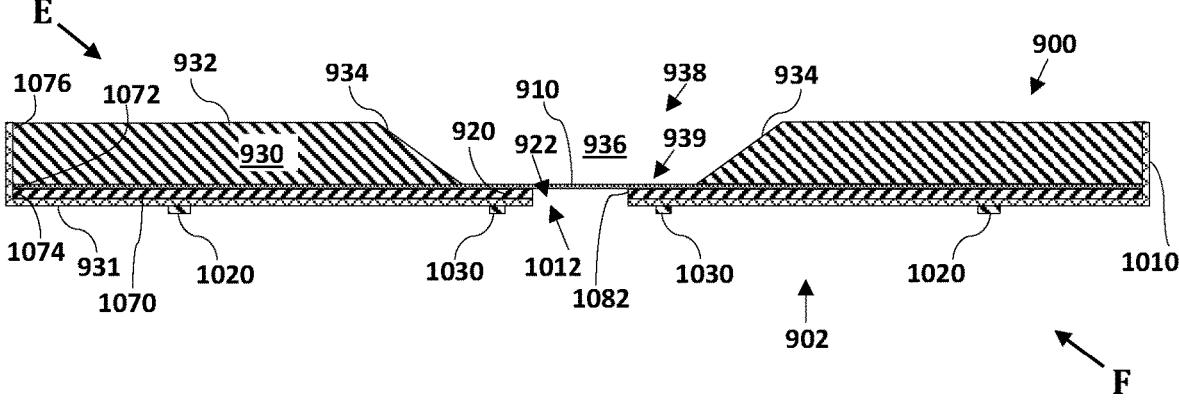
FIG. 6B is a simplified sectional illustration of the membrane assembly of FIG. 6A, taken along line B-B in FIG. 6A.
Figure 6C:
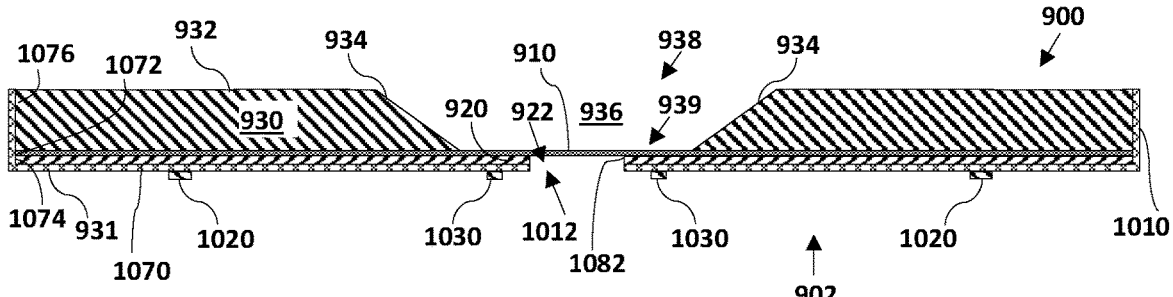
FIG. 6C is a simplified sectional illustration of the membrane assembly of FIGS. 6A and 6B, taken along line C-C in FIG. 6A.
Figure 6D:
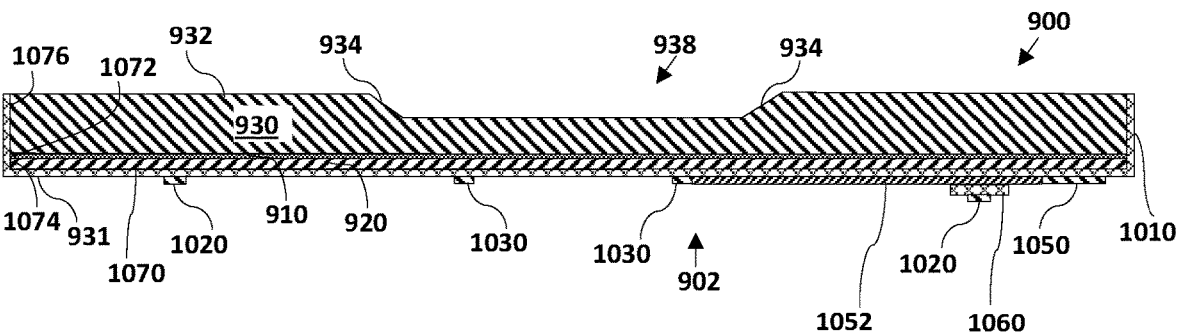
FIG. 6D is a simplified sectional illustration of the membrane assembly of FIGS. 6A-6C, taken along line D-D in FIG. 6A.
Figure 6E:
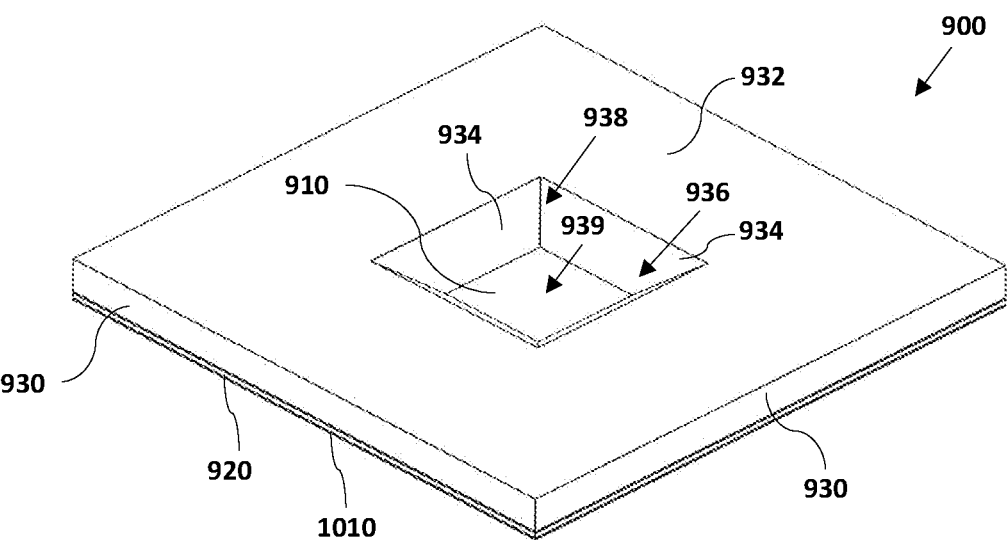
FIG. 6E is a simplified pictorial illustration of the membrane assembly of FIGS. 6A-6D, from a perspective illustrated by arrow E in FIG. 6B.
Figure 6F:
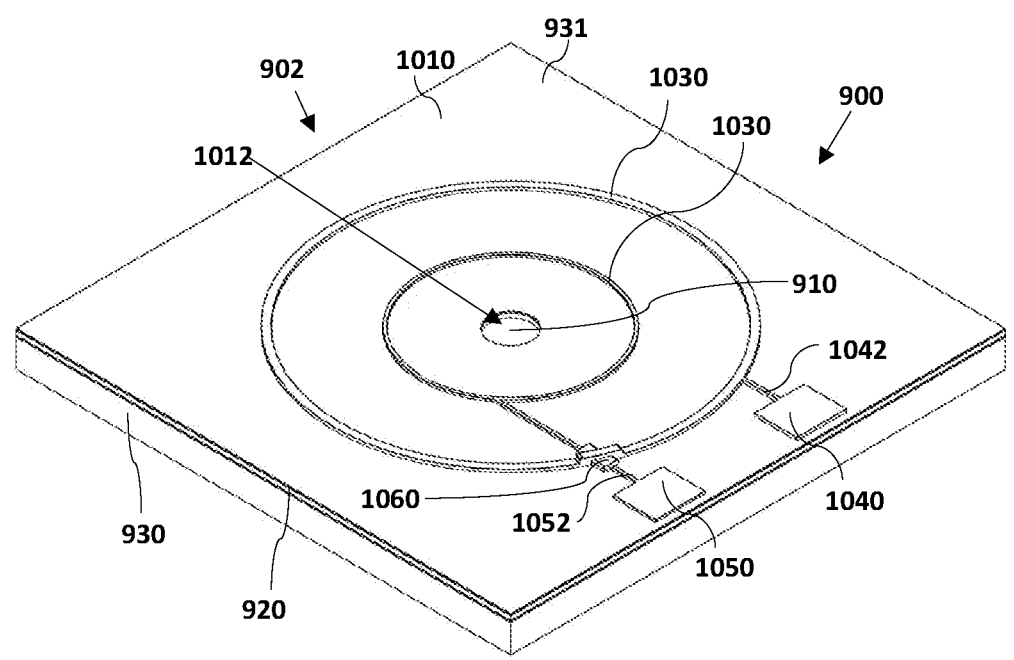
FIG. 6F is a simplified pictorial illustration of the membrane assembly of FIGS. 6A-6E, from a perspective illustrated by arrow F in FIG. 6B.

Reference is now made to FIGS. 6A-6F. FIG. 6A is a simplified bottom planar-view illustration of a membrane assembly 900, which is an alternative embodiment a membrane assembly similar to the membrane assembly of FIGS. 3A-3F. FIG. 6B is a simplified sectional illustration of membrane assembly 900, taken along line B-B in FIG. 6A. FIG. 6C is a simplified sectional illustration of membrane assembly 900, taken along line C-C in FIG. 6A. FIG. 6D is a simplified sectional illustration of membrane assembly 900, taken along line D-D in FIG. 6A. FIG. 6E is a simplified pictorial illustration of membrane assembly 900, from a perspective illustrated by arrow E in FIG. 6B. FIG. 6F is a simplified pictorial illustration of membrane assembly 900, from a perspective illustrated by arrow F in FIG. 6B. Membrane assembly 900 includes an electron-detecting subassembly 902, a pressure-sealing membrane 910, a supporting membrane layer 920 formed with a cornerless aperture 922 and a holding frame 930.

As seen particularly well in FIG. 6B, membrane assembly 900 is preferably configured such that pressure-scaling membrane 910 is supported between and bonded to supporting membrane layer 920 and holding frame 930. While membrane assembly 900 is commonly manufactured in an inverse orientation to the orientation shown in FIGS. 6B-6E, an operative orientation of membrane assembly 900 is as shown in FIGS. 6B-6E. In accordance with the operative orientation thereof, a "bottom" of membrane assembly 900 herein refers to a largest external surface 931 of electron-detecting subassembly 902 and a "top" of membrane assembly 900 herein refers to a horizontal top-surface 932 of holding frame 930.

Holding frame 930 allows a user to more readily maneuver membrane assembly 900. Holding frame 930 preferably includes horizontal top-surface 932 and a plurality of internal walls 934. Internal walls 934 preferably define a truncated pyramidal recess 936. Together with holding frame 930, truncated pyramidal recess 936 defines an aperture 938 and an aperture 939. In the embodiment of the present invention shown in FIGS. 6A-6F, apertures 938 and 939 are coaxial. In an alternative embodiment of the present invention, apertures 938 and 939 are not coaxial. In the embodiment of the present invention shown in FIGS. 6A-6F, aperture 938 is larger than aperture 939. In an alternative embodiment of the present invention, aperture 938 is not larger than aperture 939. In the embodiment of the present invention shown in FIGS. 6A-6F, apertures 938 and 939 are generally square in shape. In an alternative embodiment of the present invention, apertures 938 and 939 may be formed in any suitable shapes. Preferably, apertures 938 and 939 are symmetrical shapes.

In the embodiment of the present invention shown in FIGS. 6A-6F, recess 936 is a truncated pyramidal recess. In an alternative embodiment of the present invention, recess 936 may be formed in any suitable shape, such as, inter alia, a prismatic, cylindrical or truncated conical shape. In the embodiment of the present invention shown in FIGS. 6A-6F, holding frame 930 is generally square in shape. In an alternative embodiment of the present invention, holding frame 930 may be formed in any suitable shape, such as, inter alia, a circle, a rounded square or a rectangle. Preferably, holding frame 930 has a thickness between 50,000 nanometers and 1,000,000 nanometers.

Supporting membrane layer 920 provides mechanical support for pressure-sealing membrane 910. Supporting membrane layer 920 is preferably less than 25,000 nanometers thick. More preferably, supporting membrane layer 920 is less than 10,000 nanometers thick. Most preferably, supporting membrane layer 920 is less than 5,000 nanometers thick. Preferably, supporting membrane layer 920 is substantially transparent to X-rays. Supporting membrane layer 920 may be formed of any suitable material, such as, inter alia, silicon, glass or sapphire.

Supporting membrane layer 920 is formed with cornerless aperture 922 for electrons to pass through. Preferably, cornerless aperture 922 in supporting membrane layer 920 is formed in a circular shape. Alternatively, cornerless aperture 922 may be formed in any suitable cornerless shape, such as, inter alia, an ellipse, an oval or a rounded square. Preferably, cornerless aperture 922 has a longest chord of at least 100,000 nanometers. More preferably, cornerless aperture 922 has a longest chord of at least 200,000 nanometers. Most preferably, cornerless aperture 922 has a longest chord of at least 250,000 nanometers. The lack of corners in cornerless aperture 922 improves a mechanical strength of membrane assembly 900 and allows for a longer longest chord of cornerless aperture 922 and without membrane assembly 900 fracturing, relative to a membrane assembly formed with a pressure-sealing membrane having an aperture that is not cornerless.

Pressure-sealing membrane 910 is preferably less than 100 nanometers thick. More preferably, pressure-sealing membrane 910 is less than 50 nanometers thick. Most preferably, pressure-sealing membrane 910 is less than 20 nanometers thick.

It is a particular feature of the present invention that if recess 936 is situated in a first-pressure gaseous environment and electron-detecting subassembly 902 is situated in a second-pressure gaseous environment, there exists a pressure differential between the first-pressure and second-pressure environments, across pressure-sealing membrane 910. Preferably, there exists a pressure differential of approximately 100,000 pascals across pressure-sealing membrane 910. More preferably, there exists a pressure differential of approximately 150,000 pascals across pressure-sealing membrane 910. Most preferably, there exists a pressure differential of approximately 200,000 pascals across pressure-sealing membrane 910. Preferably, pressure-sealing membrane 910 is substantially transparent to X-rays and electrons. Pressure-sealing membrane 910 may be formed of any suitable material, such as, inter alia, silicon, carbon or silicon nitride.

Aperture 939 is formed having a larger area than cornerless aperture 922. Preferably, aperture 939 completely overlies cornerless aperture 922. In one embodiment of the present invention, cornerless aperture 922 and aperture 939 share a common center, as shown in FIGS. 6A-6F. In an alternative embodiment of the present invention, cornerless aperture 922 and aperture 939 do not share a common center.

Preferably, electron-detecting subassembly 902 is electrically insulated from other portions of membrane assembly 900 by a dielectric layer 1010, which is formed with a cornerless aperture 1012. Electron-detecting subassembly 902 includes an outer metal line 1020, an inner metal line 1030, an outer metal line pad 1040, a connecting metal line 1042, an inner metal line pad 1050, a connecting metal line 1052 and a separator 1060, as described in more detail hereinbelow.

Dielectric layer 1010 is bonded to a largest-area exposed surface 1070 of supporting membrane layer 920. Preferably, dielectric layer 1010 is also bonded to a smallest-area exposed surface 1072 of pressure-sealing membrane 910, a smallest-area exposed surface 1074 of supporting membrane layer 920 and a smallest-area exposed surface 1076 of holding frame 930, such that dielectric layer 1010 overlies at least part of smallest-area external exposed surface 1076 of holding frame 930. In the embodiment of the present invention shown in FIGS. 6A-6F, dielectric layer 1010 overlies all of smallest-area external exposed surface 1076 of holding frame 930. In an alternative embodiment of the present invention, dielectric layer 1010 may overlie any suitable portion of smallest-area external exposed surface 1076 of holding frame 930. In the embodiment of the present invention shown in FIGS. 6A-6F, dielectric layer 1010 does not overlie an internal surface 1082 of cornerless aperture 922. In an alternative embodiment of the present invention, dielectric layer 1010 does overlie internal surface 1082 of cornerless aperture 922.

Preferably, cornerless aperture 1012 of dielectric layer 1010 has a similar shape and similar longest chord to cornerless aperture 922. Preferably, cornerless aperture 1012 directly overlies cornerless aperture 922. Preferably, dielectric layer 1010 has any suitable thickness such that dielectric layer 1010 is substantially transparent to X-rays while providing suitable electrical insulation between electron-detecting subassembly 902 and other portions of membrane assembly 900. More preferably, dielectric layer 1010 has a thickness of less than 2,000 nanometers. Preferably, dielectric layer 1010 is formed of silicon dioxide or silicon nitride.

Preferably, outer metal line 1020, inner metal line 1030, outer metal line pad 1040, inner metal line pad 1050, connecting metal line 1042 and connecting metal line 1052 are formed of gold. Outer metal line 1020 and inner metal line 1030 are formed in nested closed shapes. Preferably, the nested closed shapes are concentric and centered about a center of cornerless aperture 922. Preferably, the nested closed shapes are rings. In the embodiment of the present invention shown in FIGS. 6A-6F, metal lines 1020 and 1030 are concentric rings centered about the center of cornerless aperture 922. In an alternative embodiment of the present invention, metal lines 1020 and 1030 may define any suitable nested closed shapes, such as, inter alia, squares, rounded squares or ovals, and need not be centered about the center of cornerless aperture 922.

Inner metal line 1030 overlies holding frame aperture 939. Inner metal line 1030 overlies no more than 25% of an area defined by aperture 939, such that inner metal line 1030 does not block a significant proportion of X-rays from passing through aperture 939. Inner metal line 1030 and outer metal line 1020 may have any suitable line widths and spacing, such as, inter alia, the line widths and spacing shown in FIGS. 6A-6F. The term "line width" herein refers to respective measurements characterizing each of inter metal line 1030 and outer metal line 1020, the measurement being measured in a dimension generally parallel to a plane in which a majority of dielectric layer 1010 lies.

In the embodiment of the present invention shown in FIGS. 6A-6F, membrane assembly 900 includes two metal lines forming nested closed shapes, namely outer metal line 1020 and inner metal line 1030. In an alternative embodiment of the present invention, membrane assembly 900 includes any number of metal lines forming nested closed shapes. In a further alternative embodiment of the present invention, membrane assembly 900 includes one metal line forming a nested closed shape.

Outer metal line 1020 is electrically connected to outer metal line pad 1040. In the embodiment of the present invention shown in FIGS. 6A-6F, connecting metal line 1042 electrically connects outer metal line 1020 to outer metal line pad 1040. In an alternative embodiment of the present invention, connecting metal line 1042 is obviated, and an alternative electrical connector (not shown) electrically connects outer metal line 1020 to outer metal line pad 1040.

Inner metal line 1030 is electrically connected to inner metal line pad 1050. In the embodiment of the present invention shown in FIGS. 6A-6F, connecting metal line 1052 electrically connects inner metal line 1030 to inner metal line pad 1050. In an alternative embodiment of the present invention, connecting metal line 1052 is obviated, and an alternative electrical connector (not shown) electrically connected inner metal line 1030 to inner metal line pad 1050.

Preferably, outer metal line pad 1040 and inner metal line pad 1050 are in electrical communication with a printed circuit board (not shown). In the embodiment of the present invention shown in FIGS. 6A-6F, outer metal line pad 1040 and inner metal line pad 1050 are generally rectangular in shape. In an alternative embodiment of the present invention, outer metal line pad 1040 and inner metal line pad 1050 may individually be formed in any suitable shapes, such as, inter alia, rounded squares, rounded rectangles or trapeziums.

In the embodiment of the present invention shown in FIGS. 6A-6F, both of outer metal line pad 1040 and inner metal line pad 1050 are closest to a single edge of membrane assembly 900. In an alternative embodiment of the present invention, each of outer metal line pad 1040 and inner metal line pad 1050 are closest to a different edge of membrane assembly 900 from one another. In yet an alternative embodiment of the present invention, each of outer metal line pad 1040 and inner metal line pad 1050 are situated at positions on dielectric layer 1010, different from those shown in FIGS. 6A-6F.

Preferably, outer metal line 1020, inner metal line 1030, connecting metal line 1042 and connecting metal line 1052 all have respective thicknesses of less than 2,000 nanometers. More preferably, outer metal line 1020, inner metal line 1030, connecting metal line 1042 and connecting metal line 1052 all have respective thicknesses of less than 500 nanometers. Most preferably, outer metal line 1020, inner metal line 1030, connecting metal line 1042 and connecting metal line 1052 all have respective thicknesses of less than 100 nanometers. Preferably, outer metal line pad 1040 and inner metal line pad 1050 each have thicknesses of less than 1,000 nanometers and more than 200 nanometers. More preferably, outer metal line pad 1040 and inner metal line pad 1050 each have thicknesses of less than 1,000 nanometers and more than 300 nanometers. Most preferably, outer metal line pad 1040 and inner metal line pad 1050 each have thicknesses of less than 500 nanometers and more than 300 nanometers. The term "thickness" herein refers to a dimension perpendicular to a plane in which a majority of dielectric layer 1010 lies.

In one embodiment of the present invention, outer metal line 1020, inner metal line 1030, outer metal line pad 1040, inner metal line pad 1050, connecting metal line 1042 and connecting metal line 1052 are bonded to dielectric layer 1010 using thin film metal deposition. In an alternative embodiment of the present invention, outer metal line 1020, inner metal line 1030, outer metal line pad 1040, inner metal line pad 1050, connecting metal line 1042 and connecting metal line 1052 are affixed to dielectric layer 1010 using an alternative bonding process.

During an operation of membrane assembly 900, either a positive or negative potential may be individually applied to outer metal line 1020 and inner metal line 1030. If an overall positive potential is applied to a metal line, then the metal line absorbs lower-energy electrons. If an overall negative potential is applied to a metal line, then the metal line absorbs more positively charged particles. In a preferred mode of operation of membrane assembly 900, a positive potential is applied to both outer metal line 1020 and inner metal line 1030, thereby maximizing an absorption of low-energy electrons primarily by inner metal line 1030.

In a preferred use of membrane assembly 900, inner metal line 1030 preferably absorbs low-energy electrons for detection, and outer metal line 1020 improves a signal to noise ratio of electron-detecting subassembly 902. Preferably, those components of membrane assembly 900 designated for detecting electrons are not in electrical contact with those components of membrane assembly 900 designated for absorbing electromagnetic noise. Thus, in the embodiment shown in FIGS. 6A-6F, none of inner metal line 1030, inner metal line pad 1050 or connecting metal line 1052 are in electrical contact with any of outer metal line 1020, outer metal line pad 1040 or connecting metal line 1042.

If any of inner metal line 1030, inner metal line pad 1050 or connecting metal line 1052 overlies any of outer metal line 1020, outer metal line pad 1040 or connecting metal line 1042, the overlying components are preferably separated with a separator formed of a suitable electrically insulating material. For example, in FIGS. 6A-6F, and as seen particularly well in FIGS. 6D and 6F, where outer metal line 1020 overlies connecting metal line 1052, separator 1060 is situated between outer metal line 1020 and connecting metal line 1052 and prevents electrical contact between outer metal line 1020 and connecting metal line 1052.

Membrane assembly 900 may have additional layers including but not limited to: one or more etch-stopping layers useful for a manufacturing process, one or more stress-compensation layers, one or more additional layers of electrical insulation, one or more adhesive layers for an attachment of membrane assembly 900 to other structures and one or more buffer layers to prevent pressure-sealing membrane 910 from becoming contaminated or mechanically damaged through contact with other materials.

Membrane assembly 900 is preferably manufactured using conventional silicon-on-insulator (SOI) and silicon-nitride-on-insulator (SNOI) technology by a suitable semiconductor manufacturer, such as, for example, Norcada Inc., of Edmonton, Canada.

Figure 7A:
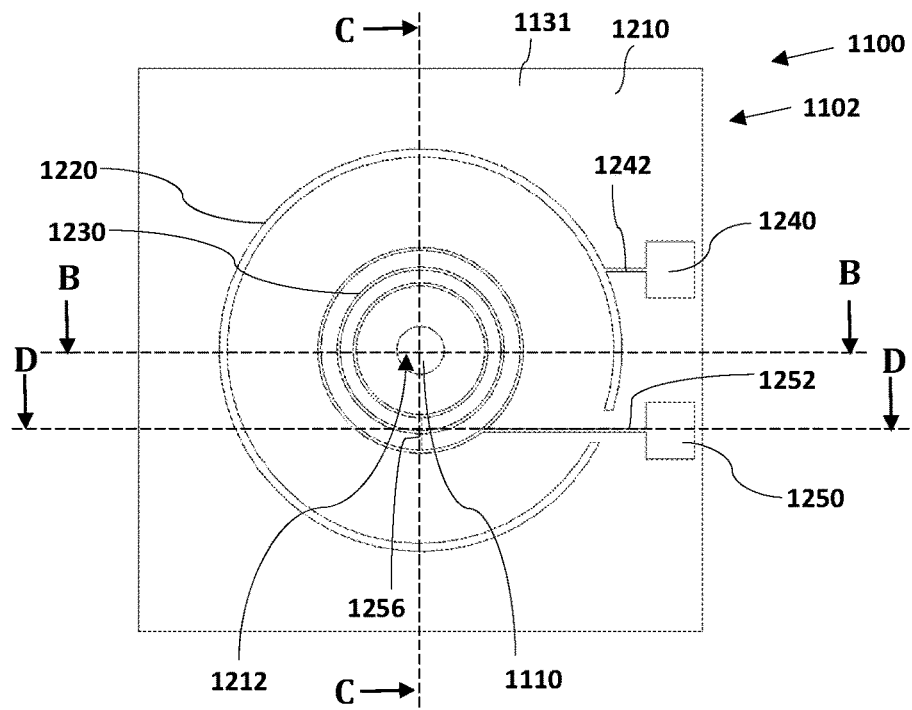
FIG. 7A is a simplified bottom planar-view illustration of yet another membrane assembly similar to the membrane assembly of FIGS. 3A-3F.
Figure 7B:
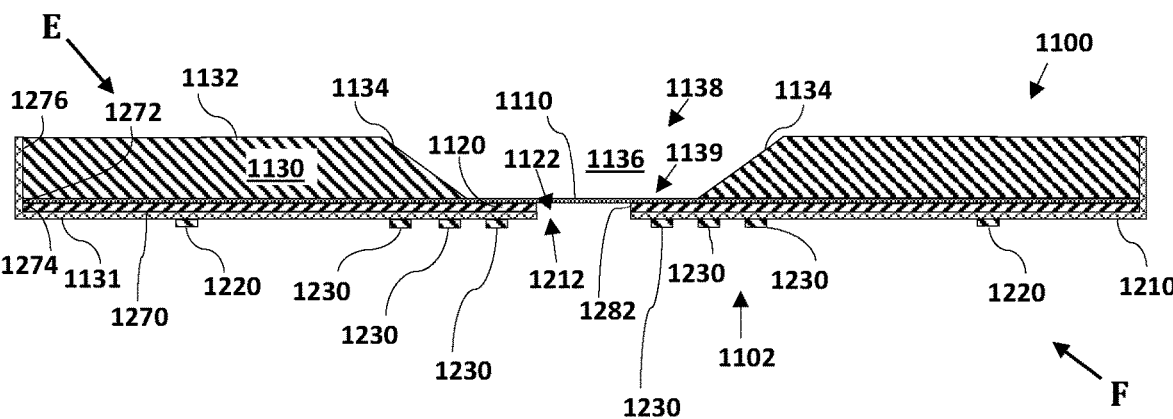
FIG. 7B is a simplified sectional illustration of the membrane assembly of FIG. 7A, taken along line B-B in FIG. 7A.

Reference is now made to FIGS. 7A-7F. FIG. 7A is a simplified bottom planar-view illustration of a membrane assembly 1100, which is an alternative embodiment of a membrane assembly similar to the membrane assembly of FIGS. 3A-3F. FIG. 7B is a simplified sectional illustration of membrane assembly 1100, taken along line B-B in FIG. 7A.

Figure 7C:
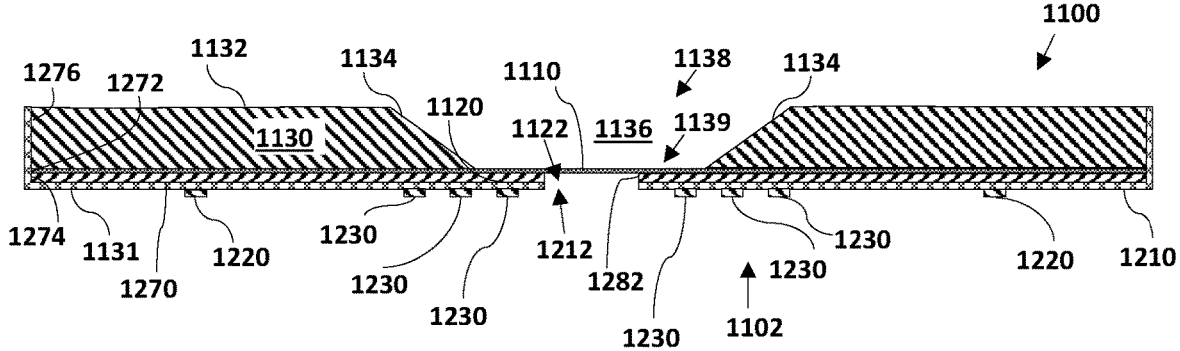
FIG. 7C is a simplified sectional illustration of the membrane assembly of FIGS. 7A and 7B, taken along line C-C in FIG. 7A.
Figure 7D:
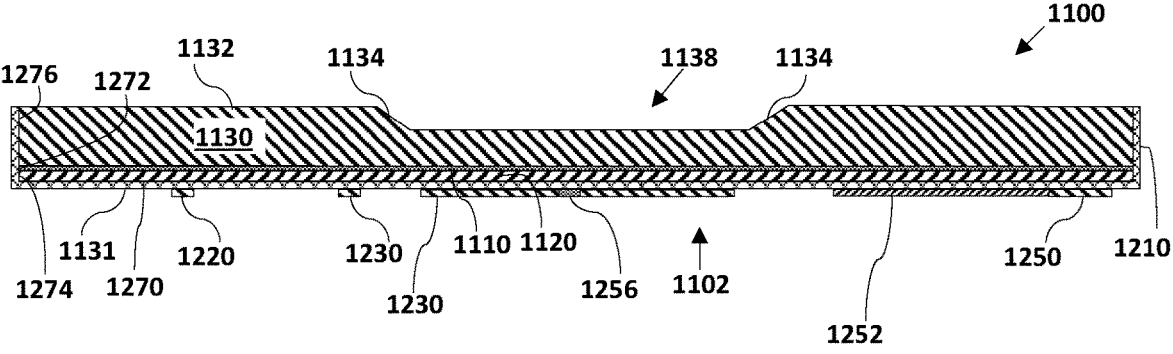
FIG. 7D is a simplified sectional illustration of the membrane assembly of FIGS. 7A-7C, taken along line D-D in FIG. 7A.
Figure 7E:
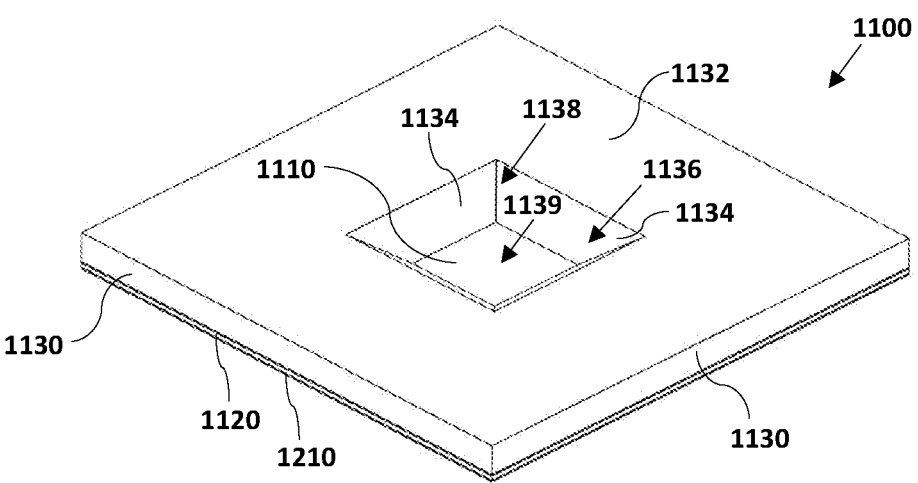
FIG. 7E is a simplified pictorial illustration of the membrane assembly of FIGS. 7A-7D, from a perspective illustrated by arrow E in FIG. 7B.
Figure 7F:
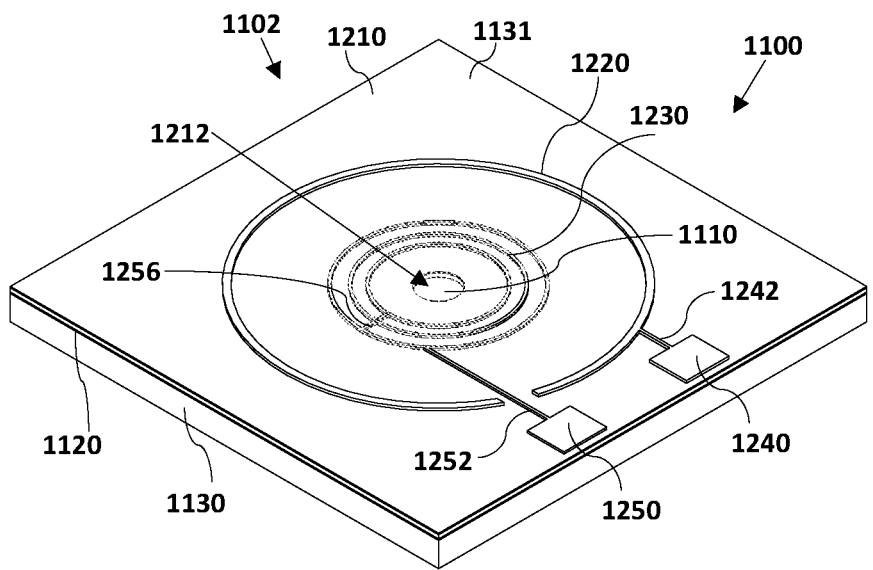
FIG. 7F is a simplified pictorial illustration of the membrane assembly of FIGS. 7A-7E, from a perspective illustrated by arrow F in FIG. 7B.

FIG. 7C is a simplified sectional illustration of membrane assembly 1100, taken along line C-C in FIG. 7A. FIG. 7D is a simplified sectional illustration of membrane assembly 1100, taken along line D-D in FIG. 7A. FIG. 7E is a simplified pictorial illustration of membrane assembly 1100, from a perspective illustrated by arrow E in FIG. 7B. FIG. 7F is a simplified pictorial illustration of membrane assembly 1100, from a perspective illustrated by arrow F in FIG. 7B. Membrane assembly 1100 includes an electron-detecting subassembly 1102, a pressure-sealing membrane 1110, a supporting membrane layer 1120 formed with a cornerless aperture 1122 and a holding frame 1130.

As seen particularly well in FIG. 7B, membrane assembly 1100 is preferably configured such that pressure-scaling membrane 1110 is supported between and bonded to supporting membrane layer 1120 and holding frame 1130. While membrane assembly 1100 is commonly manufactured in an inverse orientation to the orientation shown in FIGS. 7B-7E, an operative orientation of membrane assembly 1100 is as shown in FIGS. 7B-7E. In accordance with the operative orientation thereof, a "bottom" of membrane assembly 1100 herein refers to a largest external surface 1131 of electron-detecting subassembly 1102 and a "top" of membrane assembly 1100 herein refers to a horizontal top-surface 1132 of holding frame 1130.

Holding frame 1130 allows a user to more readily maneuver membrane assembly 1100. Holding frame 1130 preferably includes horizontal top-surface 1132 and a plurality of internal walls 1134. Internal walls 1134 preferably define a truncated pyramidal recess 1136. Together with holding frame 1130, truncated pyramidal recess 1136 defines an aperture 1138 and an aperture 1139. In the embodiment of the present invention shown in FIGS. 7A-7F, apertures 1138 and 1139 are coaxial. In an alternative embodiment of the present invention, apertures 1138 and 1139 are not coaxial. In the embodiment of the present invention shown in FIGS. 7A-7F, aperture 1138 is larger than aperture 1139. In an alternative embodiment of the present invention, aperture 1138 is not larger than aperture 1139. In the embodiment of the present invention shown in FIGS. 7A-7F, apertures 1138 and 1139 are generally square in shape. In an alternative embodiment of the present invention, apertures 1138 and 1139 may be formed in any suitable shapes, such as, inter alia, circles, rounded squares or rectangles. Preferably, apertures 1138 and 1139 are symmetrical shapes.

In the embodiment of the present invention shown in FIGS. 7A-7F, recess 1136 is a truncated pyramidal recess. In an alternative embodiment of the present invention, recess 1136 may be formed in any suitable shape, such as, inter alia, a prismatic, cylindrical or truncated conical shape. In the embodiment of the present invention shown in FIGS. 7A-7F, holding frame 1130 is generally square in shape. In an alternative embodiment of the present invention, holding frame 1130 may be formed in any suitable shape, such as, inter alia, a circle, a rounded square or a rectangle. Preferably, holding frame 1130 has a thickness of between 50,000 nanometers and 1,000,000 nanometers.

Supporting membrane layer 1120 provides mechanical support for pressure-sealing membrane 1110. Supporting membrane layer 1120 is preferably less than 25,000 nanometers thick. More preferably, supporting membrane layer 1120 is less than 10,000 nanometers thick. Most preferably, supporting membrane layer 1120 is less than 5,000 nanometers thick. Preferably, supporting membrane layer 1120 is substantially transparent to X-rays. Supporting membrane layer 1120 may be formed of any suitable material, such as, inter alia, silicon, glass or sapphire.

Supporting membrane layer 1120 is formed with cornerless aperture 1122 for electrons to pass through. Preferably, cornerless aperture 1122 in supporting membrane layer 1120 is formed in a circular shape. Alternatively, cornerless aperture 1122 may be formed in any suitable cornerless shape, such as, inter alia, an ellipse, an oval or a rounded square. Preferably, cornerless aperture 1122 has a longest chord of at least 100,000 nanometers. More preferably, cornerless aperture 1122 has a longest chord of at least 200,000 nanometers. Most preferably, cornerless aperture 1122 has a longest chord of at least 250,000 nanometers. The lack of corners in cornerless aperture 1122 improves a mechanical strength of membrane assembly 1100 and allows for a longer longest chord of cornerless aperture 1122 and without membrane assembly 1100 fracturing, relative to a membrane assembly formed with a pressure-scaling membrane having an aperture that is not cornerless.

Pressure-scaling membrane 1110 is preferably less than 100 nanometers thick. More preferably, pressure-sealing membrane 1110 is less than 50 nanometers thick. Most preferably, pressure-scaling membrane 1110 is less than 20 nanometers thick.

It is a particular feature of the present invention that if recess 1136 is situated in a first-pressure gaseous environment and electron-detecting subassembly 1102 is situated in a second-pressure gaseous environment, there exists a pressure differential between the first-pressure and second-pressure environments, across pressure-sealing membrane 1110. Preferably, there exists a pressure differential of approximately 100,000 pascals across pressure-scaling membrane 1110. More preferably, there exists a pressure differential of approximately 150,000 pascals across pressure-sealing membrane 1110. Most preferably, there exists a pressure differential of approximately 200,000 pascals across pressure-sealing membrane 1110. Preferably, pressure-sealing membrane 1110 is substantially transparent to X-rays and electrons. Pressure-scaling membrane 1110 may be formed of any suitable material, such as, inter alia, silicon, carbon or silicon nitride.

Aperture 1139 is formed having a larger area than cornerless aperture 1122. Preferably, aperture 1139 completely overlies cornerless aperture 1122. In one embodiment of the present invention, cornerless aperture 1122 and aperture 1139 share a common center, as shown in FIGS. 7A-7F. In an alternative embodiment of the present invention, cornerless aperture 1122 and aperture 1139 do not share a common center.

Preferably, electron-detecting subassembly 1102 is electrically insulated from other portions of membrane assembly 1100 by a dielectric layer 1210, which is formed with a cornerless aperture 1212. Electron-detecting subassembly 1102 includes an outer metal line 1220, a group of inner metal lines 1230, an outer metal line pad 1240, a connecting metal line 1242, an inner metal line pad 1250, a connecting metal line 1252 and a connecting metal line 1256, as described in more detail hereinbelow.

Dielectric layer 1210 is bonded to a largest-area exposed surface 1270 of supporting membrane layer 1120. Preferably, dielectric layer 1210 is also bonded to a smallest-area exposed surface 1272 of pressure-sealing membrane 1110, a smallest-area exposed surface 1274 of supporting membrane layer 1120 and a smallest-area exposed surface 1276 of holding frame 1130, such that dielectric layer 1210 overlies at least part of smallest-area external exposed surface 1276 of holding frame 1130. In the embodiment of the present invention shown in FIGS. 7A-7F, dielectric layer 1210 overlies all of smallest-area external exposed surface 1276 of holding frame 1130. In an alternative embodiment of the present invention, dielectric layer 1210 may overlie any suitable portion of smallest-area external exposed surface 1276 of holding frame 1130. In the embodiment of the present invention shown in FIGS. 7A-7F, dielectric layer 1210 does not overlie an internal surface 1282 of cornerless aperture 1122. In an alternative embodiment of the present invention, dielectric layer 1210 does overlie internal surface 1282 of cornerless aperture 1122.

Preferably, cornerless aperture 1212 of dielectric layer 1210 has a similar shape and similar longest chord to cornerless aperture 1122. Preferably, cornerless aperture 1212 directly overlies cornerless aperture 1122. Preferably, dielectric layer 1210 has any suitable thickness such that dielectric layer 1210 is substantially transparent to X-rays while providing suitable electrical insulation between electron-detecting subassembly 1102 and other portions of membrane assembly 1100. More preferably, dielectric layer 1210 has a thickness of less than 2,000 nanometers. Preferably, dielectric layer 1210 is formed of silicon dioxide or silicon nitride.

Preferably, outer metal line 1220, inner metal lines 1230, outer metal line pad 1240, inner metal line pad 1250, connecting metal line 1242, connecting metal line 1252 and connecting metal line 1256 are formed of gold. Outer metal line 1220 and inner metal lines 1230 are formed in nested shapes. Preferably, the nested shapes are concentric and centered about a center of cornerless aperture 1122. In the embodiment of the present invention shown in FIGS. 7A-7F, outer metal line 1220 is an interrupted ring shape, in order to prevent electrical contact with connecting metal line 1252, and inner metal lines 1230 are closed rings. In an alternative embodiment of the present invention, metal lines 1220 and 1230 may define any suitable nested shapes, such as, inter alia, interrupted ring shapes, horseshoe shapes or incomplete squares. In the embodiment of the present invention shown in FIGS. 7A-7F, metal lines 1220 and 1230 define concentric shapes centered about the center of cornerless aperture 1122. In an alternative embodiment of the present invention, metal lines 1220 and 1230 need not be concentric or centered about the center of cornerless aperture 1122.

Inner metal lines 1230 and connecting metal line 1256 partially overlie holding frame aperture 1139. Inner metal lines 1230 and connecting metal line 1256 preferably overlie no more than 25% of an area defined by aperture 1139, such that inner metal lines 1230 and connecting metal line 1256 do not block a significant proportion of X-rays from passing through aperture 1139. Inner metal lines 1230 and outer metal line 1220 may have any suitable line widths and spacing, such as, inter alia, the line widths and spacing shown in FIGS. 7A-7F. The term "line width" herein refers to respective measurements characterizing each of inter metal lines 1230 and outer metal line 1220, the measurement being measured in a dimension generally parallel to a plane in which a majority of dielectric layer 1210 lies.

In the embodiment of the present invention shown in FIGS. 7A-7F, inner metal lines 1230 include three metal lines. In an alternative embodiment of the present invention, inner metal lines 1230 may include any number of metal lines.

In the embodiment of the present invention shown in FIGS. 7A-7F, membrane assembly 1100 includes four metal lines forming nested shapes, namely outer metal line 1220 and three inner metal lines 1230. In an alternative embodiment of the present invention, membrane assembly 1100 may include any number of metal lines forming nested closed shapes.

Outer metal line 1220 is electrically connected to outer metal line pad 1240. In the embodiment of the present invention shown in FIGS. 7A-7F, connecting metal line 1242 electrically connects outer metal line 1220 to outer metal line pad 1240. In an alternative embodiment of the present invention, connecting metal line 1242 is obviated, and an alternative electrical connector (not shown) electrically connects outer metal line 1220 to outer metal line pad 1240.

Inner metal lines 1230 are electrically connected to inner metal line pad 1250. In the embodiment of the present invention shown in FIGS. 7A-7F, connecting metal line 1252 electrically connects inner metal lines 1230 to inner metal line pad 1250. In an alternative embodiment of the present invention, connecting metal line 1252 is obviated, and an alternative electrical connector (not shown) electrically connects inner metal lines 1230 to inner metal line pad 1250.

Preferably, outer metal line pad 1240 and inner metal line pad 1250 are in electrical communication with a printed circuit board (not shown). In the embodiment of the present invention shown in FIGS. 7A-7F, outer metal line pad 1240 and inner metal line pad 1250 are generally rectangular in shape. In an alternative embodiment of the present invention, outer metal line pad 1240 and inner metal line pad 1250 may individually be formed in any suitable shapes, such as, inter alia, rounded squares, rounded rectangles or trapeziums.

In the embodiment of the present invention shown in FIGS. 7A-7F, both of outer metal line pad 1240 and inner metal line pad 1250 are closest to a single edge of membrane assembly 1100. In an alternative embodiment of the present invention, each of outer metal line pad 1240 and inner metal line pad 1250 are closest to a different edge of membrane assembly 1100 from one another. In yet an alternative embodiment of the present invention, each of outer metal line pad 1240 and inner metal line pad 1250 are situated at positions on dielectric layer 1210, different from those shown in FIGS. 7A-7F.

Preferably, outer metal line 1220, inner metal lines 1230, connecting metal line 1242, connecting metal line 1252 and connecting metal line 1256 all have respective thicknesses of less than 2,000 nanometers. More preferably, outer metal line 1220, inner metal lines 1230, connecting metal line 1242, connecting metal line 1252 and connecting metal line 1256 all have respective thicknesses of less than 500 nanometers. Most preferably, outer metal line 1220, inner metal lines 1230, connecting metal line 1242, connecting metal line 1252 and connecting metal line 1256 all have respective thicknesses of less than 100 nanometers. Preferably, outer metal line pad 1240 and inner metal line pad 1250 each have thicknesses of less than 1,000 nanometers and more than 200 nanometers. More preferably, outer metal line pad 1240 and inner metal line pad 1250 each have thicknesses of less than 1,000 nanometers and more than 300 nanometers. Most preferably, outer metal line pad 1240 and inner metal line pad 1250 each have thicknesses of less than 500 nanometers and more than 300 nanometers. The term "thickness" herein refers to a dimension perpendicular to a plane in which a majority of dielectric layer 1210 lies.

In one embodiment of the present invention, outer metal line 1220, inner metal lines 1230, outer metal line pad 1240, inner metal line pad 1250, connecting metal line 1242, connecting metal line 1252 and connecting metal line 1256 are bonded to dielectric layer 1210 using thin film metal deposition. In an alternative embodiment of the present invention, outer metal line 1220, inner metal lines 1230, outer metal line pad 1240, inner metal line pad 1250, connecting metal line 1242, connecting metal line 1252 and connecting metal line 1256 are affixed to dielectric layer 1210 using an alternative bonding process.

During an operation of membrane assembly 1100, either a positive or negative potential may be individually applied to outer metal line 1220 and inner metal lines 1230. If an overall positive potential is applied to a metal line, then the metal line absorbs lower-energy electrons. If an overall negative potential is applied to a metal line, then the metal line absorbs more positively charged particles. In a preferred mode of operation of membrane assembly 1100, a positive potential is applied to both outer metal line 1220 and inner metal lines 1230, thereby maximizing an absorption of low-energy electrons primarily by inner metal lines 1230. Connecting metal line 1256 electrically connects inner metal lines 1230 to one another. As a result, when a positive potential is applied to inner metal lines 1230 in order to absorb low-energy electrons, inner metal lines 1230 share the same electric potential.

In a preferred use of membrane assembly 1100, inner metal lines 1230 preferably absorb low-energy electrons for detection, and outer metal line 1220 improves a signal to noise ratio of electron-detecting subassembly 1102. Preferably, those components of membrane assembly 1100 designated for detecting electrons are not in electrical contact with those components of membrane assembly 1100 designated for absorbing electromagnetic noise. Thus, in the embodiment shown in FIGS. 7A-7F, none of inner metal lines 1230, inner metal line pad 1250 or connecting metal line 1252 are in electrical contact with any of outer metal line 1220, outer metal line pad 1240 or connecting metal line 1242. Outer metal line 1220 forms an open shape. As such, connecting metal line 1252 and outer metal line 1220 do not overlie each other since connecting metal line 1252 intersects a gap in outer metal line 1220. However, those components of membrane assembly 1100 designated for detecting electrons are in electrical contact with one another. For example, inner metal lines 1230 are in electrical contact with one another via connecting metal line 1256. Similarly, those components of membrane assembly 1100 designated for absorbing electromagnetic noise are in electrical contact with one another. For example, outer metal line 1220 is in electrical contact with connecting metal line 1242.

Membrane assembly 1100 may have additional layers including but not limited to: one or more etch-stopping layers useful for a manufacturing process, one or more stress-compensation layers, one or more additional layers of electrical insulation, one or more adhesive layers for an attachment of membrane assembly 1100 to other structures and one or more buffer layers to prevent pressure-scaling membrane 1110 from becoming contaminated or mechanically damaged through contact with other materials.

Membrane assembly 1100 is preferably manufactured using conventional silicon-on-insulator (SOI) and silicon-nitride-on-insulator (SNOI) technology by a suitable semi-conductor manufacturer, such as, for example, Norcada Inc., of Edmonton, Canada.

It will be appreciated by persons skilled in the art that the embodiment of the invention shown in FIGS. 4A-4F may be combined with any of the embodiments shown in FIGS. 5A-5F, FIGS. 6A-6F and FIGS. 7A-7F, to form further alternative embodiments of the present invention which include a supporting membrane layer supported between and bonded to a pressure-sealing membrane and a holding frame.

It will also be appreciated by persons skilled in the art that the embodiment of the invention shown in FIGS. 5A-5F may be combined with either of the embodiments shown in FIGS. 6A-6F and FIGS. 7A-7F, to form further alternative embodiments of the present invention which include bevelled surfaces.

It will also be appreciated by persons skilled in the art that the embodiment of the invention shown in FIGS. 6A-6F may be combined with the embodiment shown in FIGS. 7A-7F, to form a further alternative embodiment of the present invention in which an outer metal line does not define a closed shape and in which an at least one inner metal line partially overlies an aperture substantially transparent to X-rays.

Figure 8:
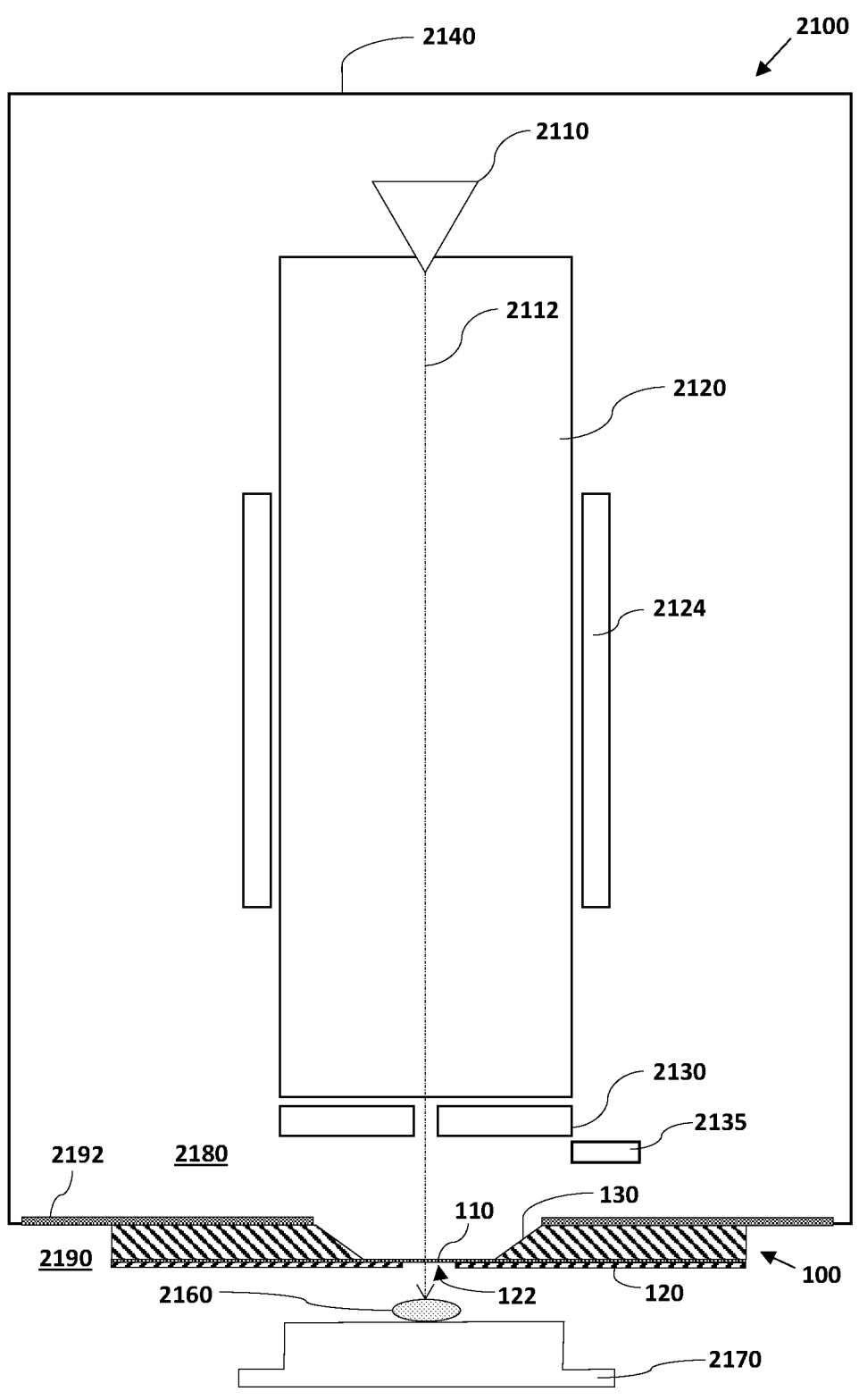
FIG. 8 is a simplified illustration of a charged particle beam device employing the membrane assembly of FIGS. 1A-1D.

Reference is now made to FIG. 8, which is a simplified illustration of a charged particle beam device 2100 employing membrane assembly 100, which is described hereinabove with reference to FIGS. 1A-1D. A charged particle source 2110 generates a primary charged particle beam 2112. Charged particle beam 2112 travels through a lens barrel 2120, which is surrounded by a plurality of electromagnetic lenses 2124, and through an internal particle detector 2130. Charged particle beam device 1100 preferably further includes an Energy Dispersive X-Ray Analysis (EDX) detector 2135 for detecting X-ray photons. Charged particle source 2110, lens barrel 2120, electromagnetic lenses 2124, internal particle detector 2130 and EDX detector 2135 are all included in charged particle beam device 2100 and are all disposed within a charged particle beam device housing 2140.

Primary charged particle beam 2112 then passes through pressure-sealing membrane 110 of membrane assembly 100 and interacts with a sample 2160 supported by a sample support 2170. Preferably, there is a first-pressure environment 2180, characterized by a first pressure, within charged particle beam device housing 2140, and a second-pressure environment 2190, characterized by a second pressure, surrounding sample 2160 and sample support 2170. Preferably, both first-pressure environment 2180 and second-pressure environment 2190 are gaseous environments.

In the embodiment of the present invention shown in FIG. 8, charged particle beam device housing 2140 contains first-pressure environment 2180 which is characterized by a single pressure. In an alternative embodiment of the present invention, charged particle beam device 2100 contains an additional-pressure environment, such as an environment within lens barrel 2120, which is maintained at a lower pressure than first-pressure environment 2180.

Pressure-scaling membrane 110 is situated between and bonded to supporting membrane layer 120 and holding frame 130. Typically, there exists a pressure differential between first-pressure environment 2180 and second-pressure environment 2190, across pressure-scaling membrane 110. First-pressure environment 2180 has a lower pressure than second-pressure environment 2190. Preferably, a pressure differential of approximately 100,000 pascals exists between first-pressure environment 2180 and second-pressure environment 2190, across pressure-sealing membrane 110. More preferably, a pressure differential of approximately 150,000 pascals exists between first-pressure environment 2180 and second-pressure environment 2190, across pressure-sealing membrane 110. Most preferably, a pressure differential of approximately 200,000 pascals exists between first-pressure environment 2180 and second-pressure environment 2190, across pressure-scaling membrane 110. Typically, the first pressure of first-pressure environment 2180 is maintained by a use of at least one vacuum pump (not shown), and the second pressure of second-pressure environment 2190, is substantially similar to an ambient pressure of an environment in which charged particle beam device 2100 is located.

In one exemplary use case of charged particle beam device 2100, first-pressure environment 2180 within charged particle beam device housing 2140 is under partial vacuum, such as $10^{-5}$ pascals, and second-pressure environment 2190 surrounding sample 2160 and sample support 2170 is substantially close to atmospheric pressure. Pressure-sealing membrane 110 maintains the pressure difference between first-pressure environment 2180 and second-pressure environment 2190.

Charged particle beam device 2100 is shown in FIG. 8 as including internal particle detector 2130 for detecting particles resulting from interactions between primary charged particle beam 2112 and sample 2160. For simplicity, charged particle beam device 2100 is shown in FIG. 8 without additional focusing lenses and with only one internal particle detector 2130 and one EDX detector 2135. However, charged particle beam device 2100 may include any suitable number of components including, inter alia, additional lenses, external particle detectors and internal particle detectors. Any external particle detectors, such as, inter alia, electron detectors, are typically situated in second-pressure environment 2190. Any internal particle detectors, such as, inter alia, electron detectors, are typically situated in first-pressure environment 2180.

It is a particular feature of the present invention that both supporting membrane layer 120 and pressure-sealing membrane 110 are substantially transparent to X-rays. Accordingly, X-rays resulting from interactions between primary charged particle beam 2112 and sample 2160, which are typically generated outside of charged particle beam device housing 2140, are able to pass through membrane assembly 100 and be detected by one or more detectors situated within charged particle beam device housing 2140, such as internal particle detector 2130.

It is a particular feature of the present invention that pressure-sealing membrane 110 is formed of a suitable material substantially transparent to primary charged particle beam 2112. For example, if charged particle beam device 2100 is an SEM and primary charged particle beam 2112 is an electron beam, then pressure-sealing membrane 2110 is preferably formed of silicon nitride, silicon or carbon.

It is a particular feature of the present invention that pressure-scaling membrane 110 overlies and atmospherically seals cornerless aperture 122 in supporting membrane layer 120. Preferably, cornerless aperture 122 has a longest chord of at least 100,000 nanometers. More preferably, cornerless aperture 122 has a longest chord of at least 200,000 nanometers. Most preferably, cornerless aperture 122 has a longest chord of at least 250,000 nanometers. The dimensions and relative dispositions of pressure-sealing membrane 110 and cornerless aperture 122, result in a large field of view for particle detectors, such as internal particle detector 2130, that are situated within charged particle beam device housing 2140.

Sample 2160 may be any solid object or non-solid object. In the exemplary use case shown in FIG. 8, sample 2160 is a single object. However, sample 2160 may include a plurality of objects. Preferably, a distance between sample 2160 and pressure-scaling membrane 110 is minimized, thereby minimizing a scattering of primary charged particle beam 2112. Preferably, the distance between sample 2160 and pressure-scaling membrane 110 is less than 200,000 nanometers. More preferably, the distance between sample 2160 and pressure-scaling membrane 110 is less than 100,000 nanometers. Most preferably, the distance between sample 2160 and pressure-sealing membrane 110 is less than 50,000 nanometers. Sample support 2170 may be formed in any suitable shape. Sample support 2170 is preferably operative to support sample 2160. Preferably, sample support 2170 is equipped with a mechanism to adjust a linear and angular spatial position of sample 2160 in three dimensions. An exemplary stage useful as sample support 2170 is part number MCL-μD2067, commercially available from Mad City Labs Inc., of Madison, USA.

Holding frame 130 is affixed to charged particle beam device housing 2140 such that membrane assembly 100 atmospherically seals first-pressure environment 2180. In the embodiment of the present invention shown in FIG. 8, holding frame 130 is affixed, preferably using a suitable adhesive, to a plate 2192, which is detachably affixed to charged particle beam device housing 2140, preferably using suitable fasteners (not shown). The respective affixations of holding frame 130 to plate 2192 and of plate 2192 to charged particle beam device housing 2140 are preferably each substantially air-tight. In an alternative embodiment of the present invention, holding frame 130 is affixed to charged particle beam device 2100 using an alternative adhesive or method of affixation. It is appreciated that holding frame 130 may be detachably or non-detachably affixed to charged particle beam device housing 2140. In the embodiment of the present invention shown in FIG. 8, holding frame 130 is situated externally to charged particle beam device housing 2140. In another embodiment of the present invention, holding frame 130 is situated partially or completely within charged particle beam device housing 2140.

The present invention is useful with any of multiple types of charged particle beam devices 2100, including, inter alia, a scanning electron microscope, a scanning transmission electron microscope, a scanning positron microscope, a composite device including a combination of some or all of a scanning electron microscope, a scanning transmission electron microscope, a scanning positron microscope and analysis devices utilizing them. An exemplary device useful as charged particle beam device 2100, in which charged particle source 2110 and sample 2160 are situated in different-pressure environments, is an AE 1500, commercially available from Hitatchi, Ltd, of Chiyoda, Japan. Membrane assembly 100 is preferably manufactured using conventional silicon-on-insulator (SOI) and silicon-nitride-on-insulator (SNOI) technology by a suitable semiconductor manufacturer, such as, for example, Norcada Inc., of Edmonton, Canada.

Figure 9:
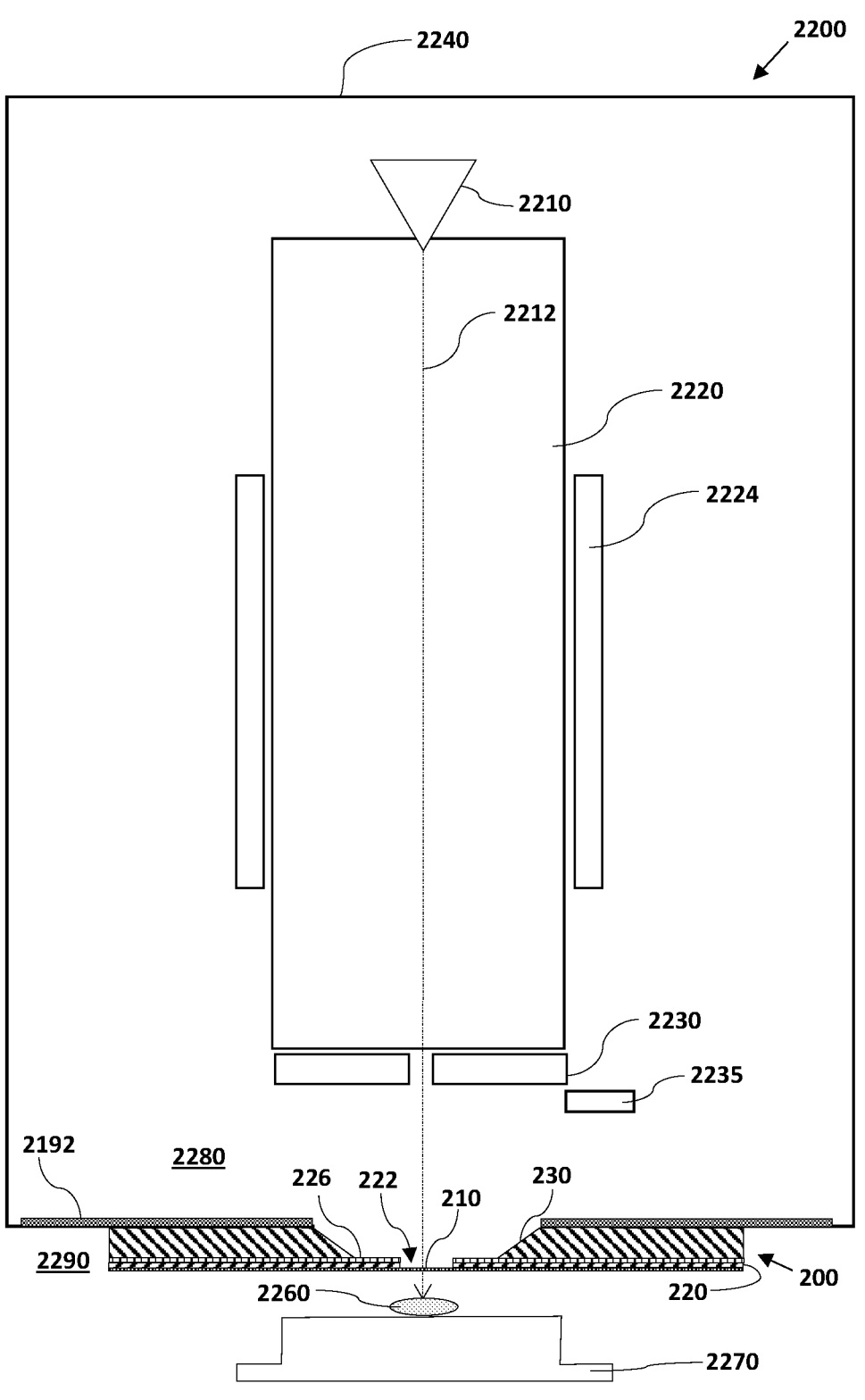
FIG. 9 is a simplified illustration of a charged particle beam device employing the membrane assembly of FIGS. 2A-2D.

Reference is now made to FIG. 9, which is a simplified illustration of a charged particle beam device 2200 employing membrane assembly 200, which is described hereinabove with reference to FIGS. 2A-2D. A charged particle source 2210 generates a primary charged particle beam 2212. Charged particle beam 2212 travels through a lens barrel 2220, which is surrounded by a plurality of electromagnetic lenses 2224, and through an internal particle detector 2230. Charged particle beam device 2200 preferably further includes an Energy Dispersive X-Ray Analysis (EDX) detector 2235 for detecting X-ray photons. Charged particle source 2210, lens barrel 2220, electromagnetic lenses 2224, internal particle detector 2230 and EDX detector 2235 are all included in charged particle beam device 2200 and are all disposed within a charged particle beam device housing 2240.

Primary charged particle beam 2212 then passes through pressure-sealing membrane 210 of membrane assembly 200 and interacts with a sample 2260 supported by a sample support 2270. Preferably, there is a first-pressure environment 2280, characterized by a first pressure, within charged particle beam device housing 2240, and a second-pressure environment 2290, characterized by a second pressure, surrounding sample 2260 and sample support 2270. Preferably, both first-pressure environment 2280 and second-pressure environment 2290 are gaseous environments.

In the embodiment of the present invention shown in FIG. 9, charged particle beam device housing 2240 contains first-pressure environment 2280 which is characterized by a single pressure. In an alternative embodiment of the present invention, charged particle beam device 2200 contains an additional-pressure environment, such as an environment within lens barrel 2220, which is maintained at a lower pressure than first-pressure environment 2280.

Supporting membrane layer 220 is situated between and bonded to pressure-scaling membrane 210 and etch-stopping layer 226. Typically, there exists a pressure differential between first-pressure environment 2280 and second-pressure environment 2290, across pressure-sealing membrane 210. First-pressure environment 2280 has a lower pressure than second-pressure environment 2290. Preferably, a pressure differential of approximately 100,000 pascals exists between first-pressure environment 2280 and second-pressure environment 2290, across pressure-sealing membrane 210. More preferably, a pressure differential of approximately 150,000 pascals exists between first-pressure environment 2280 and second-pressure environment 2290, across pressure-sealing membrane 210. Most preferably, a pressure differential of approximately 200,000 pascals exists between first-pressure environment 2280 and second-pressure environment 2290, across pressure-scaling membrane 210. Typically, the first pressure of first-pressure environment 2280 is maintained by a use of at least one vacuum pump (not shown), and the second pressure of second-pressure environment 2290 is substantially similar to an ambient pressure of an environment in which charged particle beam device 2200 is located.

In one exemplary use case of charged particle beam device 2200, first-pressure environment 2280 within charged particle beam device housing 2240 is under partial vacuum, such as $10^{-5}$ pascals, and second-pressure environment 2290 surrounding sample 2260 and sample support 2270 is substantially close to atmospheric pressure. Pressure-sealing membrane 210 maintains the pressure difference between first-pressure environment 2280 and second-pressure environment 2290.

Charged particle beam device 2200 is shown in FIG. 9 as including internal particle detector 2230 for detecting particles resulting from interactions between primary charged particle beam 2212 and sample 2260. For simplicity, charged particle beam device 2200 is shown in FIG. 9 without additional focusing lenses and with only one internal particle detector 2230 and one EDX detector 2235. However, charged particle beam device 2200 may include any suitable number of components, including, inter alia, additional lenses, external particle detectors and internal particle detectors. Any external particle detectors, such as, inter alia, electron detectors, are typically situated in second-pressure environment 2290. Any internal particle detectors, such as, inter alia, electron detectors and X-ray detectors are typically situated in first-pressure environment 2280.

It is a particular feature of the present invention that both supporting membrane layer 220 and pressure-scaling membrane 210 are substantially transparent to X-rays. Accordingly, X-rays resulting from interactions between primary charged particle beam 2212 and sample 2260, which are typically generated outside of charged particle beam device housing 2240, are able to pass through membrane assembly 200 and be detected by one or more detectors situated within charged particle beam device housing 2240, such as internal particle detector 2230.

It is a particular feature of the present invention that pressure-sealing membrane 210 is substantially transparent to primary charged particle beam 2212. For example, if charged particle beam device 2200 is a scanning electron microscope (SEM) and primary charged particle beam 2212 is an electron beam, then pressure-sealing membrane 210 is preferably formed of silicon nitride, silicon or carbon.

It is a particular feature of the present invention that pressure-sealing membrane 210 overlies and atmospherically seals cornerless aperture 222 in supporting membrane layer 220. Preferably, cornerless aperture 222 has a longest chord of at least 100,000 nanometers. More preferably, cornerless aperture 222 has a longest chord of at least 200,000 nanometers. Most preferably, cornerless aperture 222 has a longest chord of at least 250,000 nanometers. The dimensions and relative dispositions of pressure-sealing membrane 210 and cornerless aperture 222 result in a large field of view for particle detectors, such as internal particle detector 2230, that are situated within charged particle beam device housing 2240.

Sample 2260 may be any solid object or non-solid object. In the exemplary use case shown in FIG. 9, sample 2260 is a single object. However, sample 2260 may include a plurality of objects. Preferably, a distance between sample 2260 and pressure-sealing membrane 210 is minimized, thereby minimizing a scattering of primary charged particle beam 2212. Preferably, the distance between sample 2260 and pressure-scaling membrane 210 is less than 200,000 nanometers. More preferably, the distance between sample 2260 and pressure-sealing membrane 210 is less than 100,000 nanometers. Most preferably, the distance between sample 2260 and pressure-sealing membrane 210 is less than 50,000 nanometers.

Sample support 2270 may be formed in any suitable shape. Sample support 2270 is preferably operative to support sample 2260. Preferably, sample support 2270 is equipped with a mechanism to adjust a linear and angular spatial position of sample 2260 in three dimensions. An exemplary stage useful as sample support 2270 is part number MCL-µD2067, commercially available from Mad City Labs Inc., of Madison, USA.

Holding frame 230 is affixed to charged particle beam device housing 2240 such that membrane assembly 200 atmospherically seals first-pressure environment 2280. In the embodiment of the present invention shown in FIG. 9, holding frame 230 is affixed, preferably using a suitable adhesive, to a plate 2292, which is detachably affixed to charged particle beam device housing 2240, preferably using suitable fasteners (not shown). The respective affixations of holding frame 230 to plate 2292 and of plate 2292 to charged particle beam device housing 2240 are preferably each substantially air-tight. In an alternative embodiment of the present invention, holding frame 230 is affixed to charged particle beam device 2200 using an alternative adhesive or method of affixation. It is appreciated that holding frame 230 may be detachably or non-detachably affixed to charged particle beam device housing 2240. In the embodiment of the present invention shown in FIG. 9, holding frame 230 is situated externally to charged particle beam device housing 2240. In another embodiment of the present invention, holding frame 230 is situated partially or completely within charged particle beam device housing 2240.

The present invention is useful with any of multiple types of charged particle beam devices 2200, including, inter alia, a scanning electron microscope, a scanning transmission electron microscope, a scanning positron microscope, a composite device including a combination of some or all of a scanning electron microscope, a scanning transmission electron microscope, a scanning positron microscope and analysis devices utilizing them.

An exemplary device useful as charged particle beam device 2200, in which charged particle source 2210 and sample 2260 are situated in different-pressure environments, is an AE 1500, commercially available from Hitatchi, Ltd, of Chiyoda, Japan. Membrane assembly 200 is preferably manufactured using conventional silicon-on-insulator (SOI) and silicon-nitride-on-insulator (SNOI) technology by a suitable semiconductor manufacturer, such as, for example, Norcada Inc., of Edmonton, Canada.

Figure 10:
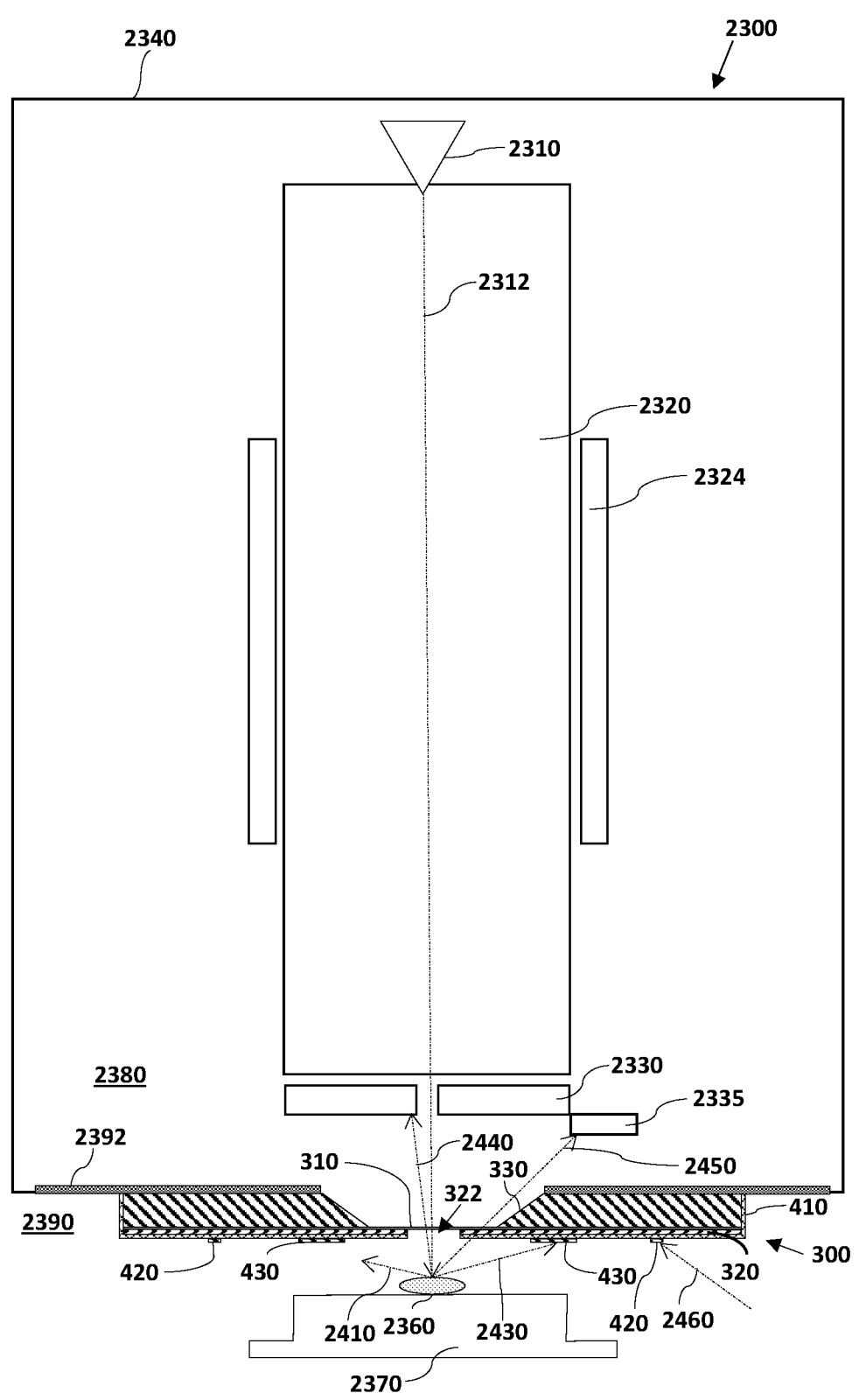
FIG. 10 is a simplified illustration of a charged particle beam device employing the membrane assembly of FIGS. 3A-3F.

Reference is now made to FIG. 10, which is a simplified illustration of a charged particle beam device 2300 employing membrane assembly 300, which is described hereinabove with reference to FIGS. 3A-3F. A charged particle source 2310 generates a primary charged particle beam 2312. Charged particle beam 2312 travels through a lens barrel 2320, which is surrounded by a plurality of electromagnetic lenses 2324, and through an internal particle detector 2330. Charged particle beam device 2300 preferably further includes an Energy Dispersive X-Ray Analysis (EDX) detector 2335 for detecting X-ray photons. Charged particle source 2310, lens barrel 2320, electromagnetic lenses 2324, internal particle detector 2330 and EDX detector 2335 are all included in charged particle beam device 2300 and are all disposed within a charged particle beam device housing 2340.

Primary charged particle beam 2312 then passes through pressure-scaling membrane 310 of membrane assembly 300 and interacts with a sample 2360 supported by a sample support 2370. Preferably, there is a first-pressure environment 2380, characterized by a first pressure, within charged particle beam device housing 2340, and a second-pressure environment 2390, characterized by a second pressure, surrounding sample 2360 and sample support 2370. Preferably, both first-pressure environment 2380 and second-pressure environment 2390 are gaseous environments.

In the embodiment of the present invention shown in FIG. 10, charged particle beam device housing 2340 contains first-pressure environment 2380 which is characterized by a single pressure. In an alternative embodiment of the present invention, charged particle beam device 2300 contains an additional-pressure environment, such as an environment within lens barrel 2320, which is maintained at a lower pressure than first-pressure environment 2380.

Typically, interactions between primary charged particle beam 2312 and sample 2360 produce a plurality of particles, which travel along a plurality of particle paths. An exemplary subset of such particle paths is represented in FIG. 10 by a secondary particle path 2410, a secondary particle path 2430, a back-scattered particle path 2440 and an X-ray photon path 2450. Electromagnetic noise is also typically present in second-pressure environment 2390. An example of such electromagnetic noise is represented in FIG. 10 by electromagnetic noise path 2460.

Pressure-sealing membrane 310 is situated between and bonded to supporting membrane layer 320 and holding frame 330. Typically, there exists a pressure differential between first-pressure environment 2380 and second-pressure environment 2390, across pressure-sealing membrane 310. First-pressure environment 2380 has a lower pressure than second-pressure environment 2390. Preferably, a pressure differential of approximately 100,000 pascals exists between first-pressure environment 2380 and second-pressure environment 2390, across pressure-sealing membrane 310. More preferably, a pressure differential of approximately 150,000 pascals exists between first-pressure environment 2380 and second-pressure environment 2390, across pressure-sealing membrane 310. Most preferably, a pressure differential of approximately 200,000 pascals exists between first-pressure environment 2380 and second-pressure environment 2390, exists pressure-scaling membrane 310. Typically, the first pressure of first-pressure environment 2380 is maintained by a use of at least one vacuum pump (not shown), and the second pressure of second-pressure environment 2390 is substantially similar to an ambient pressure of an environment in which charged particle beam device 2300 is located.

One exemplary use case of charged particle beam device 2300, first-pressure environment 2380 within charged particle beam device housing 2340 is under partial vacuum, such as $10^{-5}$ pascals, and second-pressure environment 2390 surrounding sample 2360 and sample support 2370 is substantially close to atmospheric pressure. Pressure-sealing membrane 310 maintains the pressure difference between first-pressure environment 2380 and second-pressure environment 2390.

Charged particle beam device 2300 is shown in FIG. 10 as including internal particle detector 2330 for detecting particles resulting from interactions between primary charged particle beam 2312 and sample 2360. Charged particle beam device 2300 is also shown in FIG. 10 as including EDX detector 2335, for detecting X-ray photons. For simplicity, charged particle beam device 2300 is shown in FIG. 10 without additional focusing lenses and with only one internal particle detector 2330 and one EDX detector 2335. However, charged particle beam device 2300 may include any suitable number of components, including, inter alia, additional lenses, external particle detectors and internal particle detectors. Any external particle detectors, such as, inter alia, electron detectors, are typically situated in second-pressure environment 2390. Any internal particle detectors, such as, inter alia, electron detectors and X-ray detectors are typically situated in first-pressure environment 2380.

It is a particular feature of the present invention that all of supporting membrane layer 320, pressure-scaling membrane 310 and dielectric layer 410 are substantially transparent to X-rays. Accordingly. X-rays resulting from interactions between primary charged particle beam 2312 and sample 2360, which are typically generated outside of charged particle beam device housing 2340, are able to pass through membrane assembly 300 and be detected by one or more detectors situated within charged particle beam device housing 2340, such as internal particle detector 2330.

It is a particular feature of the present invention that pressure-sealing membrane 310 is substantially transparent to primary charged particle beam 2312. For example, if charged particle beam device 2300 is an SEM and primary charged particle beam 2312 is an electron beam, then pressure-scaling membrane 310 is preferably formed of silicon nitride, silicon or carbon.

It is a particular feature of the present invention that pressure-scaling membrane 310 overlies and atmospherically seals cornerless aperture 322 in supporting membrane layer 320. Preferably, cornerless aperture 322 has a longest chord of at least 100,000 nanometers. More preferably, cornerless aperture 322 has a longest chord of at least 200,000 nanometers. Most preferably, cornerless aperture 322 has a longest chord of at least 250,000 nanometers. The dimensions and relative dispositions of pressure-scaling membrane 310 and cornerless aperture 322 result in a large field of view for particle detectors, such as internal particle detector 2330, that are situated within charged particle beam device housing 2340.

Sample 2360 may be any solid object or non-solid object. In the exemplary use case shown in FIG. 10, sample 2360 is a single object. However, sample 2360 may include a plurality of objects. Preferably, a distance between sample 2360 and pressure-scaling membrane 310 is minimized, thereby minimizing a scattering of primary charged particle beam 2312. Preferably, the distance between sample 2360 and pressure-sealing membrane 310 is less than 200,000 nanometers. More preferably, the distance between sample 2360 and pressure-scaling membrane 310 is less than 100,000 nanometers. Most preferably, the distance between sample 2360 and pressure-scaling membrane 310 is less than 50,000 nanometers.

Sample support 2370 may be formed in any suitable shape. Sample support 2370 is preferably operative to support sample 2360. Preferably, sample support 2370 is equipped with a mechanism to adjust a linear and angular spatial position of sample 2360 in three dimensions. An exemplary stage useful as sample support 2370 is part number MCL-μD2067, commercially available from Mad City Labs Inc., of Madison, USA.

Holding frame 330 is affixed to charged particle beam device housing 2340 such that membrane assembly 300 atmospherically seals first-pressure environment 2380. In the embodiment of the present invention shown in FIG. 10, holding frame 330 is affixed, preferably using a suitable adhesive, to a plate 2392, which is detachably affixed to charged particle beam device housing 2340, preferably using suitable fasteners (not shown). The respective affixations of holding frame 330 to plate 2392 and of plate 2392 to charged particle beam device housing 2340 are preferably each substantially air-tight. In an alternative embodiment of the present invention, holding frame 330 is affixed to charged particle beam device 2300 using an alternative adhesive or method of affixation. It is appreciated that holding frame 330 may be detachably or non-detachably affixed to charged particle beam device housing 2340. In the embodiment of the present invention shown in FIG. 10, holding frame 330 is situated externally to charged particle beam device housing 2340. In another embodiment of the present invention, holding frame 330 is situated partially or completely within charged particle beam device housing 2340.

Secondary particle path 2410 is an example of a particle path in which secondary particles are not absorbed by membrane assembly 300. Rather, the secondary particles of secondary particle path 2410 traverse second-pressure environment 2390 both without interacting with membrane assembly 300 and without entering charged particle beam device housing 2340. Secondary particle path 2430 is an example of a particle path in which secondary particles are absorbed by inner metal line 430. Back-scattered particle path 2440 is an example of a particle path in which back-scattered particles pass through pressure-sealing membrane 310 and are detected by internal particle detector 2330. X-ray photon path 2450 is an example of a path in which X-ray photons pass through dielectric layer 410, pressure-sealing membrane 310 and supporting membrane layer 320 and are detected by EDX detector 2335. Electromagnetic noise path 2460 is an example of an electromagnetic noise path in which electromagnetic noise from second-pressure environment 2390 is absorbed by outer metal line 420, outer metal line 420 functioning in a noise-reducing capacity.

During an operation of charged particle beam device 2300, either a positive or negative potential may be individually applied to outer metal line 420 and inner metal line 430. If an overall positive potential is applied to a metal line, then the metal line absorbs lower-energy electrons. In a preferred mode of operation of charged particle beam device 2300, a positive potential of approximately 150 volts is applied to both outer metal line 420 and inner metal line 430, thereby maximizing an absorption of low-energy electrons primarily by inner metal line 430.

In a preferred mode of operation of charged particle beam device 2300, an interaction between charged particle beam 2312 and sample 2360 causes local negative charging of sample 2360. Local negative charging of sample 2360 increases an electric potential difference between sample 2360 and outer metal line 420, and also increases an electric potential difference between sample 2360 and inner metal line 430. Accordingly, local negative charging of sample 2360 increases a strength of electric fields between sample 2360 and outer metal line 420, and between sample 2360 and inner metal line 430, respectively. These increased electric fields increase movement of negatively charged low-energy electrons from sample 2360 to inner metal line 420. Therefore, these increased electric field strengths increase absorption of low-energy electrons primarily by inner metal line 430.

The present invention is useful with any of multiple types of charged particle beam devices 2300, including, inter alia, a scanning electron microscope, a scanning transmission electron microscope, a scanning positron microscope, a composite device including a combination of some or all of a scanning electron microscope, a scanning transmission electron microscope, a scanning positron microscope and analysis devices utilizing them.

An exemplary device useful as charged particle beam device 2300, in which charged particle source 2310 and sample 2360 are situated in different-pressure environments, is an AE 1500, commercially available from Hitatchi, Ltd, of Chiyoda, Japan. Membrane assembly 300 is preferably manufactured using conventional silicon-on-insulator (SOI) and silicon-nitride-on-insulator (SNOI) technology by a suitable semiconductor manufacturer, such as, for example, Norcada Inc., of Edmonton, Canada.

Figure 11:
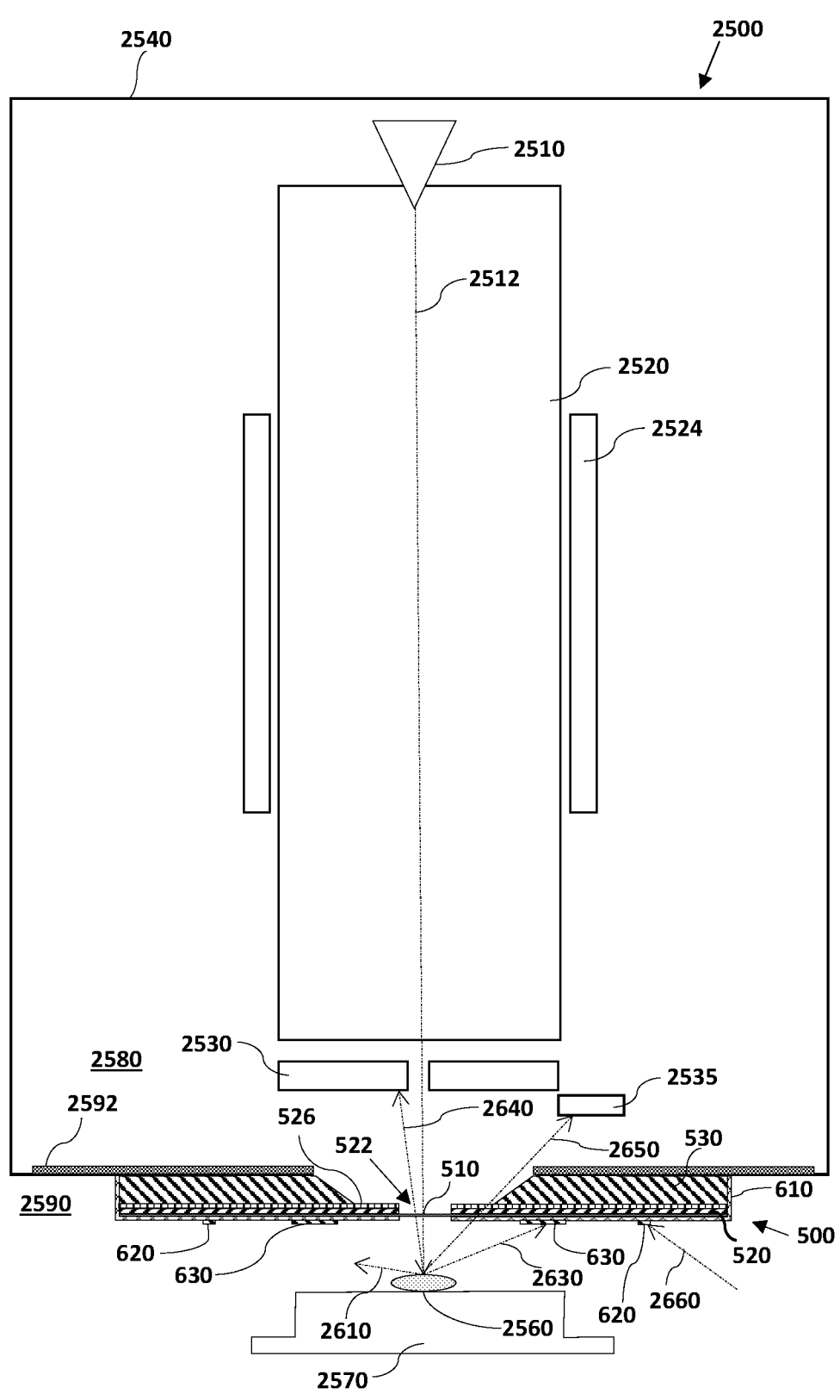
FIG. 11 is a simplified illustration of a charged particle beam device employing the membrane assembly of FIGS. 4A-4F.

Reference is now made to FIG. 11, which is a simplified illustration of a charged particle beam device 2500 employing membrane assembly 500, which is described hereinabove with reference to FIGS. 4A-4F. A charged particle source 2510 generates a primary charged particle beam 2512. Charged particle beam 2512 travels through a lens barrel 2520, which is surrounded by a plurality of electromagnetic lenses 2524, and through an internal particle detector 2530. Charged particle beam device 2500 preferably further includes an Energy Dispersive X-Ray Analysis (EDX) detector 2535 for detecting X-ray photons. Charged particle source 2510, lens barrel 2520, electromagnetic lenses 2524, internal particle detector 2530 and EDX detector 2535 are all included in charged particle beam device 2500 and are all disposed within a charged particle beam device housing 2540. Primary charged particle beam 2512 then passes through pressure-sealing membrane 510 of membrane assembly 500 and interacts with a sample 2560 supported by a sample support 2570.

Preferably, there is a first-pressure environment 2580, characterized by a first pressure, within charged particle beam device housing 2540, and a second-pressure environment 2590, characterized by a second pressure, surrounding sample 2560 and sample support 2570. Preferably, both first-pressure environment 2580 and second-pressure environment 2590 are gaseous environments.

In the embodiment of the present invention shown in FIG. 11, charged particle beam device housing 2540 contains first-pressure environment 2580 which is characterized by a single pressure. In an alternative embodiment of the present invention, charged particle beam device 2500 contains an additional-pressure environment, such as an environment within lens barrel 2520, which is maintained at a lower pressure than first-pressure environment 2580.

Typically, interactions between primary charged particle beam 2512 and sample 2560 produce a plurality of secondary particles, which travel along a plurality of particle paths. An exemplary subset of such secondary particle paths is represented in FIG. 11 by a secondary particle path 2610, a secondary particle path 2630, a back-scattered particle path 2640 and an X-ray photon path 2650. Electromagnetic noise is also typically present in second-pressure environment 2590. An example of such electromagnetic noise is represented in FIG. 11 by electromagnetic noise path 2660.

Supporting membrane layer 520 is situated between and bonded to pressure-sealing membrane 510 and etch-stopping layer 526. Typically, there exists a pressure differential between first-pressure environment 2580 and second-pressure environment 2590. First-pressure environment 2580 has a lower pressure than second-pressure environment 2590. Preferably, a pressure differential of approximately 100,000 pascals exists between first-pressure environment 2580 and second-pressure environment 2590, across pressure-scaling membrane 510. More preferably, a pressure differential of approximately 150,000 pascals exists between first-pressure environment 2580 and second-pressure environment 2590, across pressure-sealing membrane 510. Most preferably, a pressure differential of approximately 200,000 pascals exists between first-pressure environment 2580 and second-pressure environment 2590, across pressure-scaling membrane 510. Typically, the first pressure of first-pressure environment 2580 is maintained by a use of at least one vacuum pump (not shown), and the second pressure of second-pressure environment 2590 is substantially similar to an ambient pressure of an environment in which charged particle beam device 2500 is located.

In one exemplary use case of charged particle beam device 2500, first-pressure environment 2580 within charged particle beam device housing 2540 is under partial vacuum, such as $10^{-5}$ pascals, and second-pressure environment 2590 surrounding sample 2560 and sample support 2570 is substantially close to atmospheric pressure. Pressure-sealing membrane 510 maintains the pressure difference between first-pressure environment 2580 and second-pressure environment 2590.

Charged particle beam device 2500 is shown in FIG. 11 as including internal particle detector 2530 for detecting particles resulting from interactions between primary charged particle beam 2512 and sample 2560. Charged particle beam device 2500 is also shown in FIG. 11 as including EDX detector 2535, for detecting X-ray photons. For simplicity, charged particle beam device 2500 is shown in FIG. 11 without additional focusing lenses and with only one internal particle detector 2530 and one EDX detector 2535. However, charged particle beam device 2500 may include any suitable number of components, including, inter alia, additional lenses, external particle detectors and internal particle detectors. Any external particle detectors, such as, inter alia, electron detectors, are typically situated in second-pressure environment 2590. Any internal particle detectors, such as, inter alia, electron detectors and X-ray detectors are typically situated in first-pressure environment 2580.

It is a particular feature of the present invention that all of supporting membrane layer 520, pressure-scaling membrane 510, etch-stopping layer 526 and dielectric layer 610 are substantially transparent to X-rays. Accordingly, X-rays resulting from interactions between primary charged particle beam 2512 and sample 2560, which are typically generated outside of charged particle beam device housing 2540, are able to pass through membrane assembly 500 and be detected by one or more detectors situated within charged particle beam device housing 2540, such as internal particle detector 2530.

It is a particular feature of the present invention that pressure-sealing membrane 510 is substantially transparent to primary charged particle beam 2512. For example, if charged particle beam device 2500 is an SEM and primary charged particle beam 2512 is an electron beam, then pressure-sealing membrane 510 is preferably formed of silicon nitride, silicon or carbon.

It is a particular feature of the present invention that pressure-sealing membrane 510 overlies and atmospherically seals cornerless aperture 522 in supporting membrane layer 520. Preferably, cornerless aperture 522 has a longest chord of at least 100,000 nanometers. More preferably, cornerless aperture 522 has a longest chord of at least 200,000 nanometers. Most preferably, cornerless aperture 522 has a longest chord of at least 250,000 nanometers. The dimensions and relative dispositions of pressure-sealing membrane 510 and cornerless aperture 522 result in a large field of view for particle detectors, such as internal particle detector 2530, that are situated within charged particle beam device housing 2540.

Sample 2560 may be any solid object or non-solid object. In the exemplary use case shown in FIG. 11, sample 2560 is a single object. However, sample 2560 may include a plurality of objects. Preferably, a distance between sample 2560 and pressure-scaling membrane 510 is minimized, thereby minimizing a scattering of primary charged particle beam 2512. Preferably, the distance between sample 2560 and pressure-scaling membrane 510 is less than 200,000 nanometers. More preferably, the distance between sample 2560 and pressure-scaling membrane 510 is less than 100,000 nanometers. Most preferably, the distance between sample 2560 and pressure-sealing membrane 510 is less than 50,000 nanometers.

Sample support 2570 may be formed in any suitable shape. Sample support 2570 is preferably operative to support sample 2560. Preferably, sample support 2570 is equipped with a mechanism to adjust a linear and angular spatial position of sample 2560 in three dimensions. An exemplary stage useful as sample support 2570 is part number MCL-μD2067, commercially available from Mad City Labs Inc., of Madison, USA.

Holding frame 530 is affixed to charged particle beam device housing 2540 such that membrane assembly 500 atmospherically seals first-pressure environment 2580. In the embodiment of the present invention shown in FIG. 11, holding frame 530 is affixed, preferably using a suitable adhesive, to a plate 2592, which is detachably affixed to charged particle beam device housing 2540, preferably using suitable fasteners (not shown). The respective affixations of holding frame 530 to plate 2592 and of plate 2592 to charged particle beam device housing 2540 are preferably each substantially air-tight. In an alternative embodiment of the present invention, holding frame 530 is affixed to charged particle beam device 2500 using an alternative adhesive or method of affixation. It is appreciated that holding frame 530 may be detachably or non-detachably affixed to charged particle beam device housing 2540. In the embodiment of the present invention shown in FIG. 11, holding frame 530 is situated externally to charged particle beam device housing 2540. In another embodiment of the present invention, holding frame 530 is situated partially or completely within charged particle beam device housing 2540.

Secondary particle path 2610 is an example of a particle path in which secondary particles are not absorbed by membrane assembly 500. Rather, the secondary particles of secondary particle path 2610 traverse second-pressure environment 2590 both without interacting with membrane assembly 500 and without entering charged particle beam device housing 3540. Secondary particle path 2630 is an example of a particle path in which secondary particles are absorbed by inner metal line 630. Back-scattered particle path 2640 is an example of a particle path in which back-scattered particles pass through pressure-sealing membrane 510 and are detected by internal particle detector 2530. X-ray photon path 2650 is an example of a path in X-ray photons pass through dielectric layer 610, pressure-sealing membrane 510, etch-stopping layer 526 and supporting membrane layer 520 and are detected by EDX detector 2535. Electromagnetic noise path 2660 is an example of an electromagnetic noise path in which electromagnetic noise from second-pressure environment 2590 is absorbed by outer metal line 620, outer metal line 620 functioning in a noise-reducing capacity.

During an operation of charged particle beam device 2500, either a positive or negative potential may be individually applied to outer metal line 620 and inner metal line 630. If an overall positive potential is applied to a metal line, then the metal line absorbs lower-energy electrons. In a preferred mode of operation of charged particle beam device 2500, a positive potential of approximately 150 volts is applied to both outer metal line 620 and inner metal line 630, thereby maximizing an absorption of low-energy electrons primarily by inner metal line 630.

In a preferred mode of operation of charged particle beam device 2500, an interaction between charged particle beam 2512 and sample 2560 causes local negative charging of sample 2560. Local negative charging of sample 2560 increases an electric potential difference between sample 2560 and outer metal line 620, and also increases an electric potential difference between sample 2560 and inner metal line 630. Accordingly, local negative charging of sample 2560 increases a strength of electric fields between sample 2560 and outer metal line 620, and between sample 2560 and inner metal line 630, respectively. These increased electric fields increase movement of negatively charged low-energy electrons from sample 2560 to outer metal line 620 and inner metal line 620. Therefore, these increased electric field strengths increase absorption of low-energy electrons primarily by inner metal line 630.

The present invention is useful with any of multiple types of charged particle beam devices 2500, including, inter alia, a scanning electron microscope, a scanning transmission electron microscope, a scanning positron microscope, a composite device including a combination of some or all of a scanning electron microscope, a scanning transmission electron microscope, a scanning positron microscope and analysis devices utilizing them.

An exemplary device useful as charged particle beam device 2500, in which charged particle source 2510 and sample 2560 are situated in different-pressure environments, is an AE 1500, commercially available from Hitatchi, Ltd, of Chiyoda, Japan. Membrane assembly 500 is preferably manufactured using conventional silicon-on-insulator (SOI) and silicon-nitride-on-insulator (SNOI) technology by a suitable semiconductor manufacturer, such as, for example, Norcada Inc., of Edmonton, Canada.

Figure 12:
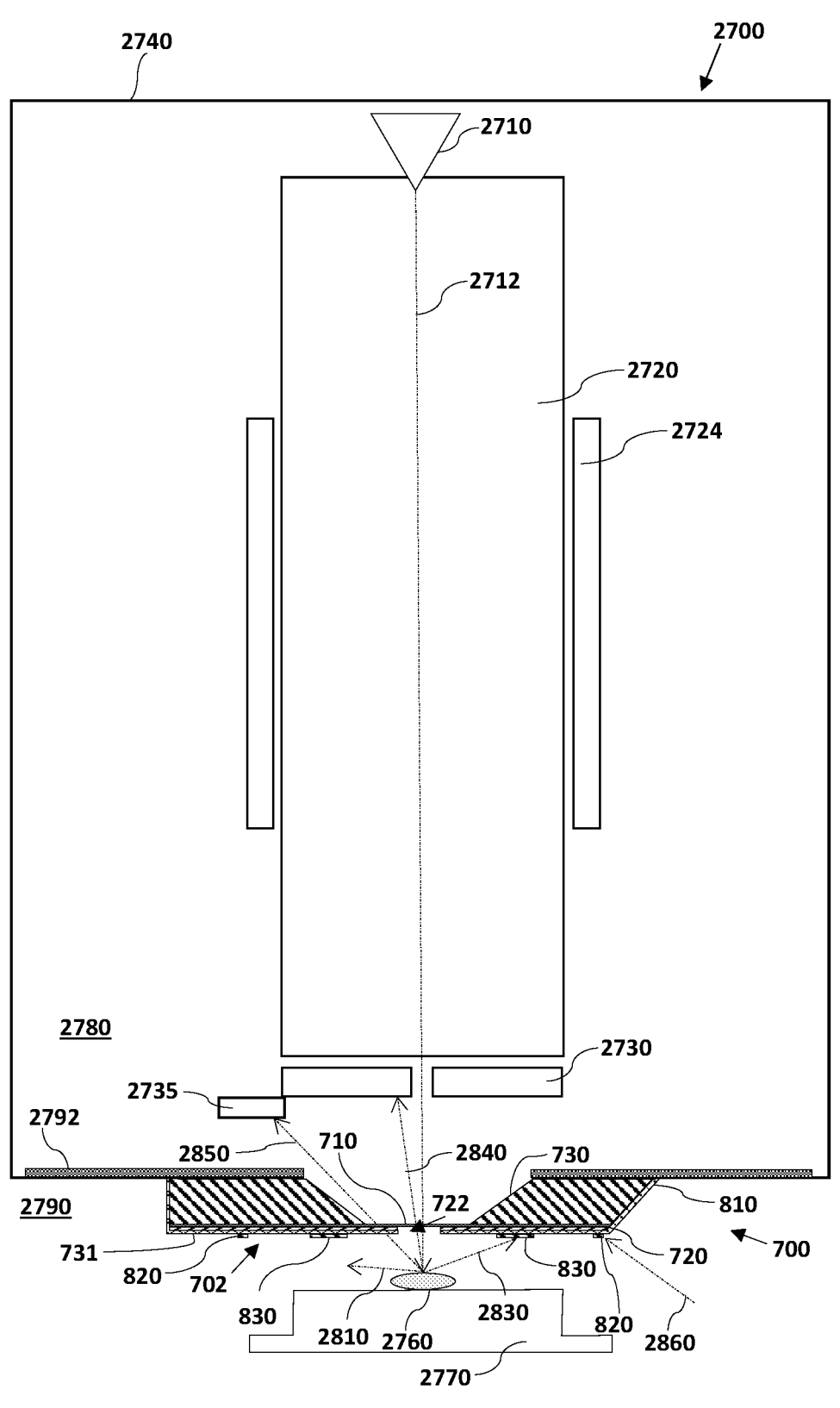
FIG. 12 is a simplified illustration of a charged particle beam device employing the membrane assembly of FIGS. 5A-5F.

Reference is now made to FIG. 12, which is a simplified illustration of a charged particle beam device 2700 employing membrane assembly 700, which is described hereinabove with reference to FIGS. 5A-5F. A charged particle source 2710 generates a primary charged particle beam 2712. Charged particle beam 2712 travels through a lens barrel 2720, which is surrounded by a plurality of electromagnetic lenses 2724, and through an internal particle detector 2730. Charged particle beam device 2700 preferably further includes an Energy Dispersive X-Ray Analysis (EDX) detector 2735 for detecting X-ray photons. Charged particle source 2710, lens barrel 2720, electromagnetic lenses 2724, internal particle detector 2730 and EDX detector 2735 are all included in charged particle beam device 2700 and are all disposed within a charged particle beam device housing 2740. Primary charged particle beam 2712 then passes through pressure-scaling membrane 710 of membrane assembly 700 and interacts with a sample 2760 supported by a sample support 2770.

Preferably, there is a first-pressure environment 2780, characterized by a first pressure, within charged particle beam device housing 2740, and a second-pressure environment 2790, characterized by a second pressure, surrounding sample 2760 and sample support 2770. Preferably, both first-pressure environment 2780 and second-pressure environment 2790 are gaseous environments.

In the embodiment of the present invention shown in FIG. 12, charged particle beam device housing 2740 contains first-pressure environment 2780 which is characterized by a single pressure. In an alternative embodiment of the present invention, charged particle beam device 2700 contains an additional-pressure environment, such as an environment within lens barrel 2720, which is maintained at a lower pressure than first-pressure environment 2780.

Typically, interactions between primary charged particle beam 2712 and sample 2760 produce a plurality of secondary particles, which travel along a plurality of particle paths. An exemplary subset of such particle paths is represented in FIG. 12 by a secondary particle path 2810, a secondary particle path 2830, a back-scattered particle path 2840 and an X-ray photon path 2850. Electromagnetic noise is also typically present in second-pressure environment 2790. An example of such electromagnetic noise is represented in FIG. 12 by electromagnetic noise path 2860.

Pressure-sealing membrane 710 is situated between and bonded to supporting membrane layer 720 and holding frame 730. Typically, there exists a pressure differential between first-pressure environment 2780 and second-pressure environment 2790, across pressure-scaling membrane 710. First-pressure environment 2780 has a lower pressure than second-pressure environment 2790. Preferably, a pressure differential of approximately 100,000 pascals exists between first-pressure environment 2780 and second-pressure environment 2790, across pressure-sealing membrane 710. More preferably, a pressure differential of approximately 150,000 pascals exists between first-pressure environment 2780 and second-pressure environment 2790, across pressure-sealing membrane 710. Most preferably, a pressure differential of approximately 200,000 pascals exists between first-pressure environment 2780 and second-pressure environment 2790, across pressure-scaling membrane 710. Typically, the first pressure of first-pressure environment 2780 is maintained by a use of at least one vacuum pump (not shown), and the second pressure of second-pressure environment 2790 is substantially similar to an ambient pressure of an environment in which charged particle beam device 2700 is located.

In one exemplary use case of charged particle beam device 2700, first-pressure environment 2780 within charged particle beam device housing 2740 is under partial vacuum, such as $10^{-5}$ pascals, and second-pressure environment 2790 surrounding sample 2760 and sample support 2770 is substantially close to atmospheric pressure. Pressure-scaling membrane 710 maintains the pressure difference between first-pressure environment 2780 and second-pressure environment 2790.

Charged particle beam device 2700 is shown in FIG. 12 as including internal particle detector 2730 for detecting particles resulting from interactions between primary charged particle beam 2712 and sample 2760. Charged particle beam device 2700 is also shown in FIG. 12 as including EDX detector 2735, for detecting X-ray photons. For simplicity, charged particle beam device 2700 is shown in FIG. 12 without additional focusing lenses and with only one internal particle detector 2730 and one EDX detector 2735. However, charged particle beam device 2700 may include any suitable number of components, including, inter alia, additional lenses, external particle detectors and internal particle detectors. Any external particle detectors, such as, inter alia, electron detectors, are typically situated in second-pressure environment 2790. Any internal particle detectors, such as, inter alia, electron detectors and X-ray detectors are typically situated in first-pressure environment 2780.

It is a particular feature of the present invention that all of supporting membrane layer 720, pressure-scaling membrane 710 and dielectric layer 810 are substantially transparent to X-rays. Accordingly, X-rays resulting from interactions between primary charged particle beam 2712 and sample 2760, which are typically generated outside of charged particle beam device housing 2740, are able to pass through membrane assembly 700 and be detected by one or more detectors situated within charged particle beam device housing 2740, such as internal particle detector 2730.

It is a particular feature of the present invention that pressure-sealing membrane 710 is substantially transparent to primary charged particle beam 2712. For example, if charged particle beam device 2700 is an SEM and primary charged particle beam 2712 is an electron beam, then pressure-sealing membrane 710 is preferably formed of silicon nitride, silicon or carbon.

It is a particular feature of the present invention that pressure-sealing membrane 710 overlies and atmospherically seals cornerless aperture 722 in supporting membrane layer 720. Preferably, cornerless aperture 722 has a longest chord of at least 100,000 nanometers. More preferably, cornerless aperture 722 has a longest chord of at least 200,000 nanometers. Most preferably, cornerless aperture 722 has a longest chord of at least 250,000 nanometers. The dimensions and relative dispositions of pressure-sealing membrane 710 and cornerless aperture 722 result in a large field of view for particle detectors, such as internal particle detector 2730, that are situated within charged particle beam device housing 2740.

Sample 2760 may be any solid object or non-solid object. In the exemplary use case shown in FIG. 12, sample 2760 is a single object. However, sample 2760 may include a plurality of objects. Preferably, a distance between sample 2760 and pressure-scaling membrane 710 is minimized, thereby minimizing a scattering of primary charged particle beam 2712. Preferably, the distance between sample 2760 and pressure-scaling membrane 710 is less than 200,000 nanometers. More preferably, the distance between sample 2760 and pressure-scaling membrane 710 is less than 100,000 nanometers. Most preferably, the distance between sample 2760 and pressure-sealing membrane 710 is less than 50,000 nanometers. Even if one or both of outer metal line pad 840 or inner metal line pad 850 are wire bonded to a printed circuit board (not shown), such wire bonds typically do not increase the working distance between sample 2760 and pressure-sealing membrane 710, and a working distance of less than 50,000 nanometers to less than 200,000 nanometers can be attained. The working distance is not increased by the wire bonds attached to one or both of outer metal line pad 840 and inner metal line pad 850, because metal line pads 840 and 850 are situated on beveled surface 854, thus preferably ensuring that the wire bonds do not extend closer to sample 2760 than does largest external surface 731 of electron-detecting subassembly 702. Sample support 2770 may be formed in any suitable shape. Sample support 2770 is preferably operative to support sample 2760. Preferably, sample support 2770 is equipped with a mechanism to adjust a linear and angular spatial position of sample 2760 in three dimensions. An exemplary stage useful as sample support 2770 is part number MCL-μD2067, commercially available from Mad City Labs Inc., of Madison, USA.

Holding frame 730 is affixed to charged particle beam device housing 2740 such that membrane assembly 700 atmospherically seals first-pressure environment 2780. In the embodiment of the present invention shown in FIG. 12, holding frame 730 is affixed, preferably using a suitable adhesive, to a plate 2792, which is detachably affixed to charged particle beam device housing 2740, preferably using suitable fasteners (not shown). The respective affixations of holding frame 730 to plate 2792 and of plate 2792 to charged particle beam device housing 2740 are preferably each substantially air-tight. In an alternative embodiment of the present invention, holding frame 730 is affixed to charged particle beam device 2700 using an alternative adhesive or method of affixation. It is appreciated that holding frame 730 may be detachably or non-detachably affixed to charged particle beam device housing 2740. In the embodiment of the present invention shown in FIG. 12, holding frame 730 is situated externally to charged particle beam device housing 2740. In another embodiment of the present invention, holding frame 730 is situated partially or completely within charged particle beam device housing 2740.

Secondary particle path 2810 is an example of a particle path in which secondary particles are not absorbed by membrane assembly 700. Rather, the secondary particles of secondary particle path 2810 traverse second-pressure environment 2790 both without interacting with membrane assembly 700 and without entering charged particle beam device housing 2740. Secondary particle path 2830 is an example of a particle path in which secondary particles are absorbed by inner metal line 830. Back-scattered particle path 2840 is an example of a particle path in which back-scattered particles pass through pressure-scaling membrane 710 and are detected by internal particle detector 2730. X-ray photon path 2850 is an example of a particle path in which X-ray photons pass through dielectric layer 810, pressure-sealing membrane 710 and supporting membrane layer 720 and are detected by EDX detector 2735. Electromagnetic noise path 2860 is an example of an electromagnetic noise path in which electromagnetic noise from second-pressure environment 2790 is absorbed by outer metal line 820, outer metal line 820 functioning in a noise-reducing capacity.

During an operation of charged particle beam device 2700, either a positive or negative potential may be individually applied to outer metal line 820 and inner metal line 830. If an overall positive potential is applied to a metal line, then the metal line absorbs lower-energy electrons. In a preferred mode of operation of charged particle beam device 2700, a positive potential of approximately 150 volts is applied to both outer metal line 820 and inner metal line 830, thereby maximizing an absorption of low-energy electrons primarily by inner metal line 830.

In a preferred mode of operation of charged particle beam device 2700, an interaction between charged particle beam 2712 and sample 2760 causes local negative charging of sample 2760. Local negative charging of sample 2760 increases an electric potential difference between sample 2760 and outer metal line 820, and also increases an electric potential difference between sample 2760 and inner metal line 830. Accordingly, local negative charging of sample 2760 increases a strength of electric fields between sample 2760 and outer metal line 820, and between sample 2760 and inner metal line 830, respectively. These increased electric fields increase movement of negatively charged low-energy electrons from sample 2760 to outer metal line 820 and inner metal line 820. Therefore, these increased electric field strengths increase absorption of low-energy electrons primarily by inner metal line 830.

The present invention is useful with any of multiple types of charged particle beam devices 2700, including, inter alia, a scanning electron microscope, a scanning transmission electron microscope, a scanning positron microscope, a composite device including a combination of some or all of a scanning electron microscope, a scanning transmission electron microscope, a scanning positron microscope and analysis devices utilizing them.

An exemplary device useful as charged particle beam device 2700, in which charged particle source 2710 and sample 2760 are situated in different-pressure environments, is an AE 1500, commercially available from Hitatchi, Ltd, of Chiyoda, Japan. Membrane assembly 700 is preferably manufactured using conventional silicon-on-insulator (SOI) and silicon-nitride-on-insulator (SNOI) technology by a suitable semiconductor manufacturer, such as, for example, Norcada Inc., of Edmonton, Canada.

Figure 13:
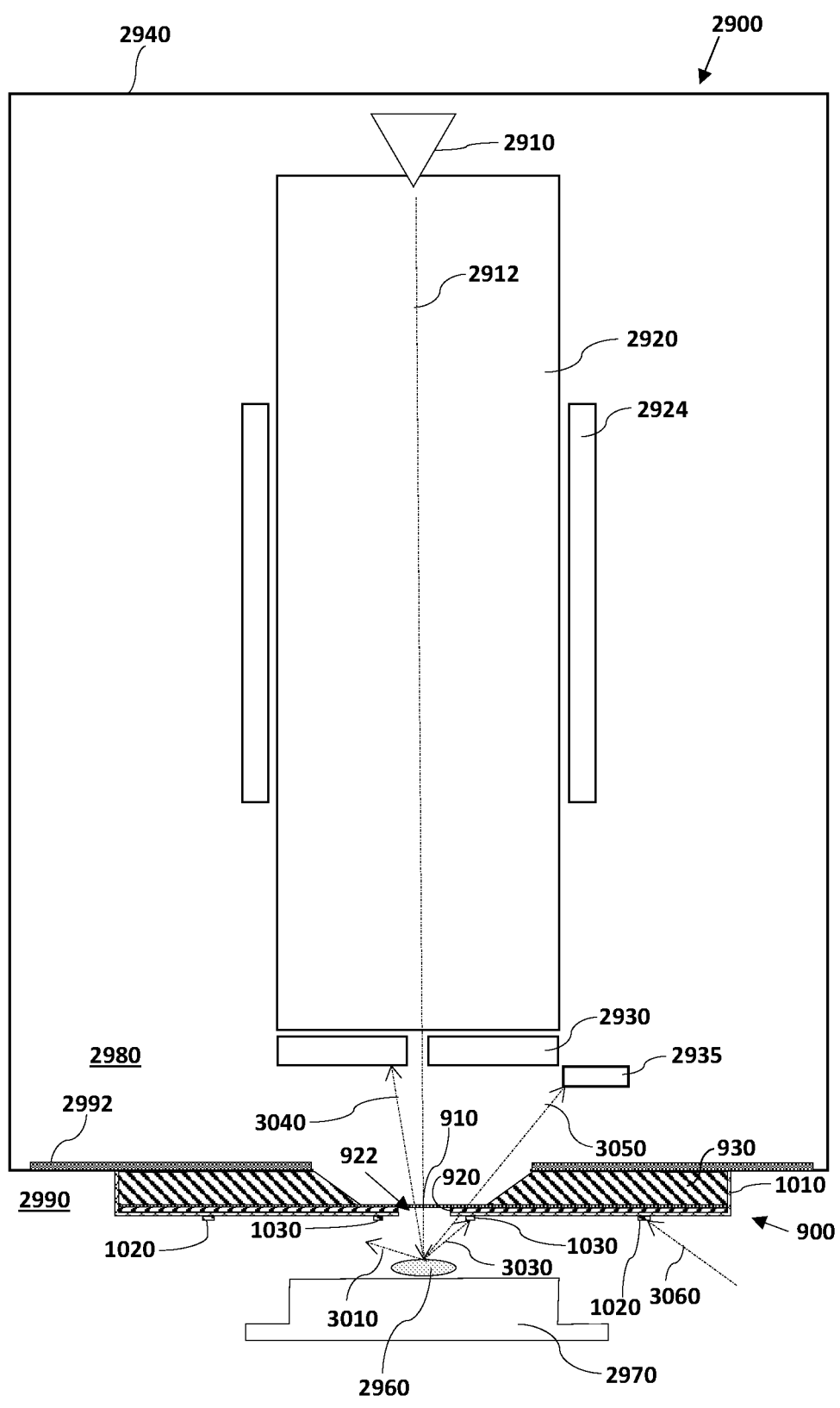
FIG. 13 is a simplified illustration of a charged particle beam device employing the membrane assembly of FIGS. 6A-6F.

Reference is now made to FIG. 13, which is a simplified illustration of a charged particle beam device 2900 employing membrane assembly 900, which is described hereinabove with reference to FIGS. 6A-6F. A charged particle source 2910 generates a primary charged particle beam 2912. Charged particle beam 2912 travels through a lens barrel 2920, which is surrounded by a plurality of electromagnetic lenses 2924, and through an internal particle detector 2930. Charged particle beam device 2900 preferably further includes an Energy Dispersive X-Ray Analysis (EDX) detector 2935 for detecting X-ray photons. Charged particle source 2910, lens barrel 2920, electromagnetic lenses 2924, internal particle detector 2930 and EDX detector 2935 are all included in charged particle beam device 2900 and are all disposed within a charged particle beam device housing 2940. Primary charged particle beam 2912 then passes through pressure-scaling membrane 910 of membrane assembly 900 and interacts with a sample 2960 supported by a sample support 2970.

Preferably, there is a first-pressure environment 2980, characterized by a first pressure, within charged particle beam device housing 2940, and a second-pressure environment 2990, characterized by a second pressure, surrounding sample 2960 and sample support 2970. Preferably, both first-pressure environment 2980 and second-pressure environment 2990 are gaseous environments.

In the embodiment of the present invention shown in FIG. 13, charged particle beam device housing 2940 contains first-pressure environment 2980 which is characterized by a single pressure. In an alternative embodiment of the present invention, charged particle beam device 2900 contains an additional-pressure environment, such as an environment within lens barrel 2920, which is maintained at a lower pressure than first-pressure environment 2980.

Typically, interactions between primary charged particle beam 2912 and sample 2960 produce a plurality of secondary particles, which travel along a plurality of particle paths. An exemplary subset of such particle paths is represented in FIG. 13 by a secondary particle path 3010, a secondary particle path 3030, a back-scattered particle path 3040 and an X-ray photon path 3050. Electromagnetic noise is also typically present in second-pressure environment 2990. An example of such electromagnetic noise is represented in FIG. 13 by electromagnetic noise path 3060.

Pressure-sealing membrane 910 is situated between and bonded to supporting membrane layer 920 and holding frame 930. Typically, there exists a pressure differential between first-pressure environment 2980 and second-pressure environment 2990 across pressure-sealing membrane 910. First-pressure environment 2980 has a lower pressure than second-pressure environment 2990. Preferably, a pressure differential of approximately 100,000 pascals exists between first-pressure environment 2980 and second-pressure environment 2990 across pressure-sealing membrane 910. More preferably, a pressure differential of approximately 150,000 pascals exists between first-pressure environment 2980 and second-pressure environment 2990 across pressure-sealing membrane 910. Most preferably, a pressure differential of approximately 200,000 pascals exists between first-pressure environment 2980 and second-pressure environment 2990 across pressure-scaling membrane 910. Typically, the first pressure of first-pressure environment 2980 is maintained by a use of at least one vacuum pump (not shown), and the second pressure of second-pressure environment 2990 is substantially similar to an ambient pressure of an environment in which charged particle beam device 2900 is located.

In one exemplary use case of charged particle beam device 2900, first-pressure environment 2980 within charged particle beam device housing 2940 is under partial vacuum, such as $10^{-5}$ pascals, and second-pressure environment 2990 surrounding sample 2960 and sample support 2970 is substantially close to atmospheric pressure. Pressure-sealing membrane 910 maintains the pressure difference between first-pressure environment 2980 and second-pressure environment 2990.

Charged particle beam device 2900 is shown in FIG. 13 as including internal particle detector 2930 for detecting particles resulting from interactions between primary charged particle beam 2912 and sample 2960. Charged particle beam device 2900 is also shown in FIG. 13 as including EDX detector 2935, for detecting X-ray photons. For simplicity, charged particle beam device 2900 is shown in FIG. 13 without additional focusing lenses and with only one internal particle detector 2930 and one EDX detector 2935. However, charged particle beam device 2900 may include any suitable number of components, including, inter alia, additional lenses, external particle detectors and internal particle detectors. Any external particle detectors, such as, inter alia, electron detectors, are typically situated in second-pressure environment 2990. Any internal particle detectors, such as, inter alia, electron detectors and X-ray detectors are typically situated in first-pressure environment 2980.

It is a particular feature of the present invention that all of supporting membrane layer 920, pressure-sealing membrane 910 and dielectric layer 1010 are substantially transparent to X-rays. Accordingly, X-rays resulting from interactions between primary charged particle beam 2912 and sample 2960, which are typically generated outside of charged particle beam device housing 2940, are able to pass through membrane assembly 900 and be detected by one or more detectors situated within charged particle beam device housing 2940, such as internal particle detector 2930.

It is a particular feature of the present invention that pressure-sealing membrane 910 is substantially transparent to primary charged particle beam 2912. For example, if charged particle beam device 1900 is an SEM and primary charged particle beam 2912 is an electron beam, then pressure-sealing membrane 910 is preferably formed of silicon nitride, silicon or carbon.

It is a particular feature of the present invention that pressure-scaling membrane 910 overlies and atmospherically seals cornerless aperture 922 in supporting membrane layer 920. Preferably, cornerless aperture 922 has a longest chord of at least 100,000 nanometers. More preferably, cornerless aperture 922 has a longest chord of at least 200,000 nanometers. Most preferably, cornerless aperture 922 has a longest chord of at least 250,000 nanometers. The dimensions and relative dispositions of pressure-sealing membrane 910 and cornerless aperture 922 result in a large field of view for particle detectors, such as internal particle detector 2930, that are situated within charged particle beam device housing 2940.

Sample 2960 may be any solid object or non-solid object. In the exemplary use case shown in FIG. 13, sample 2960 is a single object. However, sample 2960 may include a plurality of objects. Preferably, a distance between sample 2960 and pressure-sealing membrane 910 is minimized, thereby minimizing a scattering of primary charged particle beam 2912. Preferably, the distance between sample 2960 and pressure-sealing membrane 910 is less than 200,000 nanometers. More preferably, the distance between sample 2960 and pressure-scaling membrane 910 is less than 100, 000 nanometers. Most preferably, the distance between sample 2960 and pressure-sealing membrane 910 is less than 50,000 nanometers.

Sample support 2970 may be formed in any suitable shape. Sample support 2970 is preferably operative to support sample 2960. Preferably, sample support 2970 is equipped with a mechanism to adjust a linear and angular spatial position of sample 2960 in three dimensions. An exemplary stage useful as sample support 2970 is part number MCL-μD2067, commercially available from Mad City Labs Inc., of Madison, USA.

Holding frame 930 is affixed to charged particle beam device housing 2940 such that membrane assembly 900 atmospherically seals first-pressure environment 2980. In the embodiment of the present invention shown in FIG. 13, holding frame 930 is affixed, preferably using a suitable adhesive, to a plate 2992, which is detachably affixed to charged particle beam device housing 2940, preferably using suitable fasteners (not shown). The respective affixations of holding frame 930 to plate 2992 and of plate 2992 to charged particle beam device housing 2940 are preferably each substantially air-tight. In an alternative embodiment of the present invention, holding frame 930 is affixed to charged particle beam device 2900 using an alternative adhesive or method of affixation. It is appreciated that holding frame 930 may be detachably or non-detachably affixed to charged particle beam device housing 2940. In the embodiment of the present invention shown in FIG. 13, holding frame 930 is situated externally to charged particle beam device housing 2940. In another embodiment of the present invention, holding frame 930 is situated partially or completely within charged particle beam device housing 2940.

Secondary particle path 3010 is an example of a particle path in which secondary particles are not absorbed by membrane assembly 900. Rather, the secondary particles of secondary particle path 3010 traverse second-pressure environment 2990 both without interacting with membrane assembly 900 and without entering charged particle beam device housing 2940. Secondary particle path 3030 is an example of a particle path in which secondary particles are absorbed by inner metal line 1030. Back-scattered particle path 3040 is an example of a particle path in which back-scattered particles pass through pressure-sealing membrane 910 and are detected by internal particle detector 2930. X-ray photon path 3050 is an example of a particle path in which X-ray photons pass through dielectric layer 1010, pressure-sealing membrane 910 and supporting membrane layer 920 and are detected by EDX detector 2935. Inner metal line 1030 overlies no more than 25% of an area defined by aperture 939, such that a significant proportion of X-rays are not blocked by inner metal line 1030. Electromagnetic noise path 3060 is an example of an electromagnetic noise path in which electromagnetic noise from second-pressure environment 2990 is absorbed by outer metal line 1020, outer metal line 1020 functioning in a noise-reducing capacity.

During an operation of charged particle beam device 2900, either a positive or negative potential may be individually applied to outer metal line 1020 and inner metal line 1030. If an overall positive potential is applied to a metal line, then the metal line absorbs lower-energy electrons. In a preferred mode of operation of charged particle beam device 2900, a positive potential of approximately 150 volts is applied to both outer metal line 1020 and inner metal line 1030, thereby maximizing an absorption of low-energy electrons primarily by inner metal line 1030.

In a preferred mode of operation of charged particle beam device 2900, an interaction between charged particle beam 2912 and sample 2960 causes local negative charging of sample 2960. Local negative charging of sample 2960 increases an electric potential difference between sample 2960 and outer metal line 1020, and also increases an electric potential difference between sample 2960 and inner metal line 1030. Accordingly, local negative charging of sample 2960 increases a strength of electric fields between sample 2960 and outer metal line 1020, and between sample 2960 and inner metal line 1030, respectively. These increased electric fields increase movement of negatively charged low-energy electrons from sample 2960 to outer metal line 1020 and inner metal line 1020. Therefore, these increased electric field strengths increase absorption of low-energy electrons primarily by inner metal line 1030.

The present invention is useful with any of multiple types of charged particle beam devices 2900, including, inter alia, a scanning electron microscope, a scanning transmission electron microscope, a scanning positron microscope, a composite device including a combination of some or all of a scanning electron microscope, a scanning transmission electron microscope, a scanning positron microscope and analysis devices utilizing them.

An exemplary device useful as charged particle beam device 2900, in which charged particle source 2910 and sample 2960 are situated in different-pressure environments, is an AE 1500, commercially available from Hitatchi, Ltd, of Chiyoda, Japan. Membrane assembly 900 is preferably manufactured using conventional silicon-on-insulator (SOI) and silicon-nitride-on-insulator (SNOI) technology by a suitable semiconductor manufacturer, such as, for example, Norcada Inc., of Edmonton, Canada.

Figure 14:
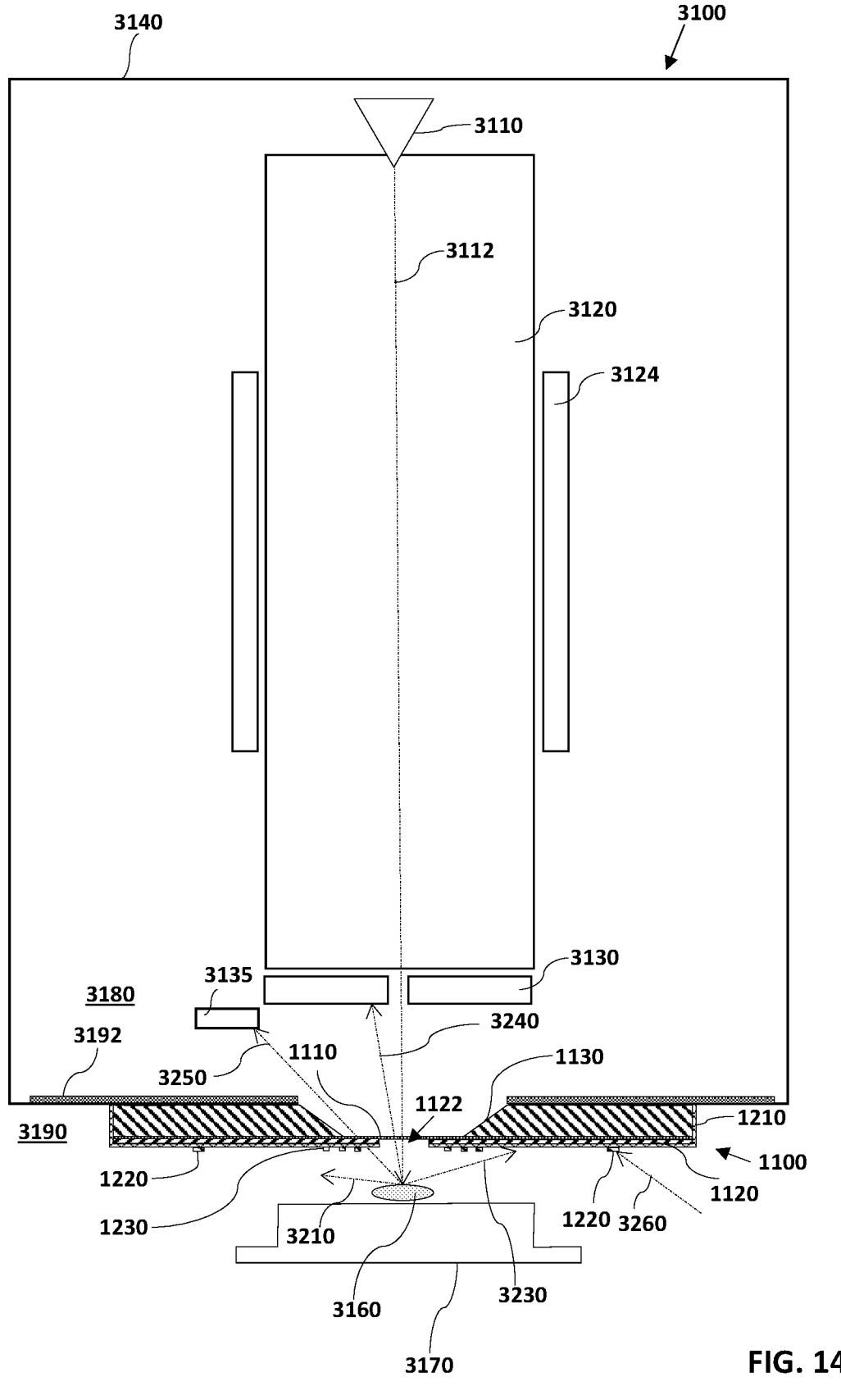
FIG. 14 is a simplified illustration of a charged particle beam device employing the membrane assembly of FIGS. 7A-7F.

Reference is now made to FIG. 14, which is a simplified illustration of a charged particle beam device 3100 employing membrane assembly 1100, which is described hereinabove with reference to FIGS. 7A-7F. A charged particle source 3110 generates a primary charged particle beam 3112. Charged particle beam 3112 travels through a lens barrel 3120, which is surrounded by a plurality of electromagnetic lenses 3124, and through an internal particle detector 3130. Charged particle beam device 3100 preferably further includes an Energy Dispersive X-Ray Analysis (EDX) detector 3135 for detecting X-ray photons. Charged particle source 3110, lens barrel 3120, electromagnetic lenses 3124, internal particle detector 3130 and EDX detector 3135 are all included in charged particle beam device 3100 and are all disposed within a charged particle beam device housing 3140.

Primary charged particle beam 3112 then passes through pressure-scaling membrane 1110 of membrane assembly 1100 and interacts with a sample 3160 supported by a sample support 3170. Preferably, there is a first-pressure environment 3180, characterized by a first pressure, within charged particle beam device housing 3140, and a second-pressure environment 3190, characterized by a second pressure, surrounding sample 3160 and sample support 3170. Preferably, both first-pressure environment 3180 and second-pressure environment 3190 are gaseous environments.

In the embodiment of the present invention shown in FIG. 14, charged particle beam device housing 3140 contains first-pressure environment 3180 which is characterized by a single pressure. In an alternative embodiment of the present invention, charged particle beam device 3100 contains an additional-pressure environment, such as an environment within lens barrel 3120, which is maintained at a lower pressure than first-pressure environment 3180.

Typically, interactions between primary charged particle beam 3112 and sample 3160 produce a plurality of secondary particles, which travel along a plurality of particle paths. An exemplary subset of such particle paths is represented in FIG. 14 by a secondary particle path 3210, a secondary particle path 3230, a back-scattered particle path 3240 and an X-ray photon path 3250. Electromagnetic noise is also typically present in second-pressure environment 3190. An example of such electromagnetic noise is represented in FIG. 14 by electromagnetic noise path 3260.

Pressure-sealing membrane 1110 is situated between and bonded to supporting membrane layer 1120 and holding frame 1130. Typically, there exists a pressure differential between first-pressure environment 3180 and second-pressure environment 3190, across pressure-sealing membrane 1110. First-pressure environment 3180 has a lower pressure than second-pressure environment 3190. Preferably, a pressure differential of approximately 100,000 pascals exists between first-pressure environment 3180 and second-pressure environment 3190, across pressure-sealing membrane 1110. More preferably, a pressure differential of approximately 150,000 pascals exists between first-pressure environment 3180 and second-pressure environment 3190, across pressure-sealing membrane 1110. Most preferably, a pressure differential of approximately 200,000 pascals exists between first-pressure environment 3180 and second-pressure environment 3190, across pressure-scaling membrane 1110. Typically, the first pressure of first-pressure environment 3180 is maintained by a use of at least one vacuum pump (not shown), and the second pressure of second-pressure environment 3190, is substantially similar to an ambient pressure of an environment in which charged particle beam device 3100 is located.

In one exemplary use case of charged particle beam device 3100, first-pressure environment 3180 within charged particle beam device housing 3140 is under partial vacuum, such as $10^{-5}$ pascals, and second-pressure environment 3190 surrounding sample 3160 and sample support 3170 is substantially close to atmospheric pressure. Pressure-scaling membrane 1110 maintains the pressure difference between first-pressure environment 3180 and second-pressure environment 3190.

Charged particle beam device 3100 is shown in FIG. 14 as including internal particle detector 3130 for detecting particles resulting from interactions between primary charged particle beam 3112 and sample 3160. Charged particle beam device 3100 is also shown in FIG. 14 as including EDX detector 3135, for detecting X-ray photons. For simplicity, charged particle beam device 3100 is shown in FIG. 14 without additional focusing lenses and with only one internal particle detector 3130 and one EDX detector 3135. However, charged particle beam device 3100 may include any suitable number of components, including, inter alia, additional lenses, external particle detectors and internal particle detectors. Any external particle detectors, such as, inter alia, electron detectors, are typically situated in second-pressure environment 3190. Any internal particle detectors, such as, inter alia, electron detectors and X-ray detectors are typically situated in first-pressure environment 3180.

It is a particular feature of the present invention that all of supporting membrane layer 1120, pressure-sealing membrane 1110 and dielectric layer 1210 are substantially transparent to X-rays. Accordingly, X-rays resulting from interactions between primary charged particle beam 3112 and sample 3160, which are typically generated outside of charged particle beam device housing 3140, are able to pass through membrane assembly 1100 and be detected by one or more detectors situated within charged particle beam device housing 3140, such as internal particle detector 3130.

It is a particular feature of the present invention that pressure-sealing membrane 1110 is substantially transparent to primary charged particle beam 3112. For example, if charged particle beam device 3100 is an SEM and primary charged particle beam 3112 is an electron beam, then pressure-sealing membrane 1110 is preferably formed of silicon nitride, silicon or carbon.

It is a particular feature of the present invention that pressure-scaling membrane 1110 overlies and atmospherically seals cornerless aperture 1122 in supporting membrane layer 1120. Preferably, cornerless aperture 1122 has a longest chord of at least 100,000 nanometers. More preferably, cornerless aperture 1122 has a longest chord of at least 200,000 nanometers. Most preferably, cornerless aperture 1122 has a longest chord of at least 250,000 nanometers. The dimensions and relative dispositions of pressure-scaling membrane 1110 and cornerless aperture 1122 result in a large field of view for particle detectors, such as internal particle detector 3130, that are situated within charged particle beam device housing 3140.

Sample 3160 may be any solid object or non-solid object. In the exemplary use case shown in FIG. 14, sample 3160 is a single object. However, sample 3160 may include a plurality of objects. Preferably, a distance between sample 3160 and pressure-scaling membrane 1110 is minimized, thereby minimizing a scattering of primary charged particle beam 3112. Preferably, the distance between sample 3160 and pressure-sealing membrane 1110 is less than 200,000 nanometers. More preferably, the distance between sample 3160 and pressure-sealing membrane 1110 is less than 100,000 nanometers. Most preferably, the distance between sample 3160 and pressure-sealing membrane 1110 is less than 50,000 nanometers.

Sample support 3170 may be formed in any suitable shape. Sample support 3170 is preferably operative to support sample 3160. Preferably, sample support 3170 is equipped with a mechanism to adjust a linear and angular spatial position of sample 3160 in three dimensions. An exemplary stage useful as sample support 3170 is part number MCL-μD2067, commercially available from Mad City Labs Inc., of Madison, USA.

Holding frame 1130 is affixed to charged particle beam device housing 3140 such that membrane assembly 1100 atmospherically seals first-pressure environment 3180. In the embodiment of the present invention shown in FIG. 14, holding frame 1130 is affixed, preferably using a suitable adhesive, to a plate 3192, which is detachably affixed to charged particle beam device housing 3140, preferably using suitable fasteners (not shown). The respective affixations of holding frame 1130 to plate 3192 and of plate 3192 to charged particle beam device housing 3140 are preferably each substantially air-tight. In an alternative embodiment of the present invention, holding frame 1130 is affixed to charged particle beam device 3100 using an alternative adhesive or method of affixation. It is appreciated that holding frame 1130 may be detachably or non-detachably affixed to charged particle beam device housing 3140. In the embodiment of the present invention shown in FIG. 14, holding frame 1130 is situated externally to charged particle beam device housing 3140. In another embodiment of the present invention, holding frame 1130 is situated partially or completely within charged particle beam device housing 3140.

Secondary particle path 3210 is an example of a particle path in which secondary particles are not absorbed by membrane assembly 1100. Rather, the secondary particles of secondary particle path 3210 traverse second-pressure environment 3190 both without interacting with membrane assembly 1100 and without entering charged particle beam device housing 3140. Secondary particle path 3230 is an example of a particle path in which secondary particles are absorbed by inner metal lines 1230. Back-scattered particle path 3240 is an example of a particle path in which back-scattered particles pass through pressure-scaling membrane 1110 and are detected by internal particle detector 3130. X-ray photon path 3250 is an example of a particle path in which X-ray photons pass through dielectric layer 1210, pressure-sealing membrane 1110 and supporting membrane layer 1120 and are detected by EDX detector 3135. Inner metal lines 1230 overlie no more than 25% of an area defined by aperture 1139, such that a significant proportion of X-rays are not blocked by inner metal lines 1230. Electromagnetic noise path 3260 is an example of an electromagnetic noise path in which electromagnetic noise from second-pressure environment 3190 is absorbed by outer metal line 1220, outer metal line 1220 functioning in a noise-reducing capacity.

During an operation of charged particle beam device 3100, either a positive or negative potential may be individually applied to outer metal line 1220 and inner metal lines 1230. If an overall positive potential is applied to a metal line, then the metal line absorbs lower-energy electrons. In a preferred mode of operation of charged particle beam device 3100, a positive potential of approximately 150 volts is applied to both outer metal line 1220 and inner metal lines 1230, thereby maximizing an absorption of low-energy electrons primarily by inner metal lines 1230.

In a preferred mode of operation of charged particle beam device 3100, an interaction between charged particle beam 3112 and sample 3160 causes local negative charging of sample 3160. Local negative charging of sample 3160 increases an electric potential difference between sample 3160 and outer metal line 1220, and also increases an electric potential difference between sample 3160 and inner metal lines 1230. Accordingly, local negative charging of sample 3160 increases a strength of electric fields between sample 3160 and outer metal line 1220, and between sample 3160 and inner metal lines 1230, respectively. These increased electric fields increase movement of negatively charged low-energy electrons from sample 3160 to outer metal line 1220 and inner metal lines 1230. Therefore, these increased electric field strengths increase absorption of low-energy electrons primarily by inner metal lines 1230.

The present invention is useful with any of multiple types of charged particle beam devices 3100, including, inter alia, a scanning electron microscope, a scanning transmission electron microscope, a scanning positron microscope, a composite device including a combination of some or all of a scanning electron microscope, a scanning transmission electron microscope, a scanning positron microscope and analysis devices utilizing them.

An exemplary device useful as charged particle beam device 3100, in which charged particle source 3110 and sample 3160 are situated in different-pressure environments, is an AE 1500, commercially available from Hitatchi, Ltd, of Chiyoda, Japan. Membrane assembly 1100 is preferably manufactured using conventional silicon-on-insulator (SOI) and silicon-nitride-on-insulator (SNOI) technology by a suitable semiconductor manufacturer, such as, for example, Norcada Inc., of Edmonton, Canada.

It will be appreciated by persons skilled in the art that the embodiment of the invention shown in FIG. 11 may be combined with any of the embodiments shown in FIG. 12, FIG. 13 and FIG. 14, to form further alternative embodiments of the present invention which include a charged particle beam device employing a membrane assembly in which a supporting membrane layer is supported between and bonded to a pressure-sealing membrane and a holding frame.

It will also be appreciated by persons skilled in the art that the embodiment of the invention shown in FIG. 12 may be combined with either of the embodiments shown in FIG. 13 and FIG. 14, to form further alternative embodiments of the present invention which include a charged particle beam device employing a membrane assembly which includes a beveled surface.

It will also be appreciated by persons skilled in the art that the embodiment of the invention shown in FIG. 13 may be combined with the embodiment shown in FIG. 14, to form a further alternative embodiment of the present invention which includes a charged particle beam device employing a membrane assembly in which an outer metal line does not define a closed shape and in which an at least one inner metal line partially overlies an aperture substantially transparent to X-rays.

It will also be appreciated by persons skilled in the art that the present invention is not limited to what has been particularly shown and described hereinabove. The scope of the present invention includes both combinations and sub-combinations of various features described hereinabove as well as modifications thereof, all of which are not in the prior art.

The invention claimed is:

1. A charged particle beam device, comprising:
a charged particle beam source situated in a first-pressure environment;
a sample support operative to support a sample, said sample support and said sample situated in a second-pressure environment, said second-pressure environment having a higher pressure than said first-pressure environment; and
a membrane assembly separating said first-pressure environment from said second-pressure environment, said membrane assembly comprising:
a pressure-sealing membrane being substantially transparent to a charged particle beam from said charged particle beam source;
a supporting membrane layer being formed with a cornerless aperture having a longest chord of at least 100,000 nanometers, said pressure-sealing membrane being bonded to said supporting membrane layer; and
a holding frame being formed with a second aperture larger than and overlying said cornerless aperture.

2. A charged particle beam device according to claim 1, wherein said membrane assembly further comprises an electron detecting subassembly, said electron-detecting subassembly comprising:
at least one metal line defining a shape, for detection of electrons resulting from an interaction of said charged particle beam and sample.

3. A charged particle beam device according to claim 2, wherein said electron-detecting subassembly comprises:
at least two metal lines each defining a shape, said shapes being mutually spaced and mutually nested, for detection of electrons resulting from an interaction of said charged particle beam and said sample.

4. A charged particle beam device according to claim 1 wherein:
said pressure-sealing membrane and said supporting membrane layer are substantially transparent to X-rays.

5. A charged particle beam device according to claim 4, wherein said membrane assembly further comprises an electron-detecting subassembly, said electron-detecting subassembly comprising:
at least two metal lines each defining a shape, said shapes being mutually spaced and mutually nested, for detection of electrons resulting from an interaction of said charged particle beam and said sample, at least one of said metal lines partially overlying an area defined by said second aperture.

6. A charged particle beam device according to claim 1 wherein said second-pressure environment is at substantially atmospheric pressure.

7. A charged particle beam device according to claim 1 wherein said pressure-sealing membrane is disposed between and bonded to said supporting membrane layer and said holding frame.

8. A charged particle beam device according to claim 1 wherein said supporting membrane layer is disposed between and bonded to said pressure-sealing membrane and said holding frame.

9. A charged particle beam device according to claim 1 wherein said supporting membrane layer is less than 10,000 nanometers thick.

10. A charged particle beam device according to claim 1 wherein said cornerless aperture has a longest chord of at least 250,000 nanometers.

11. A membrane assembly comprising:
a pressure-sealing membrane suitable for separating a first-pressure environment from a second-pressure environment, said second-pressure environment having a different pressure to said first-pressure environment, said pressure-sealing membrane having a thickness of less than 20 nanometers and being substantially transparent to electrons;
a supporting membrane layer being formed with a cornerless aperture having a longest chord of at least 100.000 nanometers, said pressure-sealing membrane being bonded to said supporting membrane layer; and
a holding frame being formed with a second aperture larger than and overlying said cornerless aperture.

12. A membrane assembly according to claim 11 further comprising an electron-detecting subassembly, said electron-detecting subassembly comprising:
at least one shaped metal line, for detection of electrons.

13. A membrane assembly according to claim 11, wherein said electron-detecting subassembly comprises:
at least two metal lines each defining a shape, said shapes being mutually nested and mutually spaced, for detection of electrons.

14. A membrane assembly according to claim 11 wherein:
said pressure-sealing membrane and said supporting membrane layer are substantially transparent to X-rays.

15. A membrane assembly according to claim 14, further comprising an electron-detecting subassembly, said electron-detecting subassembly comprising:
at least two metal lines each defining a shape, said shapes being mutually nested and mutually spaced, for detection of electrons, at least one of said metal lines partially overlying an area defined by said second aperture.

16. A membrane assembly according to claim 11 wherein said pressure-sealing membrane is disposed between and bonded to said supporting membrane layer and said holding frame.

17. A membrane assembly according to claim 11 wherein said supporting membrane layer is disposed between and bonded to said pressure-sealing membrane and said holding frame.

18. A membrane assembly according to claim 11 wherein said supporting membrane layer is less than 10,000 nanometers thick.

19. A membrane assembly according to claim 11 wherein said cornerless aperture has a longest chord of at least 250,000 nanometers.

20. A charged particle beam device, comprising:

a charged particle beam source situated in a first-pressure environment;

a region transparent to a charged particle beam from said charged particle beam source;

a sample support operative to support a sample, said sample support and said sample situated in a second-pressure environment, said second-pressure environment being at a higher pressure than said first-pressure environment and said second-pressure environment being at atmospheric pressure;

a membrane assembly separating said second-pressure environment from said first-pressure environment, said membrane assembly comprising:

a pressure-sealing membrane being substantially transparent to a charged particle beam from said charged particle beam source;

a supporting membrane layer being formed with a cornerless aperture having a longest chord of at least 100,000 nanometers, and said pressure-sealing membrane being bonded to said supporting membrane layer; and a holding frame being formed with a second aperture larger than and overlying said cornerless aperture; and an electron-detecting subassembly situated in said second-pressure environment, said electron-detecting subassembly comprising at least two metal lines each defining a shape, said shapes being mutually spaced and mutually nested, for detection of electrons.

21. A charged particle beam device according to claim 20 wherein said metal lines are each electrically connected to a metal pad, a distance between said sample and each of said metal pads being greater than a distance between said sample and each of said metal lines.

22. A charged particle beam device according to claim 20 and wherein at least one of said metal lines partially overlies an area defined by said second aperture.

23. A charged particle beam device according to claim 20 wherein said cornerless aperture has a longest chord of at least 250,000 nanometers.

\* \* \* \* \*